(12) United States Patent
Sella et al.

(10) Patent No.: US 10,969,412 B2
(45) Date of Patent: *Apr. 6, 2021

(54) THEFT DETECTION AND PREVENTION IN A POWER GENERATION SYSTEM

(71) Applicant: Solaredge Technologies Ltd., Herzeliya (IL)

(72) Inventors: Guy Sella, Bitan Aharon (IL); Meir Adest, Raanana (IL); Meir Gazit, Ashkelon (IL); Lior Handelsman, Givatayim (IL); Ilan Yoscovich, Ramat-Gan (IL); Amir Fishelov, Tel Aviv (IL); Yaron Binder, Shoham (IL); Yoav Galin, Raanana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/834,929

(22) Filed: Dec. 7, 2017

(65) Prior Publication Data

US 2018/0210016 A1  Jul. 26, 2018

Related U.S. Application Data

(63) Continuation of application No. 14/582,363, filed on Dec. 24, 2014, now Pat. No. 9,869,701, which is a
(Continued)

(51) Int. Cl.
*G01R 17/02* (2006.01)
*G08B 13/14* (2006.01)
*G01R 27/26* (2006.01)

(52) U.S. Cl.
CPC ............. *G01R 17/02* (2013.01); *G01R 27/26* (2013.01); *G08B 13/1409* (2013.01)

(58) Field of Classification Search
CPC ....... G05B 23/02; H01L 31/042; H01L 31/04; G08B 1/08; G01R 17/02; G01R 27/26;
(Continued)

(56) References Cited

U.S. PATENT DOCUMENTS

| 2,367,925 A | 1/1945 | Brown |
| 2,586,804 A | 2/1952 | Fluke |

(Continued)

FOREIGN PATENT DOCUMENTS

| AU | 2073800 A | 9/2000 |
| AU | 2005262278 A1 | 1/2006 |

(Continued)

OTHER PUBLICATIONS

Storfer, Lior, "Enhancing Cable Modem TCP Performance," Texas Instruments Inc. white paper, Jul. 2003.
(Continued)

*Primary Examiner* — Nam V Nguyen
(74) *Attorney, Agent, or Firm* — Banner & Witcoff, Ltd.

(57) ABSTRACT

A system for generation of electrical power including an inverter connected to a photovoltaic source including a theft prevention and detection feature. A first memory is permanently attached to the photovoltaic source. The first memory is configured to store a first code. A second memory is attached to the inverter. The second memory configured to store a second code. During manufacture or installation of the system, the first code is stored in the first memory attached to the photovoltaic source. The second code based on the first code is stored in the second memory. Prior to operation of the inverter, the first code is compared to the second code and based on the comparison; the generation of the electrical power is enabled or disabled.

21 Claims, 35 Drawing Sheets

Related U.S. Application Data continuation of application No. 12/788,066, filed on May 26, 2010, now Pat. No. 8,947,194.

(60) Provisional application No. 61/180,940, filed on May 26, 2009.

(58) Field of Classification Search
CPC ... G01R 31/389; G01R 31/382; G01R 31/392
USPC ... 340/539.1, 571.2, 568.1, 568.2, 531, 533, 340/3.1; 136/244, 243
See application file for complete search history.

(56) References Cited

U.S. PATENT DOCUMENTS

| | | |
|---|---|---|
| 2,758,219 A | 8/1956 | Miller |
| 2,852,721 A | 9/1958 | Harders et al. |
| 2,958,171 A | 11/1960 | Deckers |
| 3,369,210 A | 2/1968 | Manickella |
| 3,392,326 A | 7/1968 | Lamberton |
| 3,496,029 A | 2/1970 | King et al. |
| 3,566,143 A | 2/1971 | Paine et al. |
| 3,643,564 A | 2/1972 | Uchiyama |
| 3,696,286 A | 10/1972 | Ule |
| 3,740,652 A | 6/1973 | Burgener |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,127,797 A | 11/1978 | Perper |
| 4,129,788 A | 12/1978 | Chavannes |
| 4,129,823 A | 12/1978 | van der Pool et al. |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,324,225 A | 4/1982 | Trihey |
| 4,327,318 A | 4/1982 | Kwon et al. |
| 4,346,341 A | 8/1982 | Blackburn et al. |
| 4,363,040 A | 12/1982 | Inose |
| 4,367,557 A | 1/1983 | Stern et al. |
| 4,375,662 A | 3/1983 | Baker |
| 4,384,321 A | 5/1983 | Rippel |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,470,213 A | 9/1984 | Thompson |
| 4,479,175 A | 10/1984 | Gille et al. |
| 4,481,654 A | 11/1984 | Daniels et al. |
| 4,488,136 A | 12/1984 | Hansen et al. |
| 4,526,553 A | 7/1985 | Guerrero |
| 4,533,986 A | 8/1985 | Jones |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,611,090 A | 9/1986 | Catella et al. |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,746,879 A | 5/1988 | Ma et al. |
| 4,772,994 A | 9/1988 | Harada et al. |
| 4,783,728 A | 11/1988 | Hoffman |
| 4,797,803 A | 1/1989 | Carroll |
| 4,819,121 E | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,097,196 A | 3/1992 | Schoneman |
| 5,138,422 A | 8/1992 | Fujii et al. |
| 5,143,556 A | 9/1992 | Matlin |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,210,519 A | 5/1993 | Moore |
| 5,235,266 A | 8/1993 | Schaffrin |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,477,091 A | 12/1995 | Fiorina et al. |
| 5,493,154 A | 2/1996 | Smith et al. |
| 5,497,289 A | 3/1996 | Sugishima et al. |
| 5,501,083 A | 3/1996 | Kim |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |

(56) References Cited

U.S. PATENT DOCUMENTS

| | | |
|---|---|---|
| 5,576,941 A | 11/1996 | Nguyen et al. |
| 5,580,395 A | 12/1996 | Yoshioka et al. |
| 5,585,749 A | 12/1996 | Pace et al. |
| 5,604,430 A | 2/1997 | Decker et al. |
| 5,616,913 A | 4/1997 | Litterst |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,258 A | 3/1998 | Esser |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilbert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A | 12/1999 | Duba et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,275,016 B1 | 8/2001 | Ivanov |
| 6,281,485 B1 | 8/2001 | Siri |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,329,808 B1 | 12/2001 | Enguent |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,483,203 B1 | 11/2002 | McCormack |

(56) References Cited

U.S. PATENT DOCUMENTS

| | | | |
|---|---|---|---|
| 6,493,246 | B2 | 12/2002 | Suzui et al. |
| 6,501,362 | B1 | 12/2002 | Hoffman et al. |
| 6,507,176 | B2 | 1/2003 | Wittenbreder, Jr. |
| 6,509,712 | B1 | 1/2003 | Landis |
| 6,512,444 | B1 | 1/2003 | Morris, Jr. et al. |
| 6,515,215 | B1 | 2/2003 | Mimura |
| 6,519,165 | B2 | 2/2003 | Koike |
| 6,528,977 | B2 | 3/2003 | Arakawa |
| 6,531,848 | B1 | 3/2003 | Chitsazan et al. |
| 6,545,211 | B1 | 4/2003 | Mimura |
| 6,548,205 | B2 | 4/2003 | Leung et al. |
| 6,560,131 | B1 | 5/2003 | vonBrethorst |
| 6,587,051 | B2 | 7/2003 | Takehara et al. |
| 6,590,793 | B1 | 7/2003 | Nagao et al. |
| 6,590,794 | B1 | 7/2003 | Carter |
| 6,593,520 | B2 | 7/2003 | Kondo et al. |
| 6,593,521 | B2 | 7/2003 | Kobayashi |
| 6,600,100 | B2 | 7/2003 | Ho et al. |
| 6,603,672 | B1 | 8/2003 | Deng et al. |
| 6,608,468 | B2 | 8/2003 | Nagase |
| 6,611,130 | B2 | 8/2003 | Chang |
| 6,611,441 | B2 | 8/2003 | Kurokami et al. |
| 6,628,011 | B2 | 9/2003 | Droppo et al. |
| 6,633,824 | B2 | 10/2003 | Dollar, II |
| 6,636,431 | B2 | 10/2003 | Seki et al. |
| 6,650,031 | B1 | 11/2003 | Goldack |
| 6,650,560 | B2 | 11/2003 | MacDonald et al. |
| 6,653,549 | B2 | 11/2003 | Matsushita et al. |
| 6,655,987 | B2 | 12/2003 | Higashikozono et al. |
| 6,657,419 | B2 | 12/2003 | Renyolds |
| 6,664,762 | B2 | 12/2003 | Kutkut |
| 6,672,018 | B2 | 1/2004 | Shingleton |
| 6,678,174 | B2 | 1/2004 | Suzui et al. |
| 6,690,590 | B2 | 2/2004 | Stamenic et al. |
| 6,693,327 | B2 | 2/2004 | Priefert et al. |
| 6,693,781 | B1 | 2/2004 | Kroker |
| 6,709,291 | B1 | 3/2004 | Wallace et al. |
| 6,724,593 | B1 | 4/2004 | Smith |
| 6,731,136 | B2 | 5/2004 | Knee |
| 6,738,692 | B2 | 5/2004 | Schienbein et al. |
| 6,744,643 | B2 | 6/2004 | Luo et al. |
| 6,750,391 | B2 | 6/2004 | Bower et al. |
| 6,765,315 | B2 | 7/2004 | Hammerstrom et al. |
| 6,768,047 | B2 | 7/2004 | Chang et al. |
| 6,768,180 | B2 | 7/2004 | Salama et al. |
| 6,788,033 | B2 | 9/2004 | Vinciarelli |
| 6,788,146 | B2 | 9/2004 | Forejt et al. |
| 6,795,318 | B2 | 9/2004 | Haas et al. |
| 6,800,964 | B2 | 10/2004 | Beck |
| 6,801,442 | B2 | 10/2004 | Suzui et al. |
| 6,807,069 | B2 | 10/2004 | Nieminen et al. |
| 6,809,942 | B2 | 10/2004 | Madenokouji et al. |
| 6,810,339 | B2 | 10/2004 | Wills |
| 6,812,396 | B2 | 11/2004 | Makita et al. |
| 6,828,503 | B2 | 12/2004 | Yoshikawa et al. |
| 6,828,901 | B2 | 12/2004 | Birchfield et al. |
| 6,837,739 | B2 | 1/2005 | Gorringe et al. |
| 6,838,611 | B2 | 1/2005 | Kondo et al. |
| 6,838,856 | B2 | 1/2005 | Raichle |
| 6,842,354 | B1 | 1/2005 | Tallam et al. |
| 6,844,739 | B2 | 1/2005 | Kasai et al. |
| 6,850,074 | B2 | 2/2005 | Adams et al. |
| 6,856,102 | B1 | 2/2005 | Lin et al. |
| 6,882,131 | B1 | 4/2005 | Takada et al. |
| 6,888,728 | B2 | 5/2005 | Takagi et al. |
| 6,894,911 | B2 | 5/2005 | Telefus et al. |
| 6,897,370 | B2 | 5/2005 | Kondo et al. |
| 6,914,418 | B2 | 7/2005 | Sung |
| 6,919,714 | B2 | 7/2005 | Delepaut |
| 6,927,955 | B2 | 8/2005 | Suzui et al. |
| 6,933,627 | B2 | 8/2005 | Wilhelm |
| 6,933,714 | B2 | 8/2005 | Fasshauer et al. |
| 6,936,995 | B2 | 8/2005 | Kapsokavathis et al. |
| 6,940,735 | B2 | 9/2005 | Deng et al. |
| 6,949,843 | B2 | 9/2005 | Dubovsky |
| 6,950,323 | B2 | 9/2005 | Achleitner et al. |
| 6,963,147 | B2 | 11/2005 | Kurokami et al. |
| 6,966,184 | B2 | 11/2005 | Toyomura et al. |
| 6,970,365 | B2 | 11/2005 | Turchi |
| 6,980,783 | B2 | 12/2005 | Liu et al. |
| 6,984,967 | B2 | 1/2006 | Notman |
| 6,984,970 | B2 | 1/2006 | Capel |
| 6,987,444 | B2 | 1/2006 | Bub et al. |
| 6,996,741 | B1 | 2/2006 | Pittelkow et al. |
| 7,030,597 | B2 | 4/2006 | Bruno et al. |
| 7,031,176 | B2 | 4/2006 | Kotsopoulos et al. |
| 7,038,430 | B2 | 5/2006 | Itabashi et al. |
| 7,042,195 | B2 | 5/2006 | Tsunetsugu et al. |
| 7,045,991 | B2 | 5/2006 | Nakamura et al. |
| 7,046,531 | B2 | 5/2006 | Zocchi et al. |
| 7,053,506 | B2 | 5/2006 | Alonso et al. |
| 7,061,211 | B2 | 6/2006 | Satoh et al. |
| 7,061,214 | B2 | 6/2006 | Mayega et al. |
| 7,064,967 | B2 | 6/2006 | Ichinose et al. |
| 7,068,017 | B2 | 6/2006 | Willner et al. |
| 7,072,194 | B2 | 7/2006 | Nayar et al. |
| 7,078,883 | B2 | 7/2006 | Chapman et al. |
| 7,079,406 | B2 | 7/2006 | Kurokami et al. |
| 7,087,332 | B2 | 8/2006 | Harris |
| 7,088,595 | B2 | 8/2006 | Nino |
| 7,090,509 | B1 | 8/2006 | Gilliland et al. |
| 7,091,707 | B2 | 8/2006 | Cutler |
| 7,097,516 | B2 | 8/2006 | Werner et al. |
| 7,099,169 | B2 | 8/2006 | West et al. |
| 7,126,053 | B2 | 10/2006 | Kurokami et al. |
| 7,126,294 | B2 | 10/2006 | Minami et al. |
| 7,138,786 | B2 | 11/2006 | Ishigaki et al. |
| 7,142,997 | B1 | 11/2006 | Widner |
| 7,148,669 | B2 | 12/2006 | Maksimovic et al. |
| 7,150,938 | B2 | 12/2006 | Munshi et al. |
| 7,158,359 | B2 | 1/2007 | Bertele et al. |
| 7,158,395 | B2 | 1/2007 | Deng et al. |
| 7,161,082 | B2 | 1/2007 | Matsushita et al. |
| 7,174,973 | B1 | 2/2007 | Lysaght |
| 7,183,667 | B2 | 2/2007 | Colby et al. |
| 7,193,872 | B2 | 3/2007 | Siri |
| 7,202,653 | B2 | 4/2007 | Pai |
| 7,208,674 | B2 | 4/2007 | Aylaian |
| 7,218,541 | B2 | 5/2007 | Price et al. |
| 7,248,946 | B2 | 7/2007 | Bashaw et al. |
| 7,256,566 | B2 | 8/2007 | Bhavaraju et al. |
| 7,259,474 | B2 | 8/2007 | Blanc |
| 7,262,979 | B2 | 8/2007 | Wai et al. |
| 7,276,886 | B2 | 10/2007 | Kinder et al. |
| 7,277,304 | B2 | 10/2007 | Stancu et al. |
| 7,281,141 | B2 | 10/2007 | Elkayam et al. |
| 7,282,814 | B2 | 10/2007 | Jacobs |
| 7,282,924 | B1 | 10/2007 | Wittner |
| 7,291,036 | B1 | 11/2007 | Daily et al. |
| RE39,976 | E | 1/2008 | Schiff et al. |
| 7,315,052 | B2 | 1/2008 | Alter |
| 7,319,313 | B2 | 1/2008 | Dickerson et al. |
| 7,324,361 | B2 | 1/2008 | Siri |
| 7,336,004 | B2 | 2/2008 | Lai |
| 7,336,056 | B1 | 2/2008 | Dening |
| 7,339,287 | B2 | 3/2008 | Jepsen et al. |
| 7,348,802 | B2 | 3/2008 | Kasanyal et al. |
| 7,352,154 | B2 | 4/2008 | Cook |
| 7,361,952 | B2 | 4/2008 | Miura et al. |
| 7,371,963 | B2 | 5/2008 | Suenaga et al. |
| 7,372,712 | B2 | 5/2008 | Stancu et al. |
| 7,385,380 | B2 | 6/2008 | Ishigaki et al. |
| 7,385,833 | B2 | 6/2008 | Keung |
| 7,388,348 | B2 | 6/2008 | Mattichak |
| 7,394,237 | B2 | 7/2008 | Chou et al. |
| 7,405,117 | B2 | 7/2008 | Zuniga et al. |
| 7,414,870 | B2 | 8/2008 | Rottger et al. |
| 7,420,354 | B2 | 9/2008 | Cutler |
| 7,420,815 | B2 | 9/2008 | Love |
| 7,432,691 | B2 | 10/2008 | Cutler |
| 7,435,134 | B2 | 10/2008 | Lenox |
| 7,435,897 | B2 | 10/2008 | Russell |
| 7,443,052 | B2 | 10/2008 | Wendt et al. |
| 7,443,152 | B2 | 10/2008 | Utsunomiya |

(56) References Cited

U.S. PATENT DOCUMENTS

| | | |
|---|---|---|
| 7,450,401 B2 | 11/2008 | Iida |
| 7,456,510 B2 | 11/2008 | Ito et al. |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,007 B2 | 3/2011 | Gibson et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 7,977,810 B2 | 7/2011 | Choi et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,049,363 B2 | 11/2011 | McLean et al. |
| 8,050,804 B2 | 11/2011 | Kernahan |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |
| 8,204,709 B2 * | 6/2012 | Presher, Jr. .............. H02J 7/35 702/88 |
| 8,212,408 B2 | 7/2012 | Fishman |
| 8,212,409 B2 | 7/2012 | Bettenwort et al. |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,284,574 B2 | 10/2012 | Chapman et al. |
| 8,289,183 B1 | 10/2012 | Foss |
| 8,289,742 B2 | 10/2012 | Adest et al. |
| 8,294,451 B2 | 10/2012 | Hasenfus |
| 8,299,773 B2 | 10/2012 | Jang et al. |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,324,921 B2 | 12/2012 | Adest et al. |
| 8,325,059 B2 | 12/2012 | Rozenboim |
| 8,344,548 B2 | 1/2013 | Stern |
| 8,369,113 B2 | 2/2013 | Rodriguez |
| 8,378,656 B2 | 2/2013 | de Rooij et al. |
| 8,379,418 B2 | 2/2013 | Falk |
| 8,391,031 B2 | 3/2013 | Garrity |
| 8,391,032 B2 | 3/2013 | Garrity et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,410,889 B2 | 4/2013 | Garrity et al. |
| 8,410,950 B2 | 4/2013 | Takehara et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,466,789 B2 | 6/2013 | Muhlberger et al. |
| 8,472,220 B2 | 6/2013 | Garrity et al. |
| 8,473,250 B2 | 6/2013 | Adest et al. |
| 8,509,032 B2 | 8/2013 | Rakib |
| 8,526,205 B2 | 9/2013 | Garrity |
| 8,531,055 B2 | 9/2013 | Adest et al. |
| 8,542,512 B2 | 9/2013 | Garrity |
| 8,570,017 B2 | 10/2013 | Perichon et al. |
| 8,581,441 B2 | 11/2013 | Rotzoll et al. |

(56) References Cited

U.S. PATENT DOCUMENTS

| | | |
|---|---|---|
| 8,587,151 B2 | 11/2013 | Adest et al. |
| 8,618,692 B2 | 12/2013 | Adest et al. |
| 8,624,443 B2 | 1/2014 | Mumtaz |
| 8,653,689 B2 | 2/2014 | Rozenboim |
| 8,669,675 B2 | 3/2014 | Capp et al. |
| 8,670,255 B2 | 3/2014 | Gong et al. |
| 8,674,548 B2 | 3/2014 | Mumtaz |
| 8,674,668 B2 | 3/2014 | Chisenga et al. |
| 8,686,333 B2 | 4/2014 | Arditi et al. |
| 8,710,351 B2 | 4/2014 | Robbins |
| 8,751,053 B2 | 6/2014 | Hadar et al. |
| 8,773,236 B2 | 7/2014 | Makhota et al. |
| 8,791,598 B2 | 7/2014 | Jain |
| 8,809,699 B2 | 8/2014 | Funk |
| 8,811,047 B2 | 8/2014 | Rodriguez |
| 8,816,535 B2 | 8/2014 | Adest et al. |
| 8,823,212 B2 | 9/2014 | Garrity et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,859,884 B2 | 10/2014 | Dunton et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,917,156 B2 | 12/2014 | Garrity et al. |
| 8,922,061 B2 | 12/2014 | Arditi |
| 8,933,321 B2 | 1/2015 | Hadar et al. |
| 8,934,269 B2 | 1/2015 | Garrity |
| 8,963,375 B2 | 2/2015 | DeGraaff |
| 8,963,378 B1 | 2/2015 | Fornage et al. |
| 8,972,765 B1 | 3/2015 | Krolak et al. |
| 9,130,401 B2 | 9/2015 | Adest et al. |
| 9,257,848 B2 | 2/2016 | Coccia et al. |
| 9,291,696 B2 | 3/2016 | Adest et al. |
| 9,397,497 B2 | 7/2016 | Ledenev |
| 9,401,664 B2 | 7/2016 | Perreault et al. |
| 9,407,161 B2 | 8/2016 | Adest et al. |
| 9,466,737 B2 | 10/2016 | Ledenev |
| 9,660,527 B2 | 5/2017 | Glovinski |
| 9,673,630 B2 | 6/2017 | Ledenev et al. |
| 9,819,178 B2 | 11/2017 | Gazit et al. |
| 9,831,916 B2 | 11/2017 | Behrends |
| 9,843,193 B2 | 12/2017 | Getsla |
| 9,923,516 B2 | 3/2018 | Har-Shai et al. |
| 9,991,717 B1 | 6/2018 | Rowe et al. |
| 10,032,939 B2 | 7/2018 | Ledenev et al. |
| 2001/0000957 A1 | 5/2001 | Birchfield et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0002040 A1 | 1/2002 | Kline et al. |
| 2002/0014262 A1 | 2/2002 | Matsushita et al. |
| 2002/0017900 A1 | 2/2002 | Takeda et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0113689 A1 | 8/2002 | Gehlot et al. |
| 2002/0118559 A1 | 8/2002 | Kurokami et al. |
| 2002/0127980 A1 | 9/2002 | Amanullah et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0002303 A1 | 1/2003 | Riggio et al. |
| 2003/0025594 A1 | 2/2003 | Akiyama et al. |
| 2003/0038615 A1 | 2/2003 | Elbanhawy |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0121514 A1 | 7/2003 | Davenport et al. |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0027112 A1 | 2/2004 | Kondo et al. |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0213169 A1 | 10/2004 | Allard et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0255999 A1 | 12/2004 | Matsushita et al. |
| 2004/0258141 A1 | 12/2004 | Tustison et al. |
| 2004/0262998 A1 | 12/2004 | Kunow et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |

(56) References Cited

U.S. PATENT DOCUMENTS

| | | |
|---|---|---|
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1* | 2/2006 | Johnson ............... H02M 7/538 363/97 |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0125449 A1 | 6/2006 | Unger |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0238750 A1 | 10/2006 | Shimotomai |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0223165 A1 | 9/2007 | Itri et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0246546 A1 | 10/2007 | Yoshida |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0186004 A1 | 8/2008 | Williams |

(56) References Cited

U.S. PATENT DOCUMENTS

| | | |
|---|---|---|
| 2008/0191560 A1 | 8/2008 | Besser et al. |
| 2008/0191675 A1 | 8/2008 | Besser et al. |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0283118 A1 | 11/2008 | Rotzoll et al. |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0295225 A1 | 12/2009 | Asplund et al. |
| 2009/0296434 A1 | 12/2009 | De Rooij et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0038907 A1 | 2/2010 | Hunt et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0131108 A1 | 5/2010 | Meyer |
| 2010/0132757 A1 | 6/2010 | He et al. |
| 2010/0132758 A1 | 6/2010 | Gilmore |
| 2010/0132761 A1 | 6/2010 | Echizenya et al. |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0141153 A1 | 6/2010 | Recker et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195357 A1 | 8/2010 | Fornage et al. |
| 2010/0195361 A1 | 8/2010 | Stern |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0213897 A1 | 8/2010 | Tse |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |

(56) References Cited

U.S. PATENT DOCUMENTS

| | | |
|---|---|---|
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0088741 A1 | 4/2011 | Dunton et al. |
| 2011/0108087 A1 | 5/2011 | Croft et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267721 A1 | 11/2011 | Chaintreuil et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0285375 A1 | 11/2011 | Deboy |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007434 A1 | 1/2012 | Perreault et al. |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0042588 A1 | 2/2012 | Erickson, Jr. |
| 2012/0043818 A1 | 2/2012 | Stratakos et al. |
| 2012/0044014 A1 | 2/2012 | Stratakos et al. |
| 2012/0044717 A1 | 2/2012 | Suntio et al. |
| 2012/0048325 A1 | 3/2012 | Matsuo et al. |
| 2012/0049627 A1 | 3/2012 | Matsu et al. |
| 2012/0049801 A1 | 3/2012 | Chang |
| 2012/0056483 A1 | 3/2012 | Capp et al. |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0127764 A1 | 5/2012 | Phadke et al. |
| 2012/0133372 A1 | 5/2012 | Tsai et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0175961 A1 | 7/2012 | Har-Shai et al. |
| 2012/0175963 A1 | 7/2012 | Adest et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0212066 A1 | 8/2012 | Adest et al. |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0268969 A1 | 10/2012 | Cuk |
| 2012/0271576 A1 | 10/2012 | Kamel et al. |
| 2012/0274145 A1 | 11/2012 | Taddeo |
| 2012/0274264 A1 | 11/2012 | Mun et al. |
| 2012/0280571 A1 | 11/2012 | Hargis |
| 2012/0299380 A1 | 11/2012 | Haupt |
| 2012/0318320 A1 | 12/2012 | Robbins |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0039028 A1 | 2/2013 | Korman et al. |
| 2013/0049710 A1 | 2/2013 | Kraft et al. |
| 2013/0062958 A1 | 3/2013 | Erickson, Jr. et al. |
| 2013/0063119 A1 | 3/2013 | Lubomirsky |
| 2013/0082724 A1 | 4/2013 | Noda et al. |
| 2013/0094112 A1 | 4/2013 | Burghardt et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0194706 A1 | 8/2013 | Har-Shai et al. |
| 2013/0214607 A1 | 8/2013 | Harrison |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1 | 10/2013 | McBride et al. |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1* | 12/2013 | Hopf .............. H02H 3/02 307/130 |
| 2013/0321013 A1 | 12/2013 | Pisklak et al. |
| 2013/0332093 A1 | 12/2013 | Adest et al. |
| 2013/0335861 A1 | 12/2013 | Laschinski et al. |
| 2014/0062206 A1 | 3/2014 | Bryson |
| 2014/0077756 A1 | 3/2014 | Kataoka et al. |

(56) References Cited

U.S. PATENT DOCUMENTS

| | | |
|---|---|---|
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0169053 A1 | 6/2014 | Ilic et al. |
| 2014/0191583 A1 | 7/2014 | Chisenga et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0293491 A1 | 10/2014 | Robbins |
| 2014/0306543 A1 | 10/2014 | Garrity et al. |
| 2014/0327313 A1 | 11/2014 | Arditi et al. |
| 2014/0327995 A1 | 11/2014 | Panjwani et al. |
| 2014/0354245 A1 | 12/2014 | Batikoff et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0061409 A1 | 3/2015 | Dunton et al. |
| 2015/0131187 A1 | 5/2015 | Krein et al. |
| 2015/0188415 A1 | 7/2015 | Abido et al. |
| 2015/0263609 A1 | 9/2015 | Weida et al. |
| 2015/0318410 A1 | 11/2015 | Higuma |
| 2015/0364918 A1 | 12/2015 | Singh et al. |
| 2015/0372490 A1 | 12/2015 | Bakas et al. |
| 2015/0381108 A1 | 12/2015 | Hoft et al. |
| 2015/0381111 A1 | 12/2015 | Nicolescu et al. |
| 2016/0006392 A1 | 1/2016 | Hoft |
| 2016/0036235 A1 | 2/2016 | Getsla |
| 2016/0126367 A1 | 5/2016 | Dunton et al. |
| 2016/0172900 A1 | 6/2016 | Welch, Jr. |
| 2016/0181802 A1 | 6/2016 | Jacobson et al. |
| 2016/0211841 A1 | 7/2016 | Harrison |
| 2016/0226252 A1 | 8/2016 | Kravtiz et al. |
| 2016/0226257 A1 | 8/2016 | Porter et al. |
| 2016/0241039 A1 | 8/2016 | Cheng et al. |
| 2016/0268809 A1 | 9/2016 | Ledenev et al. |
| 2016/0276820 A1 | 9/2016 | Olivas et al. |
| 2016/0329715 A1 | 11/2016 | Orr et al. |
| 2016/0336899 A1 | 11/2016 | Ledenev et al. |
| 2016/0380436 A1 | 12/2016 | Porter et al. |
| 2017/0104413 A1 | 4/2017 | Busch et al. |
| 2017/0179876 A1 | 6/2017 | Freeman et al. |
| 2017/0184343 A1 | 6/2017 | Freer et al. |
| 2017/0211190 A1 | 7/2017 | Glasscock et al. |
| 2017/0271879 A1 | 9/2017 | Ledenev et al. |
| 2017/0278375 A1 | 9/2017 | Galin et al. |
| 2017/0288384 A1 | 10/2017 | Loewenstern et al. |
| 2017/0331325 A1 | 11/2017 | Ristau |
| 2018/0145593 A1 | 5/2018 | Xi et al. |
| 2018/0191292 A1 | 7/2018 | Ehlmann |
| 2019/0379279 A1 | 12/2019 | Adest et al. |

FOREIGN PATENT DOCUMENTS

| | | |
|---|---|---|
| AU | 2012225199 A1 | 10/2013 |
| CA | 1183574 A | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CA | 2702392 C | 9/2015 |
| CN | 2071396 U | 2/1991 |
| CN | 1106523 A | 8/1995 |
| CN | 2284479 Y | 6/1998 |
| CN | 1188453 A | 7/1998 |
| CN | 2305016 Y | 1/1999 |
| CN | 1236213 A | 11/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 2579063 Y | 10/2003 |
| CN | 1474492 A | 2/2004 |
| CN | 1523726 A | 8/2004 |
| CN | 1551377 A | 12/2004 |
| CN | 1185782 C | 1/2005 |
| CN | 2672938 Y | 1/2005 |
| CN | 1588773 A | 3/2005 |
| CN | 1201157 C | 5/2005 |
| CN | 1614854 A | 5/2005 |
| CN | 2706955 Y | 6/2005 |
| CN | 1245795 C | 3/2006 |
| CN | 1787717 A | 6/2006 |
| CN | 1794537 A | 6/2006 |
| CN | 1838191 A | 9/2006 |
| CN | 1841254 A | 10/2006 |
| CN | 1841823 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 1933315 A | 3/2007 |
| CN | 2891438 Y | 4/2007 |
| CN | 101030752 A | 9/2007 |
| CN | 101050770 A | 10/2007 |
| CN | 101107712 A | 1/2008 |
| CN | 100371843 C | 2/2008 |
| CN | 101128974 A | 2/2008 |
| CN | 101136129 A | 3/2008 |
| CN | 101180781 A | 5/2008 |
| CN | 101257221 A | 9/2008 |
| CN | 100426175 C | 10/2008 |
| CN | 201167381 Y | 12/2008 |
| CN | 201203438 Y | 3/2009 |
| CN | 101488271 A | 7/2009 |
| CN | 101521459 A | 9/2009 |
| CN | 101523230 A | 9/2009 |
| CN | 101647172 A | 2/2010 |
| CN | 101672252 A | 3/2010 |
| CN | 101697462 A | 4/2010 |
| CN | 101779291 A | 7/2010 |
| CN | 101847939 A | 9/2010 |
| CN | 201601477 U | 10/2010 |
| CN | 201623478 U | 11/2010 |
| CN | 101902051 A | 12/2010 |
| CN | 101904015 A | 12/2010 |
| CN | 201663167 U | 12/2010 |
| CN | 101939660 A | 1/2011 |
| CN | 101951011 A | 1/2011 |
| CN | 101951190 A | 1/2011 |
| CN | 101953051 A | 1/2011 |
| CN | 101953060 A | 1/2011 |
| CN | 101976855 A | 2/2011 |
| CN | 101976952 A | 2/2011 |
| CN | 101980409 A | 2/2011 |
| CN | 102084584 A | 6/2011 |
| CN | 102089883 A | 6/2011 |
| CN | 102117815 A | 7/2011 |
| CN | 102148584 A | 8/2011 |
| CN | 201926948 U | 8/2011 |
| CN | 201956938 U | 8/2011 |
| CN | 202034903 U | 11/2011 |
| CN | 102273039 A | 12/2011 |
| CN | 202103601 U | 1/2012 |
| CN | 102362550 A | 2/2012 |
| CN | 102386259 A | 3/2012 |
| CN | 202178274 U | 3/2012 |
| CN | 102474112 A | 5/2012 |
| CN | 102771017 A | 11/2012 |
| CN | 202871823 U | 4/2013 |
| CN | 203367304 U | 12/2013 |
| CN | 104685785 A | 6/2015 |
| CN | 105075046 A | 11/2015 |

(56) References Cited

FOREIGN PATENT DOCUMENTS

| | | |
|---|---|---|
| CN | 105164915 A | 12/2015 |
| DE | 1161639 B | 1/1964 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 9312710 U1 | 10/1993 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19614861 A1 | 7/1997 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19859732 A1 | 6/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 102004037446 A1 | 6/2006 |
| DE | 69734495 T2 | 7/2006 |
| DE | 69735169 T2 | 8/2006 |
| DE | 102005012213 A1 | 8/2006 |
| DE | 102005018173 A1 | 10/2006 |
| DE | 20 2005 020161 U1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 202007002077 U1 | 4/2008 |
| DE | 102006060815 A1 | 6/2008 |
| DE | 602004011201 T2 | 12/2008 |
| DE | 102007051134 A1 | 3/2009 |
| DE | 202008012345 U1 | 3/2009 |
| DE | 102007037130 B3 | 4/2009 |
| DE | 102007050031 B3 | 4/2009 |
| DE | 202009007318 U1 | 8/2009 |
| DE | 102008042199 A1 | 4/2010 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| DE | 102013101314 A1 | 8/2014 |
| DE | 102013106255 A1 | 12/2014 |
| DE | 102013106808 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 0418612 A1 | 3/1991 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 653692 A2 | 5/1995 |
| EP | 0670915 A1 | 9/1995 |
| EP | 677749 A2 | 10/1995 |
| EP | 0677749 A3 | 1/1996 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 824273 A2 | 2/1998 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 964415 A1 | 12/1999 |
| EP | 964457 A2 | 12/1999 |
| EP | 0978884 A3 | 3/2000 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1291997 A2 | 3/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1120895 A3 | 5/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1642355 A2 | 4/2006 |
| EP | 0964457 A3 | 5/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1734373 A2 | 12/2006 |
| EP | 1750193 A1 | 2/2007 |
| EP | 1766490 A1 | 3/2007 |
| EP | 1782146 A2 | 5/2007 |

(56) References Cited

FOREIGN PATENT DOCUMENTS

| | | |
|---|---|---|
| EP | 1785800 A1 | 5/2007 |
| EP | 1837985 A2 | 9/2007 |
| EP | 1842121 A2 | 10/2007 |
| EP | 1609250 B1 | 1/2008 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 1914857 A1 | 4/2008 |
| EP | 2048679 A1 | 4/2009 |
| EP | 2054944 A2 | 5/2009 |
| EP | 2061088 A2 | 5/2009 |
| EP | 2092625 A2 | 8/2009 |
| EP | 2092631 A2 | 8/2009 |
| EP | 2130286 A1 | 12/2009 |
| EP | 2135296 A2 | 12/2009 |
| EP | 2135348 A2 | 12/2009 |
| EP | 2144133 A1 | 1/2010 |
| EP | 2179451 A1 | 4/2010 |
| EP | 2206159 A2 | 7/2010 |
| EP | 2232690 A1 | 9/2010 |
| EP | 2234237 A1 | 9/2010 |
| EP | 2249457 A1 | 11/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2386122 A2 | 11/2011 |
| EP | 2393178 A2 | 12/2011 |
| EP | 2395648 A2 | 12/2011 |
| EP | 2495766 A1 | 9/2012 |
| EP | 2515424 A2 | 10/2012 |
| EP | 2533299 A1 | 12/2012 |
| EP | 2549635 A1 | 1/2013 |
| EP | 2561596 A2 | 2/2013 |
| EP | 2615644 A2 | 7/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| EP | 3176933 A1 | 6/2017 |
| EP | 2139104 B1 | 10/2017 |
| ES | 2249147 A1 | 3/2006 |
| ES | 2249149 A1 | 3/2006 |
| FR | 2796216 A1 | 1/2001 |
| FR | 2819653 A1 | 7/2002 |
| FR | 2894401 A1 | 6/2007 |
| GB | 310362 A | 9/1929 |
| GB | 612859 A | 11/1948 |
| GB | 1211885 A | 11/1970 |
| GB | 1231961 A | 5/1971 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2434490 A | 7/2007 |
| GB | 2476508 A | 6/2011 |
| GB | 2480015 A | 11/2011 |
| GB | 2480015 B | 12/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | S56042365 A | 4/1981 |
| JP | S60027964 A | 2/1985 |
| JP | S60148172 A | 8/1985 |
| JP | 61065320 A | 4/1986 |
| JP | S62154121 A | 7/1987 |
| JP | S62154122 A | 7/1987 |
| JP | H01311874 A | 12/1989 |
| JP | H04219982 A | 8/1992 |
| JP | H04364378 A | 12/1992 |
| JP | H05003678 A | 1/1993 |
| JP | H06035555 A | 2/1994 |
| JP | H06141261 A | 5/1994 |
| JP | H07026849 A | 1/1995 |
| JP | H07058843 A | 3/1995 |
| JP | H07-222436 A | 8/1995 |
| JP | 8009557 A | 1/1996 |
| JP | H08033347 A | 2/1996 |
| JP | H08066050 A | 3/1996 |
| JP | H0897460 A | 4/1996 |
| JP | H08116628 A | 5/1996 |
| JP | H08181343 A | 7/1996 |
| JP | H08185235 A | 7/1996 |
| JP | H08204220 A | 8/1996 |
| JP | H08227324 A | 9/1996 |
| JP | H08316517 A | 11/1996 |
| JP | H08317664 A | 11/1996 |
| JP | H094692 A | 1/1997 |
| JP | H09097918 A | 4/1997 |
| JP | H09148611 A | 6/1997 |
| JP | H09148613 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086 A | 7/1998 |
| JP | H10201105 A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000-112545 A | 4/2000 |
| JP | 2000-116010 A | 4/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001086765 A | 3/2001 |
| JP | 2001178145 A | 6/2001 |
| JP | 2001189476 A | 7/2001 |
| JP | 2001224142 A | 8/2001 |
| JP | 2001238466 A | 8/2001 |
| JP | 2001250964 A | 9/2001 |
| JP | 2002073184 A | 3/2002 |
| JP | 2002231578 A | 8/2002 |
| JP | 2002238246 A | 8/2002 |
| JP | 2002-262461 A | 9/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134A A | 4/2003 |

(56) References Cited

FOREIGN PATENT DOCUMENTS

| | | |
|---|---|---|
| JP | 2003124492 A | 4/2003 |
| JP | 2003134661 A | 5/2003 |
| JP | 2003134667 A | 5/2003 |
| JP | 2003282916 A | 10/2003 |
| JP | 2003289674 A | 10/2003 |
| JP | 3499941 B2 | 2/2004 |
| JP | 2004055603 A | 2/2004 |
| JP | 2004-096090 A | 3/2004 |
| JP | 2004111754 A | 4/2004 |
| JP | 2004-147465 A | 5/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 2005-151662 A | 6/2005 |
| JP | 3656531 B2 | 6/2005 |
| JP | 2005192314 A | 7/2005 |
| JP | 2005-235082 A | 9/2005 |
| JP | 2005251039 A | 9/2005 |
| JP | 2005-276942 A | 10/2005 |
| JP | 2005-312287 A | 11/2005 |
| JP | 2006041440 A | 2/2006 |
| JP | 2006262619 A | 9/2006 |
| JP | 2006278755 A | 10/2006 |
| JP | 2007058845 A | 3/2007 |
| JP | 2007104872 A | 4/2007 |
| JP | 2007225625 A | 9/2007 |
| JP | 4174227H B2 | 10/2008 |
| JP | 2010-146047 A | 7/2010 |
| JP | 2010245532 A | 10/2010 |
| JP | 2011-249790 A | 12/2011 |
| JP | 2012-60714 A | 3/2012 |
| JP | 2012511299 A | 5/2012 |
| JP | 2012178535 A | 9/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 20060060825 A | 6/2006 |
| KR | 20070036528 A | 4/2007 |
| KR | 100725755 B1 | 5/2007 |
| KR | 20080092747 A | 10/2008 |
| KR | 100912892 B1 | 8/2009 |
| KR | 101073143 B1 | 10/2011 |
| NL | 1011483 C2 | 9/2000 |
| NO | 2004100344 A2 | 11/2004 |
| NO | 2008121266 A2 | 10/2008 |
| TW | 497326 B | 8/2002 |
| TW | 200913291 A | 3/2009 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 9003680 A1 | 4/1990 |
| WO | 1992007418 A1 | 4/1992 |
| WO | 1993013587 A1 | 7/1993 |
| WO | 95/25374 A1 | 9/1995 |
| WO | 95/34121 A1 | 12/1995 |
| WO | 1996007130 A1 | 3/1996 |
| WO | 1996013093 A1 | 5/1996 |
| WO | 1998023021 A2 | 5/1998 |
| WO | 1999028801 A1 | 6/1999 |
| WO | 00/00839 A1 | 1/2000 |
| WO | 00/21178 A1 | 4/2000 |
| WO | 0042689 A1 | 7/2000 |
| WO | 0075947 A1 | 12/2000 |
| WO | 0077522 A1 | 12/2000 |
| WO | 01/13502 A1 | 2/2001 |
| WO | 01047095 A2 | 6/2001 |
| WO | 02/17469 A1 | 2/2002 |
| WO | 0231517 | 4/2002 |
| WO | 02056126 A1 | 7/2002 |
| WO | 2002073785 A1 | 9/2002 |
| WO | 0278164 A1 | 10/2002 |
| WO | 02078164 A1 | 10/2002 |
| WO | 02093655 A1 | 11/2002 |
| WO | 03012569 A1 | 2/2003 |
| WO | 2003012569 A1 | 2/2003 |
| WO | 03/026114 A2 | 3/2003 |
| WO | 2003036688 A2 | 5/2003 |
| WO | 2003050938 A2 | 6/2003 |
| WO | 2003071655 A1 | 8/2003 |
| WO | 03084041 A1 | 10/2003 |
| WO | 2003098703 | 11/2003 |
| WO | 2004001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005036725 A1 | 4/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A2 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006033143 A1 | 3/2006 |
| WO | 2006/013600 A3 | 5/2006 |
| WO | 2006048688 A1 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006/125664 A1 | 11/2006 |
| WO | 2006117551 A2 | 11/2006 |
| WO | 2006130520 A2 | 12/2006 |
| WO | 2006137948 A2 | 12/2006 |
| WO | 2007006564 A2 | 1/2007 |
| WO | 2007007360 A2 | 1/2007 |
| WO | 2007010326 A1 | 1/2007 |
| WO | 2007/020419 A1 | 2/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2007129808 A1 | 11/2007 |
| WO | 2007142693 A2 | 12/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008069926 A3 | 8/2008 |
| WO | 2008097591 A2 | 8/2008 |
| WO | 2008119034 A1 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009003680 A1 | 1/2009 |
| WO | 2009006879 A2 | 1/2009 |
| WO | 2009007782 A2 | 1/2009 |
| WO | 2009011780 A2 | 1/2009 |

(56) References Cited

FOREIGN PATENT DOCUMENTS

| | | |
|---|---|---|
| WO | 2009020917 A2 | 2/2009 |
| WO | 2009/026602 A1 | 3/2009 |
| WO | 2009007782 A3 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051854 A1 | 4/2009 |
| WO | 2009051870 A1 | 4/2009 |
| WO | 2009055474 A1 | 4/2009 |
| WO | 2009/059877 A1 | 5/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072076 A2 | 6/2009 |
| WO | 2009072077 A1 | 6/2009 |
| WO | 2009073868 A1 | 6/2009 |
| WO | 2009073995 A1 | 6/2009 |
| WO | 2009075985 A2 | 6/2009 |
| WO | 2009/075985 A3 | 7/2009 |
| WO | 2009114341 A2 | 9/2009 |
| WO | 2009118682 A2 | 10/2009 |
| WO | 2009118683 A2 | 10/2009 |
| WO | 2009118683 A3 | 11/2009 |
| WO | 2009136358 A1 | 11/2009 |
| WO | 2009140536 A2 | 11/2009 |
| WO | 2009140539 A2 | 11/2009 |
| WO | 2009140543 A2 | 11/2009 |
| WO | 2009140551 A2 | 11/2009 |
| WO | 2009118682 A3 | 12/2009 |
| WO | 2009155392 A1 | 12/2009 |
| WO | 2010/002960 A1 | 1/2010 |
| WO | 2010/003941 A2 | 1/2010 |
| WO | 2009136358 A4 | 1/2010 |
| WO | 2009/140536 A3 | 2/2010 |
| WO | 2009/140543 A3 | 2/2010 |
| WO | 2009/140551 A3 | 2/2010 |
| WO | 2010014116 A1 | 2/2010 |
| WO | 2010020385 A2 | 2/2010 |
| WO | 2010/042124 A1 | 4/2010 |
| WO | 2010037393 A1 | 4/2010 |
| WO | 2010056777 A1 | 5/2010 |
| WO | 2010/071855 A2 | 6/2010 |
| WO | 2010062410 A1 | 6/2010 |
| WO | 2010062662 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010118503 A1 | 10/2010 |
| WO | 2010120315 A1 | 10/2010 |
| WO | 2010/132369 A1 | 11/2010 |
| WO | 2010134057 A1 | 11/2010 |
| WO | 20100134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011019936 A1 | 2/2011 |
| WO | 2011023732 A2 | 3/2011 |
| WO | 2011028456 A2 | 3/2011 |
| WO | 2011028457 A2 | 3/2011 |
| WO | 2011044641 A1 | 4/2011 |
| WO | 2011049985 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011109746 A2 | 9/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2012024538 A3 | 5/2012 |
| WO | 2012100263 A2 | 7/2012 |
| WO | 2013015921 A1 | 1/2013 |
| WO | 2013019899 A2 | 2/2013 |
| WO | 2013130563 A1 | 9/2013 |
| WO | 2014143021 A1 | 9/2014 |
| WO | 2017/125375 A1 | 7/2017 |
| WO | 2018122835 A1 | 7/2018 |

OTHER PUBLICATIONS

Philips Semiconductors, Data Sheet PSMN005-55B; PSMN005-55P N-channel logic trenchMOS transistor, Oct. 1999, Product specification, pp. 1-11.
International Preliminary Report on Patentability Issued in corresponding international application No. PCT/US04/16668, filed May 27, 2004.
International Application No. PCT/US13/27965, International Preliminary Examination Report, dated Sep. 2, 2014.
International Patent Application PCT/US13/027965, International Search Report and Written Opinion, dated Jun. 2, 2013.
International Application No. PCT/US12/44045, International Preliminary Examination Report, dated Jan. 28, 2014.
International Patent Application No. PCT/US2012/044045, International Search Report and Written Opinion, dated Jan. 2, 2013.
International Patent Application No. PCT/US2009/047734, International Search Report and Written Opinion, dated May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, dated Oct. 27, 2010.
Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.
International Patent Application No. PCT/US2011/020591, International Search Report and Written Opinion, dated Aug. 8, 2011.
International Patent Application No. PCT/US2011/033544, International Search Report and Written Opinion, dated Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, dated Jun. 24, 2009.
International Patent Application No. PCT/US2010/046274 International Search Report and Written Opinion, dated Apr. 22, 2011.
International Patent Application No. PCT/US2011/033658, International Search Report and Written Opinion, dated Jan. 13, 2012.
International Patent Application No. PCT/US2011/029392, International Search Report and Written Opinion, dated Oct. 24, 2011.
European Patent Application No. 09829487.9, Extended Search Report, dated Apr. 21, 2011.
International Patent Application No. PCT/US2009/062536, International Search Report and Written Opinion, dated Jun. 17, 2010.
International Patent Application No. PCT/US2010/022915, International Search Report and Written Opinion, dated Aug. 23, 2010.
International Patent Application No. PCT/US2010/046272, International Search Report and Written Opinion, dated Mar. 31, 2011.
Exell et al., "The Design and Development of a Solar Powered Refrigerator", [retrieved on Feb. 13, 2013], Retrieved from the Internet <URL: http://www.appropedia.org/The_Design_and_Development_of_a_Solar_Powered_Refrigerator>, pp. 1-64.
"Development of Water-Lithium Bromide Low-Temperature Absorption Refrigerating Machine", 2002 Energy & Environment on Database on Noteworthy contributions for Science and Technology

(56) References Cited

OTHER PUBLICATIONS (Japan), Research Data (No. 1748) [online], [retrieved on Aug. 29, 2012]. Retrieved from the Internet: <URL: http://dbnstl.nii.ac.jp/english/detail/1748>, pp. 1-4.
Dictionary.com, "air conditioning" [online], [retrieved on Aug. 28, 2012]. Retrieved from the Internet: <URL: http://dictionary.reference.com/browse/air+conditioning?s=t>, pp. 1-3.
International Patent Application No. PCT/US2010/029936, International Search Report and Written Opinion, dated Nov. 12, 2010.
International Patent Application No. PCT/US08/75127, International Search Report and Written Opinion, dated Apr. 28, 2009.
International Patent Application No. PCT/US09/35890, International Search Report and Written Opinion, dated Oct. 1, 2009.
European Patent Application No. 08845104.2, Extended Search Report, dated Jul. 31, 2014.
European Patent Application No. 11772811.3, Extended Search Report, dated Dec. 15, 2014.
International Patent Application No. PCT/US2008/082935, International Search Report and Written Opinion, dated Jun. 25, 2009.
Bhatnagar et al., Silicon Carbide High Voltage (400 V) Shottky Barrier Diodes, IEEE Electron Device Letters, vol. 13 (10) p. 501-503 Oct. 10, 1992.
Jun. 6-10, 2004—Rodriguez, C., and G. A. J. Amaratunga. "Dynamic stability of grid-connected photovoltaic systems." Power Engineering Society General Meeting, 2004. IEEE, pp. 2194-2200.
Nov. 3, 1999—Dec. 29—Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Oct. 7-12, 1990—Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Jun. 23-27, 2002—Calais, Martina, et al. "Inverters for single-phase grid connected photovoltaic systems-an overview." Power Electronics Specialists Conference, 2002. pesc 02. 2002 IEEE 33rd Annual. vol. 4. IEEE, 2002.
Jul. 1999—Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Apr. 2-5, 2002—Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Jun. 9-11, 2003—Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Mar. 6-10, 2005—Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Jun. 23-27, 2002—Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference 2002, pp. 1483-1488, vol. 3, IEEE.
Written Opinion of PCT/GB2005/050197, dated Feb. 14, 2006, Enecsys Limited.
Jun. 17-21, 2001—Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
Aug. 9, 2010, Hong, Wei, et al., "Charge Equalization of Battery POwer Modules in Series" The 2010 International Power Electronics Conference, IEEE, p. 1568-1572.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inductor—Design Note 369"—Linear Technology Corporation—www.linear.com—2005.
"Micropower Synchronous Buck-Boost DC/DC Converter"—Linear Technology Corporation—www.linear.com/LTC3440—2001.
Mar. 5-9, 1995—Caricchi, F. et al—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIT Bombay, Apr. 2006.
Jun. 20-25, 2004—Viswanathan, K. et al—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation—www.linear.com/LTC3780—2005.
May 19-24, 2002—Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.
Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—dated Nov. 29, 2016.
Mar. 8, 2003—Vishay Siliconix "Si 7884DP—n-Channel 40-V (D-S) MOSFET" (2003).
Chinese Office Action—CN 201510423458.2—dated Jan. 3, 2017 (english translation provided).
Chinese Office Action—CN 201410098154.9—dated Mar. 3, 2017 (enligsh translation provided).
European Search Report—EP Appl. 13150911.9—dated Apr. 7, 2017.

(56) References Cited

OTHER PUBLICATIONS

Howard et al, "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et. al—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP2374190—EP App No. 08878650.4.
Sep. 28, 2017—European Office Action—EP 08857835.6.
Nov. 2, 2017—EP Search Report App No. 13157876.7.
Nov. 11, 2017—EP Search Report—App No. 17171489.2.
Dec. 14, 2017—EP Search Report App No. 17188362.2.
Dec. 15, 2017—EP Search Report App No. 17188365.5.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Electrical Engineering and Computer Science Dissertation; 8 pages.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
2006; Esmaili, Gholamreza; "Application of Advanced Power Electornics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.
May 1, 2000; Kroposki, H. Thomas and Witt, B & C; "Progress in Photovoltaic Components and Systems," National Renewable Energy Laboratory; NREL-CP-520-27460; 7 pages.
Jan. 22-23, 1998 Oldenkamp, H. et al; "AC Modules: Past, Present and Future" Workshop Installing the Solar Solution; Hatfield, UK; 6 pages.
Linear Technology Specification Sheet, LTC3443—"High Current Micropower 600kHz Synchronous Buck-Boost DC/DC Converter"—2004.
Linear Technology Specification Sheet, LTC3780—"High Efficiency Synchronous, 4-Switch Buck-Boost Controller"—2005.
Apr. 22, 22004—Micrel—MIC2182 High Efficiency Synchronous Buck Controller.
Apr. 1972—Methods for Utilizing Maximum Power From a Solar Array—Decker, DK.
2000—Evaluating MPPT converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu; "A Novel Power Converter for PHotovoltaic Applications," Journal of Power Sources; vol. 135, No. 1-2, pp. 327-331.
Jun. 1998—Stern M., et al., "Development of a Low-Cost Integrated 20-kW-AC Solar Tracking Subarray for Grid-Connected PV Power System Applications—Final Technical Report"—National Renewable Energy Laboratory; 41 pages.
1997; Verhoeve, C.W.G., et al., "Recent Test Results of AC_Module inverters," Netherlands Energy Research Foundation ECN, 1997; 3 pages.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques"—Applied Power Electronics Conference and Exposition, 1992. APEC '92. Conference Proceedings 1992., Seventh Annual.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: ⇆035.395.111—Telefax: ⇆335.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, ACHIM, WOYTE, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. OH Feb. 1, 2001.
"Disconnect Switches inPhotovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report 18(3), dated Sep. 16, 2011.

(56) References Cited

OTHER PUBLICATIONS

UK Intellectual Property Office, Patents Act 1977: Patents Rules Notification of Grant: Patent Serial No. GB2480015, dated Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002; Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—dated Jun. 10, 2009.
Extended European Search Report—EP12176089.6—dated Nov. 8, 2012.
Gwon-Jong Yu et al: "Maximum power point tracking with temperature compensation of photovoltaic for air aonditioning system with fuzzy controller", May 13, 1996; May 13, 1996-May 17, 1996, May 13, 1996 (May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodriguez et al., IEEE Transactions on Industrial Electronics, vol. 49, No. 4, Aug. 2002.
Extended European Search Report—EP08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
Mar. 4-8, 2001—Andersen Gert, et al.,—Aalborg University, Institute of Energy Technology, Denmark—"Currect Programmed Control of a Single Phase Two-Switch Buck-Boost Power Factor Correction Circut"—Applied Power Electronics Conference and Exposition, 2001. APEC 2001. Sixteenth Annual IEEE.
Feb. 22-26, 2004—Andersen, Gert et al.,—"Utilizing the free running Current Programmed Control as a Power Factor Correction Technique for the two switch Buck-Boost converter"—Applied Power Electronic Conference and Exposition, 2004. APEC '04. Nineteenth Annual IEEE.
Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.
Feb. 15-19, 1998—Caricchi, F. et al.,—"Study of Bi-Directional Buck-Boost Converter Topologies for Application in Electrical Vehicle Motor Drives"—Applied Power Electronics Conference and Exposition, 1998, APEC '98. COnference Proeedings 1998., Thirteenth Annual IEEE.
Nov. 27-30, 1990—Ensling, JHR—"Maximum Power Point Tracking: A Cost Saving Necessity in Solar Energy Systems"—Industrial Electornics Society, 1990. IECON '90., 16th Annual Conference of IEEE.
Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.
Feb. 15-19, 1998—Hua, et al.,—"Comparative Study of Peak Power Tracking Techniques for Solar Storage System"—Applied POwer Electronics Conference and Exposition, 1998. APEC'98. Conferenced Proceedings 1998., Thirteenth Annual IEEE.
Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1993. PESC '93 Record., 24th Annual IEEE.
May 19-24, 2002—Bower et at.,—"Certification of Photovoltaic Inverters: The Initial Step Toward PV System Certification"—Photovoltaic Specialists Conferences, 2002. Conference Record of the Twenty-Ninth IEEE.
Jun. 17-21, 2001—Tse et al., "A Novel Maximum Power Point Tracking Technique for PV Panels"—Power Electronics Specialists Conferences, 2001. PESC. 2001 IEEE 32nd Annual.
May 12-18, 2008—Cuadras et al., "Smart Interfaces for Low Power Energy Harvesting Systems"—Instrumentation and Measurement Technology Conferences Proceedings, 2008. IMTC 2008. IEEE.
Dec. 5-9, 1994—Haan, et al., "Test Results of a 130 W AC Module; a modular solar as power station"—Photovoltaic Energy Conversion 1994. Conference Record of the Twenty Fourth. IEEE Phtovoltaic Specialists Conference—1994.
Sep. 1-3, 1998—Jung, et al., "Soft Switching Boost Converter for Photovoltaic Power Generation System"—Power Electronics and Motion Control Conference, 2008. EPE-PEMC 2008.
Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).
Oct. 8-12, 2000—Hashimoto, et al., "A Novel High Peforamance Utility Interactive Photovoltain Inverter System"—Industry Applications Conference, 2000. Conference Record of the 2000 IEEE.
Feb. 22-26, 2004—Ho, et al., "An Integrated Inverter with Maximum Poer Tracking for Grid-Connected PV Systems"—Applied Power Electronics Conference and Exposition, 2004. APEC '04. Nineteenth Annual IEEE.

(56) References Cited

OTHER PUBLICATIONS

Nov. 14, 1997 Hua et al., "Control of DC/DC Converters for Solar Energy System with Maximum Power Tracking"—Industrial Electronics, Control and Instrumentation, 1997. IECON 97. 23rd International Conference on Industrial Electronics, Control and Instrumentation vol. 4 of 4.
Sep. 1-3, 2008 Lee et al., "Soft Switching Mutli-Phase Boost Converter for Photovoltaic System"—Power Electronics and Motnion Control Conference, 2008. EPE-PEMC 2008.
Jul. 5, 2005 Yao et al., "Tapped-Inductor Buck Converter for High-Step-Down DC-DC Conversion" IEEE Transactions on Power Electronics (vol. 20, Issue 4, Jul. 2005).
Sep. 21-23, 1998 Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).
May 25, 2000—Hong Lim, et al., "Simple Maximum Power Point Tracker for Photovoltaic Arrays"—Electronics Letters (vol. 36, Issue 11, May 25, 2000).
Aug. 14-16, 2004 Nishida et al., "A Novel Type of Utility-Interactive Inverter for Phtovoltaic System"—Power Electronics and Mtion Control Conference, 2004. IPEMC 2004.
May 30-Jun. 3, 2011 Jung, et al., "DC-Link Ripple Reduction of Series-connected Module Integrated Converter for Photovoltaic Systems."—Power Electronics and ECCE Asia (ICPE & ECCE).
Jan. 8, 2007 Li et al., "An Analysis of ZVS Two-Inductor Boost Converter under Variable Frequency Operation"—IEEE Transactions on Power Electronics (vol. 22, Issue 1, Jan. 2007).
Sep. 17, 2007 Rodriguez et al., "Analytic Solution to the Photovoltaic Maximum Power Point Problem"—IEEE Transactions on Circuits and Systems I: Regular Papers (vol. 54, Issue 9, Sep. 2007).
Jun. 27, 1997 Reimann et al., "A Novel Control Principle of Bi-Directional DC-DC Power Conversion"—Powre Electronics Specialists Conference 1997. PESC '97 Record.
Sep. 15-22, 2000 Russell et al., "The Massachusetts Electric Solar Project: A Pilot Project to Commercialize Residential PV Systems"—Photovoltaic Specialists Conference, 2000, Conference Record of the Twenty-Eighth IEEE Photovoltaic Specialists Conference—2000.
May 2001, Shimizu et al., "Generation Control Circuit for Photvoltaic Modules"—IEEE Transactions of Power Electronics (vol. 16, Issue 3, May 2001).
Feb. 6-10, 2000 Siri, Kasemsan "Study of System Instability in Current-Mode Converter Power Systems Operating in Solar Array Voltage Regulation Mode"—Applied Power Electronics Conference and Exposition, 2000. APEC 2000. Fiftheenth Annual IEEE.
Aug. 13-16, 1990—Rajan, Anita "A Maximum Power Point Tracker Optimized for Solar Powered Cars"—Future Transportation Technology Conference and Expostion.
Jul. 10, 1995—"Battery I.D. chip from Dallas Semiconductor monitors and reports battery pack temperature"—Business Wire.
Nov. 3, 1999—Takahashi et al., "Development of a Long-Life Three-Phase Flywheel UPS Using an Electrolytic Capacitorless Converter/Inverter"—Electrical Engineering in Japan, vol. 127.
Jan. 2001—Walker, Geoffrey "Evaluating MPPT Converter Topologies Using a Matlab PV Model"—"Journal of Electrical and Electronics Engineering, Australia".
Feb. 13, 2007—Roman et al., "Experimental Results of Controlled PV Module for Building Integrated PV Systems"—Solar Energy 82 (2008) 471-480.
2006—Bower et al., "Innovative PV Micro-Inverter Topology Eliminates Electrolytic Capacitors for Longer Lifetime"—IEEE 1-4244-0016-3/06/ pp. 2038-2041.
Aug. 23-27, 1993—Case et al., "A Minimum Component Photovoltaic Array Maximum Power Point Tracker"—European Space Power Conference vol. 1 . Power Systems, Power Electronics.
Jun. 4, 1997—Maranda et al., "Optimization of the Master-Slave Inverter System for Grid-Connected Photovoltaic Plants"—Energy Convers. Mgmt. vol. 39, No. 12 pp. 1239-1246.
2005—Kang et al., "Photovoltaic Power Interface Circuit Incorprated with a Buck-Boost Converter and a Full-Bridge Inverter"—Applied Energy 82, pp. 266-283.
Nov. 21, 1997—Feuermann et al., "Reversable Low Soalr Heat Gain Windows for Energy Savings"—Solar Energy vol. 62, No. 3 pp. 169-175.
May 16, 2005—Enrique et al., "Theoretical assessment of the maximum power point tracking efficiency of photovoltaic facilities with different converter topologies"—Solar Energy 81 (2007) p. 31-38.
Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3wVXuAAACAAJ.
Korean Patent Application No. 102005-7008700, filed May 13, 2015. Applicant: Exar Corporation.
Jan. 23, 2018—EP Search Report, EP App No. 17187230.2.
Apr. 16, 2018—EP Examination Report 12707899.6.
U.S. Appl. No. 13/308,517, Distributed Power Harvesting Systems Using DC Power Sources, filed Nov. 30, 2011.
U.S. Appl. No. 13/015,219, Testing of a Photovoltaic Panel, filed Jan. 27, 2011.
U.S. Appl. No. 13/238,041, Current Sensing on a Mosfet, filed Sep. 21, 2011.
U.S. Appl. No. 13/430,388, Safety Mechanisms, Wake Up and Shutdown Methods in Distributed Power Installations, filed Mar. 26, 2012.
U.S. Appl. No. 13/440,378, Safety Mechanisms, Wake Up and Shutdown Methods in Distributed Power Installations, filed Apr. 5, 2012.
U.S. Appl. No. 13/738,533, Photovoltaic Module, filed Jan. 10, 2013.
U.S. Appl. No. 14/033,781, Direct Current Link Circuit, filed Sep. 23, 2013.
U.S. Appl. No. 14/215,130, Bypass Mechanism, filed Mar. 17, 2014.
U.S. Appl. No. 14/323,531, System and Method for Protection During Inverter Shutdown in Distributed Power Installations, filed Jul. 3, 2014.
U.S. Appl. No. 14/631,227, Photovoltaic Panel Circuitry, filed Feb. 25, 2015.
U.S. Appl. No. 14/693,264, Battery Power Delivery Module, filed Apr. 22, 2015.
U.S. Appl. No. 14/743,018, Pairing of Components in a Direct Current Distributed Power Generation System, filed Jun. 18, 2015.
U.S. Appl. No. 14/809,511, Distributed Power Harvesting Systems Using DC Power Sources, filed Jul. 27, 2015.
U.S. Appl. No. 15/045,740, Photovoltaic System Power Tracking Method, filed Feb. 17, 2016.
U.S. Appl. No. 15/132,419, Direct Current Power Combiner, filed Apr. 19, 2016.
U.S. Appl. No. 15/369,881, Safety Mechanisms, Wake Up and Shutdown Methods in Distributed Power Installations, filed Dec. 5, 2016.
U.S. Appl. No. 15/184,040, Parallel Connected Inverters, filed Jun. 16, 2016.
U.S. Appl. No. 15/250,068, Safety Switch for Photovoltaic Systems, filed Aug. 29, 2016.
U.S. Appl. No. 15/407,881, Arc Detection and Prevention in a Power Generation System, filed Jan. 17, 2017.
U.S. Appl. No. 15/357,442, Testing of a Photovoltaic Panel, filed Nov. 21, 2016.
U.S. Appl. No. 15/365,084, Distributed Power Harvesting Systems Using DC Power Sources, filed Nov. 30, 2016.
U.S. Appl. No. 15/383,518, Method and Apparatus for Storing and Depleting Energy, filed Dec. 19, 2016.
U.S. Appl. No. 15/730,470, Distributed Power Harvesting Systems Using DC Power Sources, filed Oct. 11, 2017.
U.S. Appl. No. 15/653,049, Distributed Power System Using Direct Current Power Sources, filed Jul. 18, 2017.
U.S. Appl. No. 15/480,574, Monitoring of Distributed Power Harvesting Systems Using DC Power Sources, filed Apr. 6, 2017.

(56) References Cited

OTHER PUBLICATIONS

U.S. Appl. No. 15/464,850, Direct Current Link Circuit, filed Mar. 21, 2017.
U.S. Appl. No. 15/478,526, Optimizer Garland, filed Apr. 4, 2017.
U.S. Appl. No. 15/479,530, Arc Detection and Prevention in a Power Generation System, filed Apr. 5, 2017.
U.S. Appl. No. 15/627,037, System and Method for Protection During Inverter Shutdown in Distributed Power Installations, filed Jun. 19, 2017.
U.S. Appl. No. 15/495,301, Digital Average Input Current Control in Power Converter, filed Apr. 24, 2017.
U.S. Appl. No. 15/593,761, Photovoltaic Power Device and Wiring, filed May 12, 2017.
U.S. Appl. No. 15/593,942, Method for Distributed Power Harvesting Using DC Power Sources, filed May 12, 2017.
U.S. Appl. No. 15/641,535, Distributed Power Harvesting Systems Using DC Power Sources, filed Jul. 5, 2017.
U.S. Appl. No. 15/720,919, Maximizing Power in a Photovoltaic Distributed Power System, filed Sep. 29, 2017.
U.S. Appl. No. 15/819,903, Arc Detection and Prevention in a Power Generation System, filed Nov. 21, 2017.
U.S. Appl. No. 15/819,720, Maximizing Power in a Photovoltaic Distributed Power System, filed Nov. 21, 2017.
U.S. Appl. No. 15/838,805, Photovoltaic Panel Circuitry, filed Dec. 12, 2017.
U.S. Appl. No. 15/893,006, System and Method for Protection During Inverter Shutdown in Distributed Power Installations, filed Feb. 9, 2018.
U.S. Appl. No. 15/944,299, Battery Power Delivery Module, filed Apr. 3, 2018.
U.S. Appl. No. 15/952,037, Distributed Power Harvesting Systems Using DC Power Sources, filed Apr. 12, 2018.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
May 22, 1998—Cheng K.W.E., "New Generation of Switched Capacitor Converters", Department of Electrical Engineering, The Hong Kong Polytechnic University, Hung Hom, Hong Kong, Power Electronics Conference, PESC 98.
1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Nov. 27-30, 2007—Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
May 22, 1998—Chihchiang Hua and Chihming Shen, "Study of Maximum Power Tracking Techniques and Control of DC/DC Converters for Photovoltaic Power System", IEEE.
Tore Skjellnes et al., "Load sharing for parallel inverters without communication", Nordic Workshop in Power and Industrial Electronics, Aug. 12-14, 2002.
Jun. 23, 2000—Giorgio Spiazzi at el., "A New Family of Zero-Current-Switching Variable Frequency dc-dc Converters", IEEE.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids—state of the art and future trends", 3rd World Conference on Photovoltaic Energy Conversion, Osaka, Japan May 11-18, 2003.
Jul. 16-20, 2000—Nayar, C.V., abstract, Power Engineering Society Summer Meeting, 2000. IEEE, 2000, pp. 1280-1282 vol. 2.
Mar. 15, 2004—D. C. Martins et al., "Analysis of Utility Interactive Photovoltaic Generation System using a Single Power Static Inverter", Asian I Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http: jscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller for Medium to Large Scale Photovoltaic Generating Plant"8th European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Multiple-input DC-DC Converter" 20th International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.

(56) References Cited

OTHER PUBLICATIONS

Chihchiang Hua et al: "DSP-based controller application in battery storage of photovoltaic system" Industrial Electronics, Control, and Instrumentation, 1996, Proceedings of the 1996 IEEE IECON 22nd International Conference on Taipei, Taiwan Aug. 5-10, 1996, New York, NY, USA, IEEE, US, Aug. 5, 1996, pp. 1705-1710, XP010203239.

Hua C et al: "Implementation of a DSP-Controlled Photovoltaic System with Peak Power Tracking"IEEE Transactions on industrial Electronics, IEEE, Inc. New York, US, vol. 45, No. 1, Feb. 1, 1998, pp. 99-107, XP000735209.

I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK.

Basso, Tim, "IEEE Standard for Interconnecting Distributed Resources With the Electric Power System," IEEE PES Meeting, Jun. 9, 2004.

Feb. 11, 2003—Boostbuck.com, "The Four Boostbuck Topologies," located at http://www.boostbuck.com/TheFourTopologies.html.

Apr. 2002—Gautam, Nalin K. et al., "An Efficient Algorithm to Simulate the Electrical Performance of Solar Photovoltaic Arrays," Energy, vol. 27, No. 4, pp. 347-361, 2002.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Wiles, John, "Photovoltaic Power Systems and the National Electrical Code: Suggested Practices," Sandia National Laboratories, document No. SAND2001-0674, Mar. 2001.

Hewes, J. "Relays," located at http://web.archive.org/web/20030816010159/www.kpsec.freeuk.com/components/relay.htm, Aug. 16, 2003.

Jan. 1, 1993—Definition of "remove" from Webster's Third New International Dictionary, Unabridged, 1993.

Jan. 1 1993—Definition of "removable" from Webster's Third New International Dictionary, Unabridged, 1993.

Advanced Energy Group, "The Basics of Solar Power Systems," located at http://web.archive.org/web/20010331044156/http://www.solar4power.com/solar-power-basics.html, Mar. 31, 2001.

International Patent Application No. PCT/AU2005/001017, International Search Report and Written Opinion, dated Aug. 18, 2005.

Baek, Ju-Won et al., "High Boost Converter using Voltage Multiplier," 2005 IEEE Conference, IECON 05, pp. 567-572, Nov. 2005.

Wikimedia Foundation, Inc., "Electric Power Transmission," located at http://web.archive.org/web/20041210095723/en.wikipedia.org/wiki/Electric-power-transmission, Nov. 17, 2004.

Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.

Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.

Ciobotaru, et al., Control of single-stage single-phase PV inverter, Aug. 7, 2006.

International Search Report and Written Opinion for PCT/IB2007/004591 dated Jul. 5, 2010.

European Communication for EP07873361.5 dated Jul. 12, 2010.
European Communication for EP07874022.2 dated Oct. 18, 2010.
European Communication for EP07875148.4 dated Oct. 18, 2010.

Chen, et al., "A New Low-Stress Buck-Boost Converter for Universal-Input PFC Applications", IEEE Applied Power Electronics Conference, Feb. 2001, Colorado Power Electronics Center Publications.

Chen, et al., "Buck-Boost PWM Converters Having Two Independently Controlled Switches", IEEE Power Electronics Specialists Conference, Jun. 2001, Colorado Power Electronics Center Publications.

Esram, et al., "Comparison of Photovoltaic Array Maximum Power Point Tracking Techniques", IEEE Transactions on Energy Conversion, vol. 22, No. 2, Jun. 2007, pp. 439-449.

Walker, et al., "Photovoltaic DC-DC Module Integrated Converter for Novel Cascaded and Bypass Grid Connection Topologies—Design and Optimisation", 37th IEEE Power Electronics Specialists Conference, Jun. 18-22, 2006, Jeju, Korea.

Geoffrey R. Walker Affidavit re: U.S. Appl. No. 11/950,307, submitted in an IDS for U.S. Appl. No. 11/950,271 on Mar. 9, 2010.

Geoffrey R. Walker Affidavit re: U.S. Appl. No. 11/950,271, submitted in an IDS for U.S. Appl. No. 11/950,271 on Mar. 9, 2010.

International Search Report for PCT/IB2007/004610 dated Feb. 23, 2009.

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Kajihara, et al., "Model of Photovoltaic Cell Circuits Under Partial Shading", 2005 IEEE, pp. 866-870.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Chen, et al., "Predictive Digital Current Programmed Control", IEEE Transactions on Power Electronics, vol. 18, Issue 1, Jan. 2003.

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.

Alonso, "A New Distributed Converter Interface for PV Panels", 20th European Photovoltaic Solar Energy Conference, Jun. 6-10, 2005, Barcelona, Spain, pp. 2288-2291.

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.

Enslin, "Integrated Photovoltaic Maximum Power Point Tracking Converter", IEEE Transactions on Industrial Electronics, vol. 44, No. 6, Dec. 1997, pp. 769-773.

Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.

Jun. 20-25, 2004—Nikraz, "Digital Control of a Voltage Source Inverter in a Photovoltaic Applications", 2004 35th Annual IEEE Power Electronics Specialists Conference, Aachen, Germany, 2004, pp. 3266-3271.

Orduz, "Evaluation Test Results of a New Distributed MPPT Converter", 22nd European Photovoltaic Solar Energy Conference, Sep. 3-7, 2007, Milan, Italy.

Jun. 17-21, 2007—Palma, "A Modular Fuel Cell, Modular DC-DC Converter Concept for High Performance and Enhanced Reliability", IEEE 2007, pp. 2633-2638.

Sep. 16-19, 1996—Quaschning, "Cost Effectiveness of Shadow Tolerant Photovoltaic Systems", Berlin University of Technology, Institute of Electrical Energy Technology, Renewable Energy Section. EuroSun '96, pp. 819-824.

(56) References Cited

OTHER PUBLICATIONS

Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, 6-10, Jun. 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Oct. 3-7, 1999—Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Sep. 15-22, 2000—Stamenic, et al., "Maximum Power Point Tracking for Building Integrated Photovoltaic Ventilation Systems".
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18(3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and the National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
International Search Report for corresponding PCT/GB2004/001965, completed Aug. 16, 2004 by A. Roider.
Mar. 5-9, 1995—Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.

European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filing date May 27, 2004.
Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filing date May 27, 2004—dated Jan. 19, 2005.
Written Opinion of the International Searching Authority—PCT/US2004/016668, form PCT/ISA/220—filing date May 27, 2004—dated Jan. 19, 2005.
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. No. 13/785,857—dated Jun. 6, 2013.
European Office Action—EP Appl. 09725443.7—dated Aug. 18, 2015.
Definition of Isomorphism by Merriam-Webster, <http://www.merriaum-webster.com/dictionary/isomorphism, dated Oct. 20, 2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—Cn Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Nov. 2, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009,. In counteprart PCT/US2008/008451, 13 pages.
European Search Report: dated Jan. 10, 2013 in corresponding EP application No. 09838022.3, 7 pages.
D. Ton and W. Bower; Summary Report of the DOE High-Tech Inverter Workshop; Jan. 2005.
First Action Interview Pre-Interview Communication from U.S. Appl. No. 13/174,495 dated Jun. 18, 2014, 7 pgs.

(56) References Cited

OTHER PUBLICATIONS

Johnson et al., "Arc-fault detector algorithm evaluation method utilizing prerecorded arcing signatures", Photovoltaic Specialists Conference (PVSC), Jun. 2012.
Aug. 6, 2007—Philippe Welter, et al. "Electricity at 32 kHz," Photon International, The Photovoltaic Magazine, Http://www.photon-magazine.com/archiv/articles.aspx?criteria=4&HeftNr=0807 &Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al, "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"—"Let there be Darkness: Quality control of Solar Modules in Case of Fire"; Photon, May 2005, 75-77, ISSN 1430-5348, English translation provided.
Chinese Office Action—CN Appl. 201380029450.7—dated Jul. 28, 2016.
Jun. 6, 2018—EP Search Report EP App No. 18151594.1.
Jun. 29, 2018—EP Search Report—Ep App No. 18175980.4.
Sep. 4, 2019—Extended European Search Report—EP 19181247.8.
Aug. 6, 2019—Notice of Opposition of European Patent 2232663—Fronius International GmbH.
Sep. 5, 2019—Notice of Opposition of European Patent 2549635—Huawei Technologies Co.
Sep. 5, 2019—Notice of Opposition of European Patent 2549635—Fronius International GmbH.
Solide Arbeit, Heinz Neuenstein, Dec. 2007.
Spitzenwirkungsgrad mit drei Spitzen, Heinz Neuenstien and Andreas Schlumberger, Jan. 2007.
Technical Information, Temperature Derating for Sunny Boy, Sunny Mini Central, Sunny Tripower, Aug. 9, 2019.
Prinout from Energy Matters online Forum, Jul. 2011.
Wayback Machine Query for Energy Matters Online Forum Jul. 2011.
Jul. 12, 2019—European Search Report—EP 19170538.3.
May 10, 2019—Extended European Search Report—EP 18204177.2.
Apr. 20, 2020—European Search Report—EP 20151729.9.
Apr. 23, 2020—European Search Report—EP 19217486.0.
Nov. 27, 2019—European Search Report—3567562.
Baocheng, DC to AC Inverter with Improved One Cycle Control, 2003.
Brekken, Utility-Connected Power Converter for Maximizing Power Transfer From a Photovoltaic Source While Drawing Ripple-Free Current, 2002.
Cramer, Modulorientierter Stromrichter Geht In Serienfertigung , SPVSE, 1994.
Cramer, Modulorientierter Stromrichter, Juelich, Dec. 31, 1995.
Cramer, String-Wechselrichter Machen Solarstrom Billiger, Elektronik, Sep. 1996.
Dehbonei, A Combined Voltage Controlled and Current Controlled "Dual Converter" for a Weak Grid Connected Photovoltaic System with Battery Energy Storage, 2002.
Engler, Begleitende Untersuchungen zur Entwicklung eines Multi-String-Wechselrichters, SPVSE, Mar. 2002.
Geipel, Untersuchungen zur Entwicklung modulorientierter Stromrichter Modulorientierter Stromrichter für netzgekoppelte Photovoltaik-Anlagen, SPVSE, 1995.
Hoor, DSP-Based Stable Control Loops Design for a Single Stage Inverter, 2006.
Isoda, Battery Charging Characteristics in Small Scaled Photovoltaic System Using Resonant DC-DC Converter With Electric Isolation, 1990.
Jones, Communication Over Aircraft Power lines, Dec. 2006/Jan. 2007.
Kalaivani, A Novel Control Strategy for the Boost DC-AC Inverter, 2006.
Lee, Powering the Dream, IET Computing & Control Engineering, Dec. 2006/Jan. 2007.
Lee, A Novel Topology for Photovoltaic Series Connected DC/DC Converter with High Efficiency Under Wide Load Range, Jun. 2007.
Lin, LLC DC/DC Resonant Converter with PLL Control Scheme, 2007.
Niebauer, Solarenergie Optimal Nutzen, Stromversorgung, Elektronik, 1996.
Rodrigues, Experimental Study of Switched Modular Series Connected DC-DC Converters, 2001.
Sanchis, Buck-Boost DC-AC Inverter: Proposal for a New Control Strategy, 2004.
Sen, A New DC-To-AC Inverter With Dynamic Robust Performance, 1998.
Shaojun, Research on a Novel Inverter Based on DC/DC Converter Topology, 2003.
Siri, Sequentially Controlled Distributed Solar-Array Power System with Maximum Power Tracking, 2004.
Walko, Poised for Power, IEE Power Engineer, Feb./Mar. 2005.
White, Electrical Isolation Requirements in Power-Over-Ethernet (PoE) Power Sourcing Equipment (PSE), 2006.
Yu, Power Conversion and Control Methods for Renewable Energy Sources, May 2005.
Zacharias, Modularisierung in der PV-Systemtechnik-Schnittstellen zur Standardisierung der Komponenten, Institut für Solare Energieversorgungstechnik (ISET), 1996.
Dec. 24, 2019—CN Office Action—CN Application 201610946835.5.
Jan. 30, 2020—EP Office Action—EP 18204177.2.
Feb. 3, 2020—Chinese Office Action—201710749388.9.
Mar. 24—Non-Final Rejection—U.S. Appl. No. 15/593,761.
Jul. 8, 2020—CN Office Action—CN 201710362679.2.
May 12, 2020—Extended European Search Report—EP 20161381.7.

* cited by examiner ized or continued based on the comparison of the first
THEFT DETECTION AND PREVENTION IN A POWER GENERATION SYSTEM

CROSS REFERENCE TO RELATED APPLICATIONS

The present application is a continuation of and claims priority to U.S. patent application Ser. No. 14/582,363 filed Dec. 24, 2014, now U.S. Pat. No. 9,869,701, which is a continuation of U.S. patent application Ser. No. 12/788,066 filed May 26, 2010, now U.S. Pat. No. 8,947,194, and entitled "THEFT DETECTION AND PREVENTION IN A POWER GENERATION SYSTEM," which claims priority to U.S. patent application No. 61/180,940 filed May 26, 2009, the disclosure of which is incorporated by reference herein in its entirety.

FIELD AND BACKGROUND

1. Field

The present invention is related to power generation systems, and specifically to theft detection and prevention of components of photovoltaic power generation systems.

2. Related Art

A photovoltaic power generation system incorporates one or more photovoltaic panels typically mounted on a roof of a building. An inverter located inside the building connects to the photovoltaic panels. The power output from the photovoltaic panels is direct current (DC) power. The inverter converts the direct current power to alternating current (AC) power.

The use of photovoltaic panel based power generation systems are attractive from an environmental point of view. However, the cost of photovoltaic panels and their relative ease of theft, might limit their adoption for use in power generation systems. There is therefore a need for methods and systems for theft detection and prevention of photovoltaic panels.

The term "memory" as used herein refers to one or more of read only memory (PROM), erasable programmable read only memory (EPROM), electrically erasable programmable read only memory (EEPROM), FLASH memory, optical memory, e.g. compact disk, switches, random access memory (RAM), magnetic memory such as a hard disk or other memory types known in the art of A hash function is a transformation that takes an input and returns a fixed-size string or a numeric value, which is called the hash value. The term "hash" as used herein refers to the hash value output of the transformation.

The term "pairing or paired" as used herein refers to at least two power generation system components such as an inverter, photovoltaic panels and/or electronic modules for example which are "paired" or associated with each other. "Pairing" establishes a unique association between for example an inverter (as opposed to other inverters in a power generation system) and a particular set of photovoltaic panels and/or electronic modules. The "pairing" between power generation components such as an inverter, photovoltaic panel and/or electronic module is typically performed via assignment codes/re-hash of codes, signals or permanently attaching additional hardware to each power generation component and each power generation component being aware of the codes/re-hash of codes, signals or permanently attached additional hardware of other power generation components as part and parcel of a "pairing" process. The "pairing" process may take place at the time manufacture of power generation system components, during installation of a power generation system and/or during the operation of the power generation system. The codes/re-hash of codes, signals or permanently attached additional hardware assigned to power generation system components, typically establishes the electrical connections, topographic location, continued presence/absence, numbers, types of power generation system components within a power generation system.

The terms "sensing" and "measuring" as used herein are used interchangeably.

The term "direct current (DC) power source" as used herein refers to (DC) power source such as batteries, DC motor generator; switch mode power supply (SMPS), photovoltaic panels and/or photovoltaic panels operatively attached to a converter module such as a DC to DC converter.

The term "photovoltaic source" as used herein refers to a photovoltaic panel and/or a photovoltaic panel operatively attached to a converter module such as a DC to DC converter.

The term "central unit" as used herein refers to a load such as an inverter or an element such as a control circuit attached directly to the load or in the immediate vicinity of the load.

BRIEF SUMMARY

According to an aspect of the present invention there is provided a method for preventing theft of components from a system for generating electrical power. The system includes an inverter connected to a photovoltaic source. A first memory is permanently attached to the photovoltaic source. A microprocessor and a second memory are attached to the inverter. A first code is written in the first memory and a second code is stored in the second memory based on the first code. The second code is preferably either a copy or a hash of the first code. The writing of the first code and/or the storing of the second code is preferably performed during installation of the system. The writing of the first code and/or the storing of the second code is optionally performed by a remote server attached to the system. After the first code is read and stored in the first memory, and the second code is read and stored in the second memory during the electrical power generation, the first code is compared with the second code or its hash. Power conversion and/or inversion is initialized or continued based on the comparison of the first code with the second code. The reading of the first and second codes and the comparison are preferably performed by the microprocessor. Alternatively, a remote server operatively attached to the microprocessor receives the first code and the second code. The remote server stores in remote storage attached to the remote server either copies of the first code and the second code or a hash based on the first code and the second code. Prior to initializing/continuing power conversion operation of the inverter, the remote server receives the first and second codes. The remote server compares the first and second codes to the copies/hash previously stored. If the comparison is correct, (for instance the codes correspond) then power conversion by the inverter is allowed. Optionally, the first code or the second code or portion thereof is generated by a global positioning system module which bases the first code or the second code on the global coordinates of the photovoltaic source or the inverter.

According to another aspect of the present invention there is provided a method for preventing theft of a system for generating electrical power. The system includes an inverter connected to a photovoltaic source. A first memory is permanently attached to the photovoltaic source. A second memory is attached to the inverter. A first code is written in the first memory and a second code is stored in the second memory based on the first code. The second code is preferably either a copy or a hash of the first code.

The writing of the first code and/or the storing of the second code is preferably performed during installation of the system. The first code and the second code are compared preferably during or prior to the electrical power generation. The comparison may be performed by a processor either a first processor attached to the photovoltaic source and configured to address the first memory, a second processor attached to the inverter configured to address the second memory and/or a remote server attached to either the first processor or the second processor over a wide area network. Based on the comparison, either the power conversion of the inverter is disabled or the electrical power output of the photovoltaic source to the inverter is disabled. The first code or the second code of respective portions thereof may be based on global coordinates.

According to another aspect of the present invention there is provided a system for generation of electrical power including an inverter connected to a photovoltaic source having a theft prevention and detection feature. A first memory is permanently attached to the photovoltaic source. The first memory is configured to store a first code. A second memory is attached to the inverter. The second memory configured to store a second code. During manufacture or installation of the system, the first code is stored in the first memory attached to the photovoltaic source. The second code based on the first code is stored in the second memory. Prior to operation of the inverter, the first code is compared to the second code and based on the comparison. The generation of the electrical power may be enabled or disabled. The comparison is performed by a processor: a first processor attached to the photovoltaic source addressing the first memory, a second processor attached to the inverter addressing the second memory and/or a remote server attached to selectably either the first processor or the second processor over a wide area network. The system optionally includes a global position module located at the site of the inverter or the site of the panel The first code or the second code is based on global coordinates generated by the global position module.

According to another aspect of the present invention there is provided a theft detection device in a system for generating electrical power, the system including a direct current (DC) power source and a load connectable to the DC power source with a DC power line. The theft prevention device has an alternating current (AC) source operatively attached between the load and the DC power source. The AC source is preferably adapted for superimposing an AC current onto the DC power line. A receiver located in vicinity of the alternating current (AC) source. An impedance probe operatively attached to the DC power line. The impedance probe is adapted for sensing impedance responsive to the AC current. A rectifier may be adapted to rectify the AC current to supply power to the impedance probe. A reactive component a capacitor and/or an inductor may be configured to increase impedance sensed by the impedance probe. The impedance probe may include a voltage probe and a current probe, an energy storage device, a memory adapted to store an impedance datum and/or a transmitter which is adapted to transmit the impedance datum. A potential theft of a component of the system is alerted which is responsive to a change in the impedance greater than a previously determined threshold.

According to the present invention there is provided a method for theft detection in a system for generation of electrical power, the system including a DC power line. An alternating current (AC) is applied to the DC power line from an alternating current (AC) source and an impedance component of the system is sensed. The impedance is responsive to the applied alternating current (AC). An impedance datum proportional to the impedance is stored with the impedance datum transmitted to a receiver. Electrical charge is stored to power the sensing when the system is not generating electrical power. The sensing includes measuring voltage and current of the alternating current (AC) source. A potential theft of a component of the system is alerted which is responsive to a change in the impedance greater than a previously determined threshold or upon not receiving an expected transmission of the impedance datum.

According to another aspect of the present invention there is provided a theft detection device in a system for generating electrical power. The system includes a direct current (DC) power source with DC outputs. The DC outputs are connectable to a load with a DC power line. The theft prevention device has an impedance probe connectable to the DC outputs and the DC power line. The impedance probe includes a transmitter configured to transmit a probe signal. A receiver module is operatively attached to the direct current (DC) power source and said load. The receiver module includes a receiver configured to receive the probe signal. The probe signal may include data encoded using power line communications. A module is operatively attached to the direct current (DC) power source and the load. The module includes a receiver configured to receive the probe signal and/or the data. The impedance probe may include a voltage probe and a current probe, energy storage device and/or memory adapted to store an impedance datum.

According to another aspect of the present invention there is provided a method for theft detection in a system for generation of electrical power. The system includes a direct current (DC) power source. An impedance of the DC power source is measured from which an impedance datum is stored which is proportional to the impedance. The impedance datum is transmitted and received. The impedance datum is compared with a previously stored datum and a potential theft of DC power source responsive to the comparison is alerted. The measured impedance may include measured voltage and current of the DC power source. Electrical energy may be stored for supplying power for the measuring of impedance and for supplying power for the receiving of impedance datum. According to another aspect of the present invention there is provided a theft detection device in a distributed electrical power generation system including a direct current (DC) power source connected to an electronic module with DC outputs. The DC outputs are connectable to a load with a DC power line. A central impedance probe is connectable to the DC power line. The central impedance probe includes a impedance sensing module adapted for sensing impedance of the DC power source. An electronic module may include a bypass switch adapted to present impedance of said photovoltaic panel to said central impedance probe.

According to another aspect of the present invention there is provided a theft detection method of theft protection in a distributed electrical power generation system including a direct current (DC) power source with DC outputs. The DC outputs are connectable to a load with a DC power line. A central impedance unit is connected to the DC power line. A probe signal is transmitted on the DC power line and impedance is sensed responsive to said probe signal. The sensed impedance is compared to a previously stored impedance value of the direct current (DC) power source, and an alert may be performed based on the comparison of impedance values. The probe signal may be an AC power feed, a power line communication signal or a dedicated signal for the impedance measurement. The electronic module may be bypassed to present impedance of the power source, e.g. photovoltaic panel, to the central impedance probe.

According to another aspect of the present invention there is provided a theft detection device in a photovoltaic system for generating electrical power. The theft detection device has an electronic module attached to a photovoltaic source. An image sensor is preferably adapted for capturing images of the photovoltaic source. A central controller is adapted to provide a signal to the electronic module. A thermal property of the photovoltaic source changes which is responsive to the signal. A load is preferably connected to the electronic module and the load is typically an inverter. The image sensor is a thermal image sensor. The electronic module may include a receiver, direct current (DC) to DC converter or a DC to alternating current (AC) converter.

According to another aspect of the present invention there is provided a method for theft detection in a system for generation electrical power, the system including an electronic module attached to a photovoltaic source. The electronic module is signaled whereupon after receiving the signaling, the photovoltaic source is reverse biased, thereby causing increased heat dissipation in the photovoltaic source. Image frames are captured of the photovoltaic source and the image frames are analyzed for thermal changes responsive to the signaling. The presence of the photovoltaic source is ascertained based on the analyzing of the image frames and potential theft is alerted of the photovoltaic source based on the ascertaining. The signaling typically causes the electronic module to reverse bias the photovoltaic source.

According to another aspect of the present invention there is provided a theft detection device in a system for generating electrical power, the system including an inverter connected to a photovoltaic source, the theft detection device has a transmitter attached to the photovoltaic source. The transmitter adapted for transmitting a signal and a receiver is adapted for receiving the signal. The transmitter may be adapted to store electrical charge.

According to another aspect of the present invention there is provided a method for theft detection in a system for generation electrical power, the system including an inverter connected to and receiving power from a photovoltaic source, a transmitter operatively attached to the photovoltaic source and a receiver. A signal is transmitted from the transmitter. The signal is monitored and upon an absence of the signal being sensed a potential theft of the photovoltaic source is alerted or alarmed.

According to another aspect of the present invention there is provided a theft detection device in a system for generating electrical power, the system including an inverter connected to a photovoltaic source. The theft prevention device has a transmitter attached to the photovoltaic source and the transmitter is adapted for transmitting a signal. A receiver attached to the photovoltaic source is adapted for receiving the signal and a controller is operatively attached to the receiver and the transmitter.

According to another aspect of the present invention there is provided a method for theft detection in a system for generating electrical power, the system including an inverter connected to a photovoltaic source, a transmitter and receiver attached to the photovoltaic source. The signal strength of the transmitter is measured using the receiver and an object in vicinity of the photovoltaic source is detected by virtue of change in the measuring. A potential theft of the photovoltaic source is alerted based on the detecting;

According to another aspect of the present invention there is provided a theft detection device in a system for generating electrical power, the system including an inverter connected to a photovoltaic source, the theft detection device has a sensor measuring electric field strength of the photovoltaic source and a controller operatively attached to the sensor.

According to another aspect of the present invention there is provided a method for theft detection in a system for generating electrical power, the system including an inverter connected to a photovoltaic source, a sensor operatively attached to the photovoltaic source and a controller operatively attached to the sensor. The electric field of the photovoltaic source is measured using the sensor. The measuring is adapted to indicate a change in threshold of the electric field. An object in vicinity of the photovoltaic source is detected by virtue of change in threshold of the electric field. Potential theft of the photovoltaic source is alerted using the controller.

According to another aspect of the present invention there is provided a theft detection device in a system for generating electrical power, the system including a photovoltaic string and a load connectable to the photovoltaic string with a DC power line, the theft prevention device has a central control unit operatively attached between the load and the photovoltaic string. The central control unit is adapted for superimposing a control signal and a test signal onto the DC power line. A switch unit operatively attached to the photovoltaic string. The switch unit is adapted for receiving the control signal and the test signal.

According to another aspect of the present invention there is provided a method for theft detection in a system for generation electrical power, the system including a photovoltaic source and a load connectable to the photovoltaic source with a DC power line, a central control unit operatively attached between the load and the photovoltaic source and a switch unit with a resonant circuit, the switch unit operatively attached to the photovoltaic source. A first control signal from the central control unit is superimposed onto the DC line. The resonant circuit is connected to the photovoltaic source. The resonant circuit is responsive to the control signal. A second control signal from the central control unit is superimposed onto the DC line. A reflected signal responsive to the second superimposing is sensed. The test signal is a time domain reflectometry (TDR) signal or a frequency domain reflectometry (FDR) signal. The sensing may be in terms of sensing phase shift of the reflected signal, sensing frequency shift of the reflected signal and/or sensing amplitude change of the reflected signal.

According to another aspect of the present invention there is provided a theft detection device in a system for generating electrical power. The device includes multiple electronic modules attached to multiple photovoltaic sources. At least one of the electronic modules is adapted for constructing a confirmation signal. A central control unit is operatively attached to at least one of the electronic modules. The central control unit is adapted for sending a signal to the at least one electronic module and for receiving the confirmation signal. The confirmation signal typically includes information that the at least one electronic module collects from other electronic modules in the immediate vicinity of the at least one electronic module. The central control unit may alert of potential theft based on the confirmation signal.

According to another aspect of the present invention there is provided a method of theft detection in a system for generation electrical power. The system includes multiple photovoltaic sources, and multiple electronic modules attached to the photovoltaic sources and a central control unit. The central control unit is operatively attached to the electronic modules. A signal is sent from the central control unit to at least one of the electronic modules. The at least one electronic module is adapted for constructing a confirmation signal which is sent to the central controller in response. The constructed confirmation signal typically includes information that the at least one electronic module collects from other electronic modules in the immediate vicinity of the at least one electronic module. The confirmation signal is based on or includes data collected from the electronic modules connected in a mesh network. The data is received at the central control unit. The confirmation signal may be decoded and the decoded data are compared with a look up table stored at the central control unit. Potential theft of one of the photovoltaic sources may be alerted by the central control unit.

The foregoing and/or other aspects will become apparent from the following detailed description when considered in conjunction with the accompanying drawing figures.

BRIEF DESCRIPTION OF THE DRAWINGS

The invention is herein described, by way of example only, with reference to the accompanying drawings, wherein:

FIG. 1b illustrates in more detail a communications module and a memory of the power generation system of FIG. 1a;

FIGS. 1l and 1m illustrate a process flow of a method for theft prevention of the electrical power generation system of FIG. 1k;

DETAILED DESCRIPTION

Figure 1A:
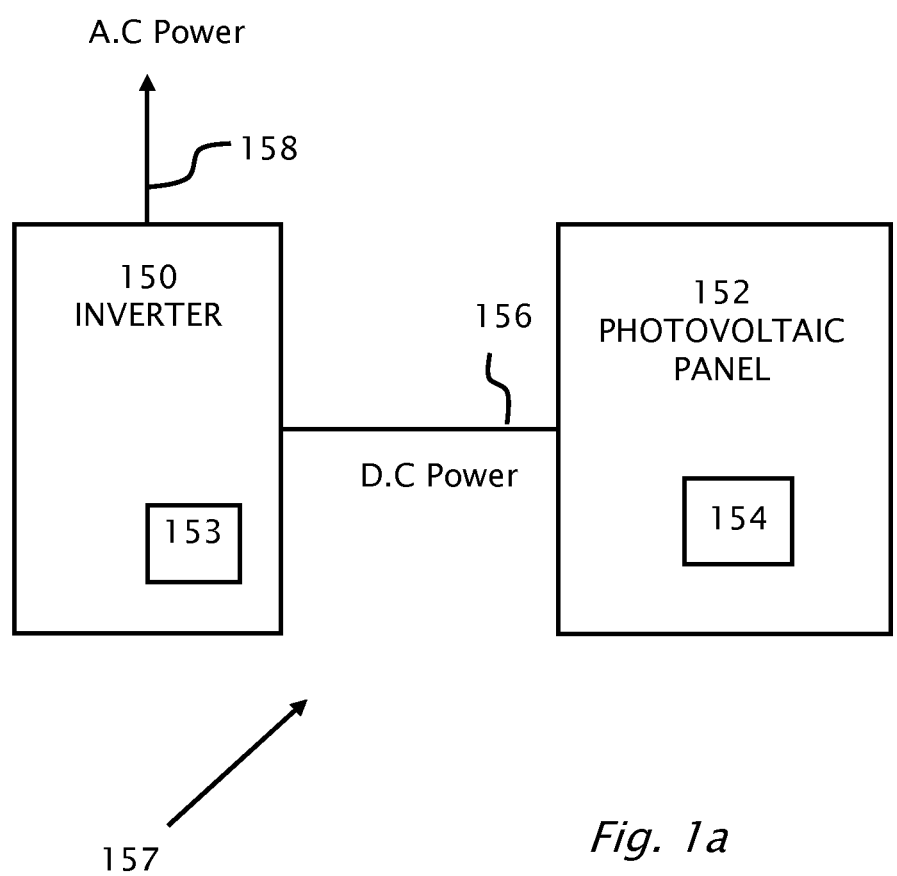
FIG. 1a illustrates an electrical power generation system including a theft prevention feature according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

Code Storage

Referring now to the drawings, FIG. 1a illustrates an electrical power generation system 157 including a theft prevention feature according to an embodiment of the present invention. System 157 includes one or more photovoltaic panels 152 connected to an inverter 150 by a direct current (DC) power cable 156. During operation of electrical power generation system 157, DC power is produced by photovoltaic panel 152 and transferred to the input of inverter 150 via DC cable 156. Inverter 150 converts the DC power at its input to AC power at inverter 150 output 158. A memory module 154 is permanently attached to photovoltaic panel 152. A communication module 153 is attached to inverter 150. The term "permanently attached" as used herein refers to a method or device for attachment such that physical removal or attempt thereof, e.g. of memory module 154 from photovoltaic panel 152, would likely result in damage, e.g. to module 154 and/or panel 152. Typically, during manufacture of the photovoltaic (PV) panel 152 and/or inverter 150, modules 154, 153 are "permanently attached" respectively to photovoltaic panel 152 and/or inverter 150. For example, when module 154 is permanently attached to the photovoltaic panel 152, the operation of photovoltaic panel 152 ceases or connections thereof are broken on attempting to remove module 154 from photovoltaic panel 152. Any mechanism known in the art for "permanently attaching" may be applied in different embodiments of the present invention. One such mechanism for permanently attaching uses a thermoset adhesive, e.g. epoxy based resin, and hardener.

Figure 1B:
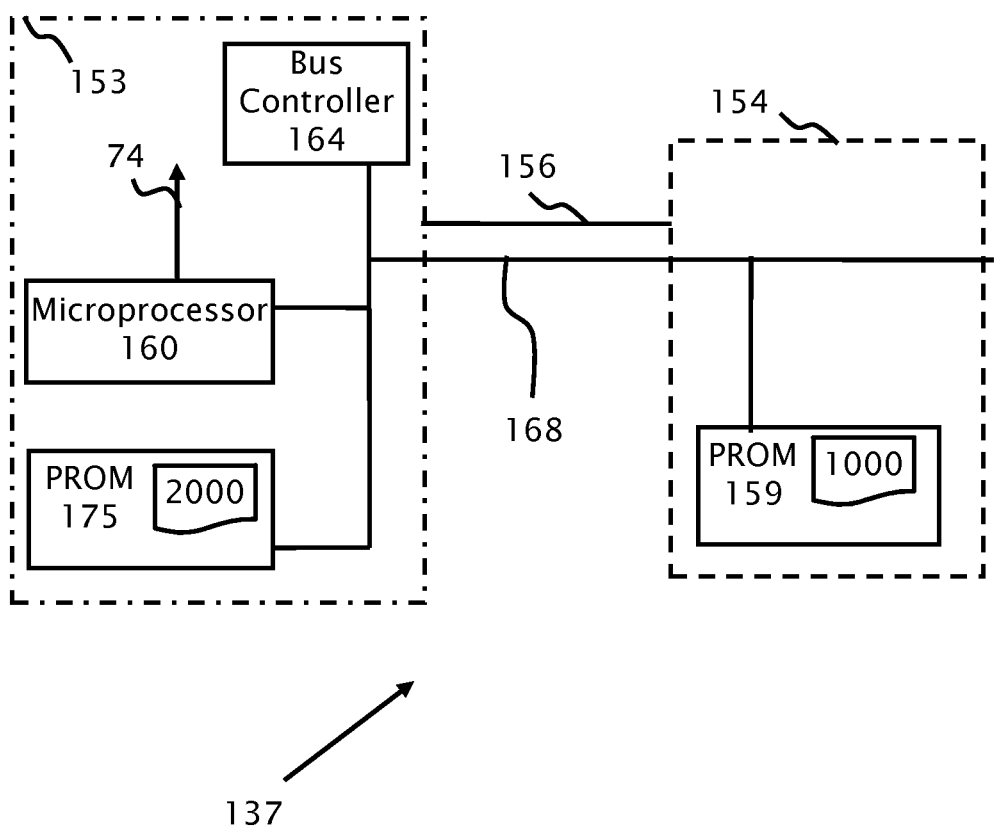

Reference is now also made to FIG. 1b, which illustrates in more detail 137 communications module 153 and memory module 154 of system 157. A communications cable 168 connects memory module 154 to communications module 153. Power cable 156 which transfers DC power from photovoltaic panel 152 to the input of inverter 150, is optionally a multi-core cable 156/168. At least two wires of the multi-core cable 156/168 preferably are used for communication cable 168. If a long distance, separates inverter 150 from photovoltaic panel 154 communication cable 168 is preferably a twisted pair cable. Alternatively, communications are superimposed on DC power line 156, i.e. power line communications. Alternatively, radio frequency wireless communication may be used either centrally from inverter to power sources or a mesh network may be used. Communication module 153 attached to inverter 150 preferably includes a bus controller 164 (e.g. Cyclone™1C3, i²c bus controller, Altera, 101 San Jose Calif. 95134) which controls communications over cable 168. Bus controller 164 is preferably connected to a microprocessor 160. A memory 175, is preferably connected to both bus controller 164 and microprocessor 160. Microprocessor 160 preferably outputs a signal 174, which is used to allow/disallow the operation of inverter 150 for converting DC power to AC power. Memory module 154 which is permanently attached to photovoltaic panel 152 includes a memory 159. Memory 159 is connected to bus controller 164 in communication module 153 by communication cable 168. Memory 159 stores a code 1000. Memory 175 stores a code 2000.

Figure 1C:
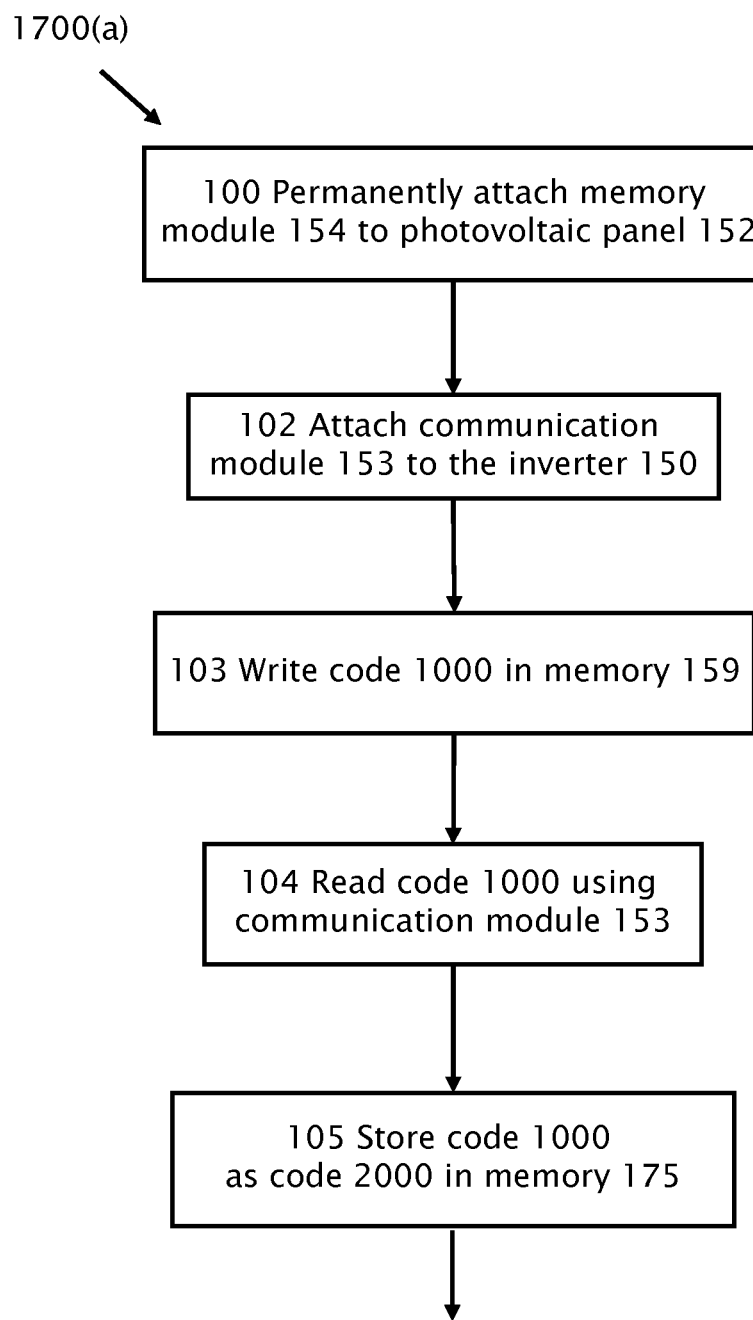
FIGS. 1c and 1d illustrate a process flow of a method for theft prevention, according to embodiments of the present invention.
Figure 1D:
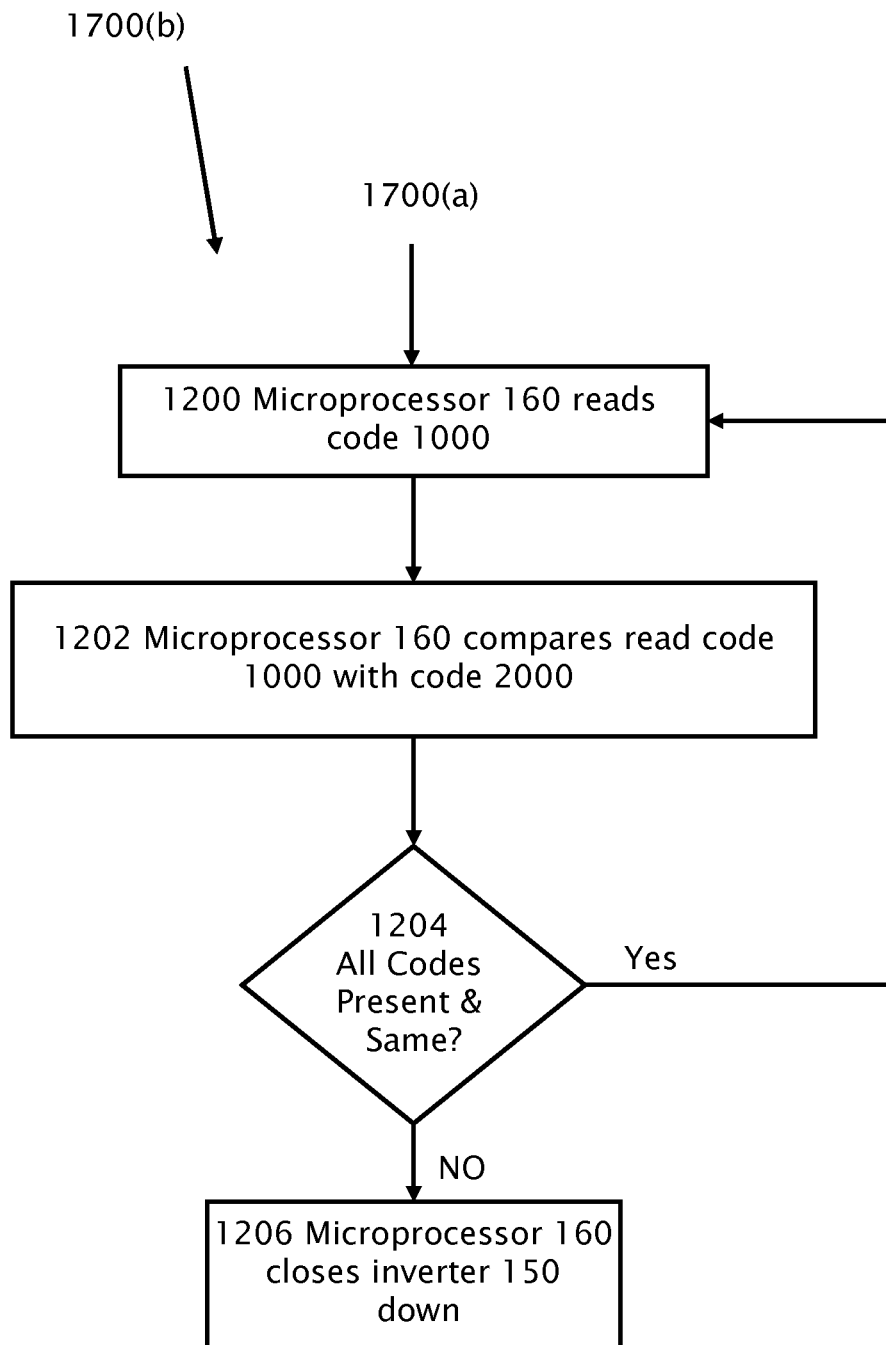

Reference is now also made to FIGS. 1c and 1d which show a process flow of a method 1700 for theft prevention which illustrates pairing in electrical power generation system 157, according to an embodiment of the present invention. Typically, during manufacture, memory module 154 is permanently attached (step 100) to photovoltaic panel 152. In step 102, communication module 153 is attached to inverter 150. Although steps 100 and 102 are typically performed during manufacture/assembly of photovoltaic panel 152 and/or inverter 150, steps 100 and 102 may be performed as a retrofit or during installation. In step 103, code 1000 is written in memory 159 during manufacture of photovoltaic panel 152 or during installation of photovoltaic panel 152. Communication module 153 reads (step 104) code 1000 using bus controller 164 and microprocessor 160. Microprocessor 160 stores (step 105) a copy or hash of code 1000 read in step 104 into code 2000 in memory 175. Although, method steps 103, 104 and 105 are typically performed during installation of photovoltaic panel 152 and inverter 150, steps 103, 104 and 105 may be performed during manufacture/assembly of photovoltaic panel 152 and/or of inverter 150. Method 1700 continues in FIG. 1d as sub-process 1700(b) performed typical during power generation operation of system 157. Microprocessor 160 reads (step 1200) code 1000 in memory module 154. In step 1202, microprocessor 160 compares code 1000 with code 2000 previously stored in communication module 153 and memory module 175. In decision box, 1204 if codes 1000 and 2000 are the same or otherwise correctly compare then output 174 is set by microprocessor 160 to allow the power conversion of DC to AC of inverter 150 and anti-theft process 1700 continues at step 1200. Otherwise power conversion DC/AC of inverter 150 is disabled (step 1206) by microprocessor 160 using output 174.

Figure 1E:
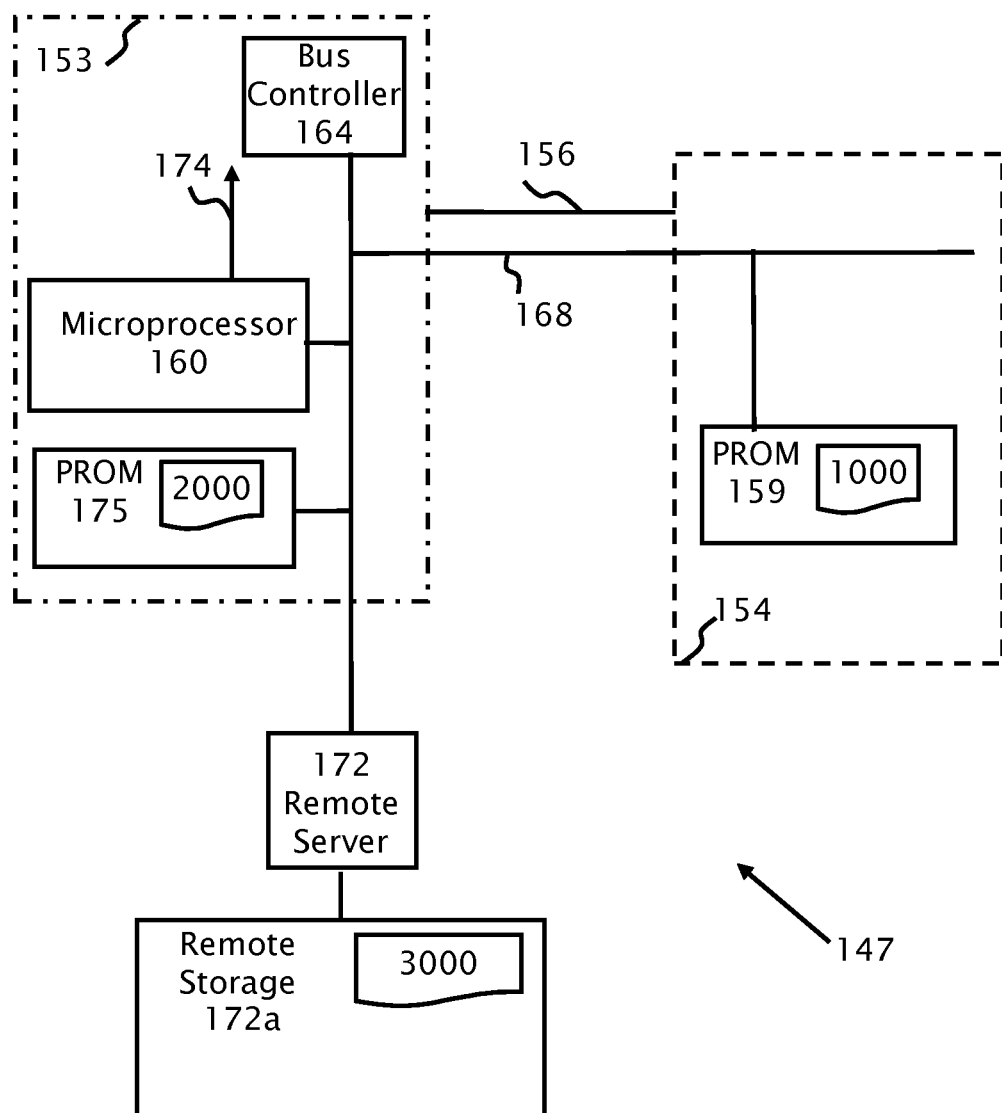
FIG. 1e illustrates an electrical power generation system with a theft prevention feature, according to another embodiment of the present invention.

Reference is made to FIG. 1e which illustrates another embodiment of the present invention, photovoltaic system 147 with a theft prevention feature. Memory module 154 is permanently attached to photovoltaic panel 152 (not shown in FIG. 1e). Memory module 154 includes memory 159 for storing code 1000. Memory 159 is connected to bus controller 164 in communication module 153 by communication cable 168. Communication module 153 is attached to inverter 150 (not shown in FIG. 1e). Bus controller 164 is connected to microprocessor 160 and memory 175 for storing code 2000. A remote server 172 is connected to microprocessor 160 by bus 168 or by a dedicated WAN interface (not shown). Remote server 172 is connected to a remote storage 172a. Remote storage 172a preferably stores copies or hashes of codes 1000 and 2000. Microprocessor 160 has output signal 174, which is activated by remote server 172 to allow the operation of inverter 150 to convert DC Power to AC power.

Figure 1F:
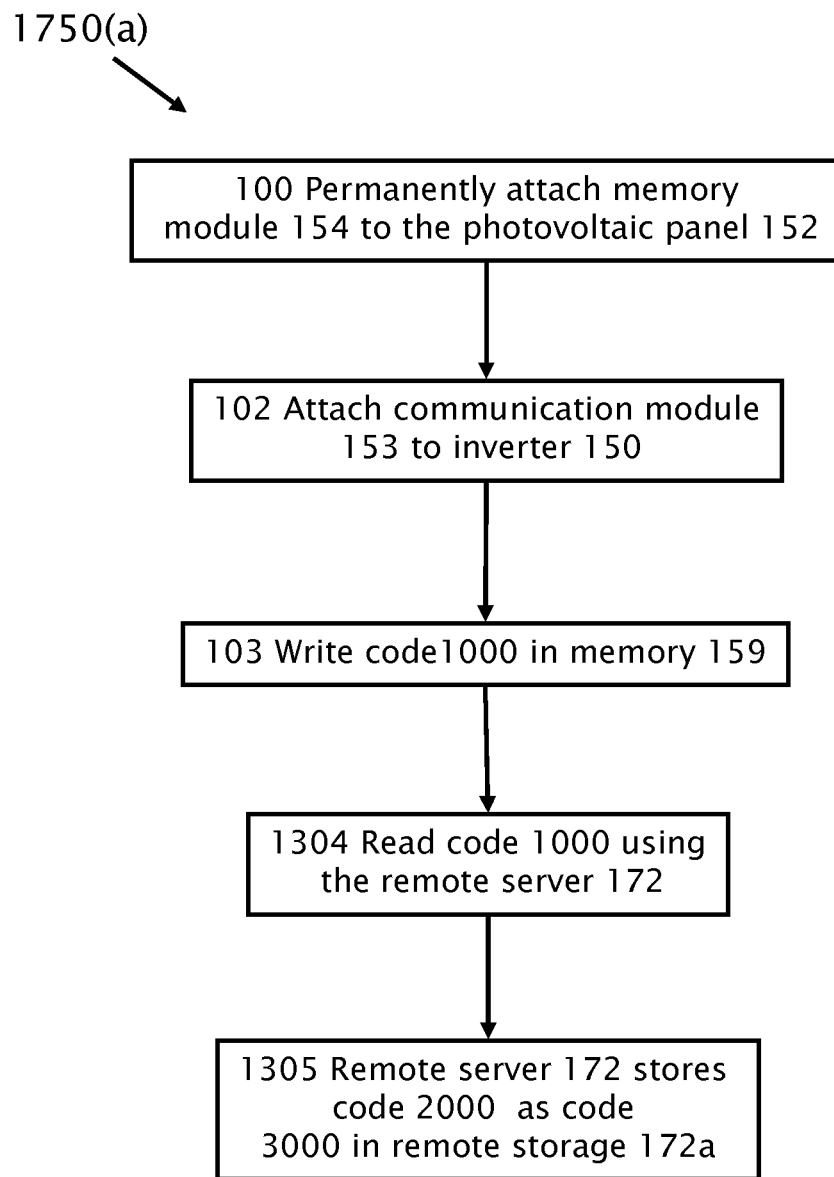
FIGS. 1f and 1g illustrate a process flow of a method for theft prevention of in the system of FIG. 1e.
Figure 1G:
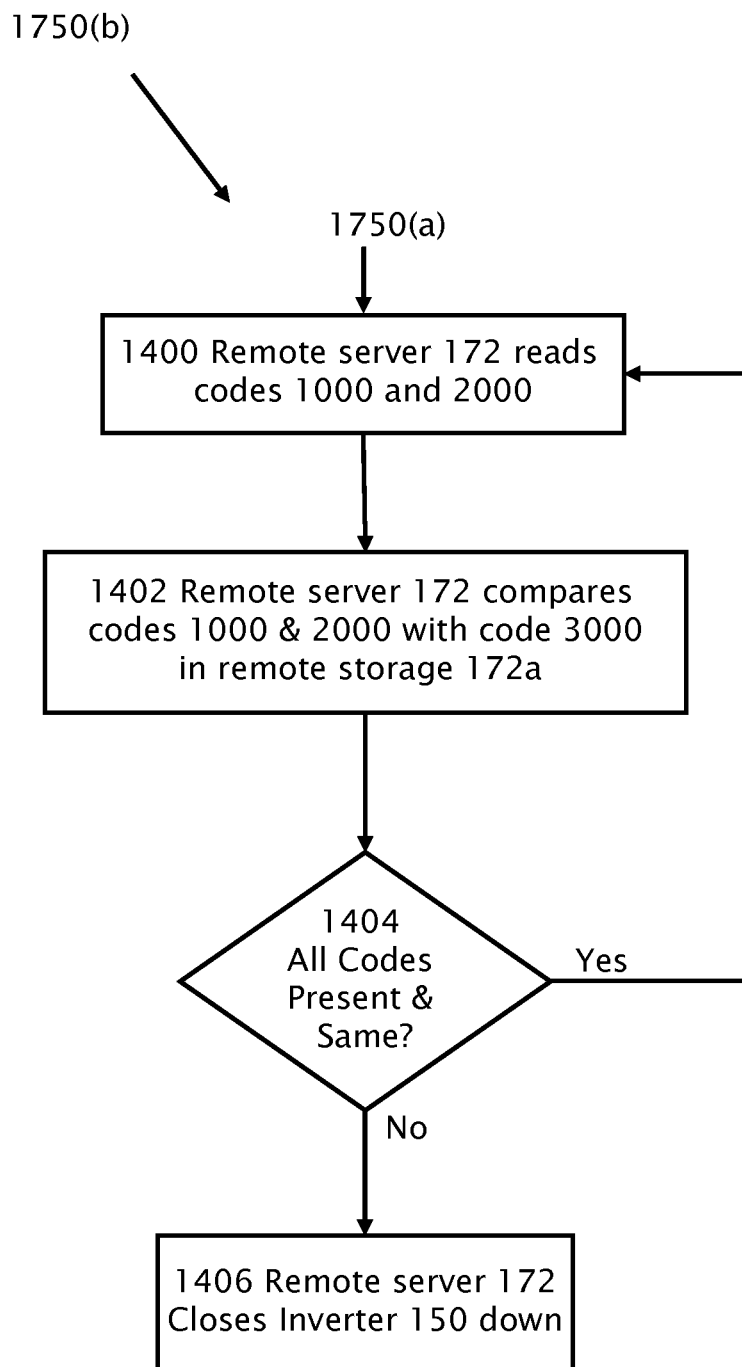

Reference is now also made to FIGS. 1f and 1g which illustrate process flow of a method 7150 for theft prevention of electrical power generation system 147 (of FIG. 1e) according to an embodiment of the present invention using. In step 100, memory module 154 is permanently attached to photovoltaic panel 152. In step 102 communication module 153 is attached to inverter 150. In step 103, code 1000 is written in memory 159 during manufacture of photovoltaic panel 152 or during installation of photovoltaic panel 152. Remote server 172 reads (step 1304) code 1000 preferably using bus controller 164. Remote server 172 stores (step 1305) copies or hashes of code 1000 and code 2000 as code 3000 at remote storage 172a. Method steps 103, 1304 and 1305 are typically performed during installation of photovoltaic panel 152 and inverter 150. Method 7150 continues in FIG. 1g as sub-process 7150(b) during which steps 1400, 1402, 1404 and 1406 are performed during the power generation operation of system 147. To protect against theft during operation, remote server 172 reads codes 1000 and 2000 (step 1400). In step 1402, remote server 172 compares the code reads in step 1400 with code 3000 in remote storage 172a. In step 1404 if codes (1000, 2000) and 3000 are the same or when code 3000 is a hash of codes 1000 and 2000, and code 3000 compares correctly with codes 1000 and 2000, then output 174 of microprocessor 160 activated via remote server 172, allows the power conversion of DC to AC of inverter 150 and operation continues at step 1400. Otherwise, remote server 172 does not allow inverter 150 to convert DC power to AC power (step 1406).

Figure 1H:
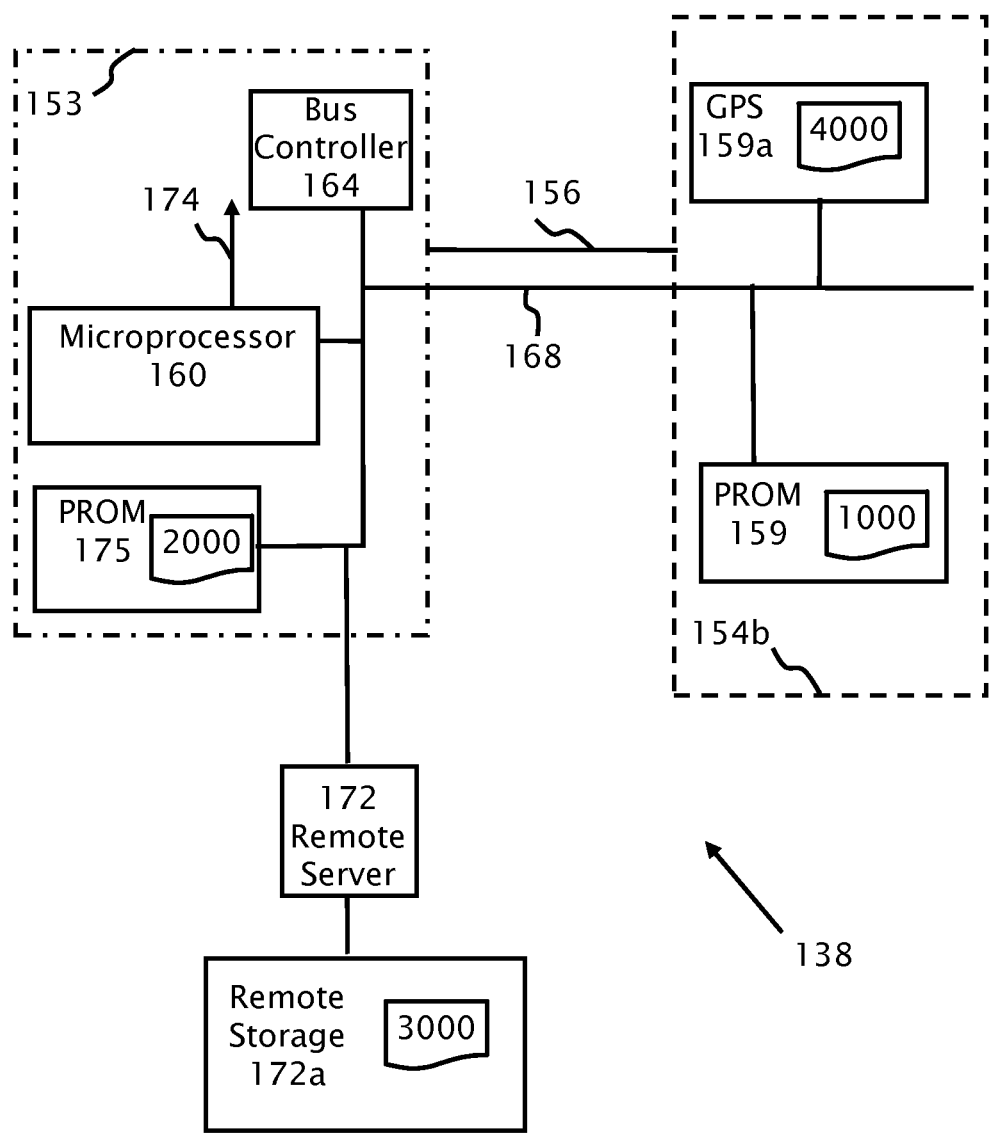
FIG. 1h illustrates an electrical power generation system, according to yet another embodiment of the present invention.

Reference is made to FIG. 1h of a system 138, according to another embodiment of the present invention for theft prevention of photovoltaic system 157. Communication module 153 is attached to inverter 150 (not shown) and contains bus controller 164 connected to a microprocessor 160 and memory 175 having a code 2000. Connected to bus controller 164 is remote server 172. Remote server 172 is connected to remote storage 172a. Microprocessor 160 has output signal 174, which is activated by remote server 172 to allow the operation of inverter 150 to convert DC Power to AC power. Memory module 154b permanently attached to photovoltaic panel 154b includes memory 159 (e.g. EPROM, EEPROM or FLASH), having a code 1000 and a Global Position System (GPS) module 159a having a code 4000. Code 4000 is based on global coordinates of photovoltaic panel 152 during installation of panel 152. Memory 159 and GPS module 159a are preferably connected to microprocessor 160 by bus controller 164 in communication module 153 by communication cable 168.

Figure 1I:
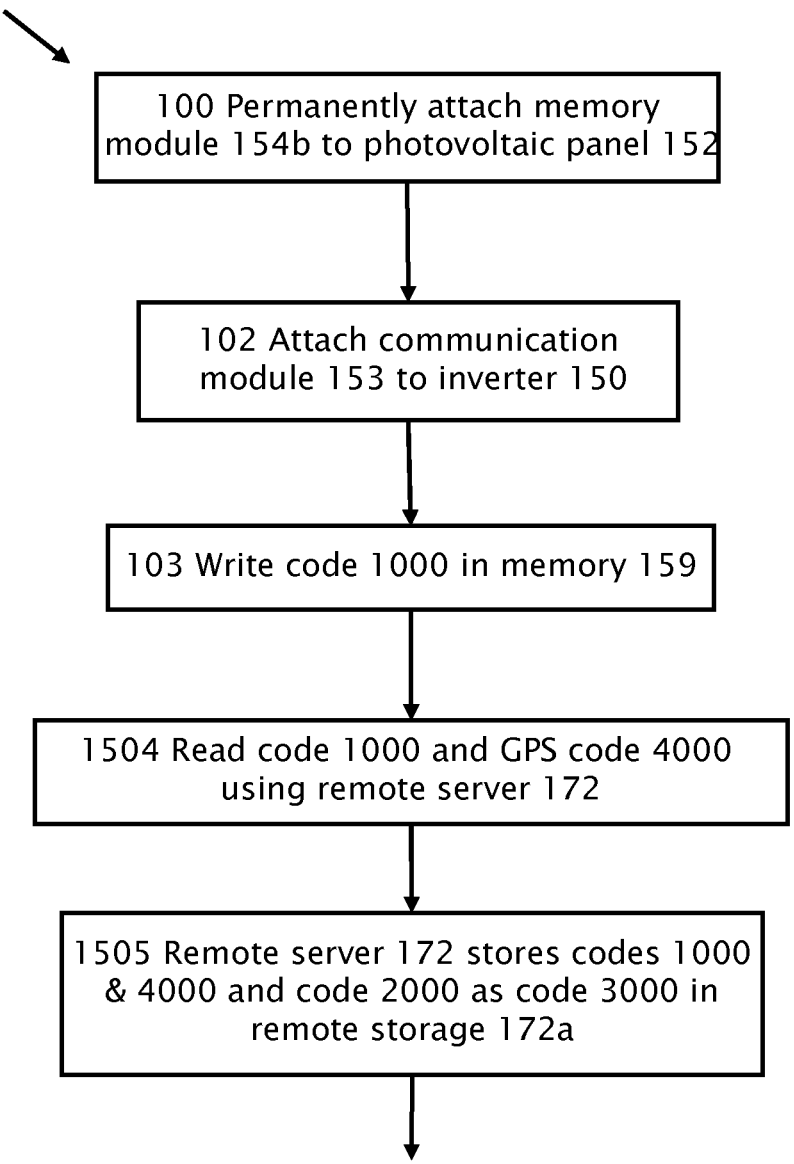
FIGS. 1i and 1j illustrate a process flow of a method for theft prevention of the electrical power generation system of FIG. 1h.
Figure 1J:
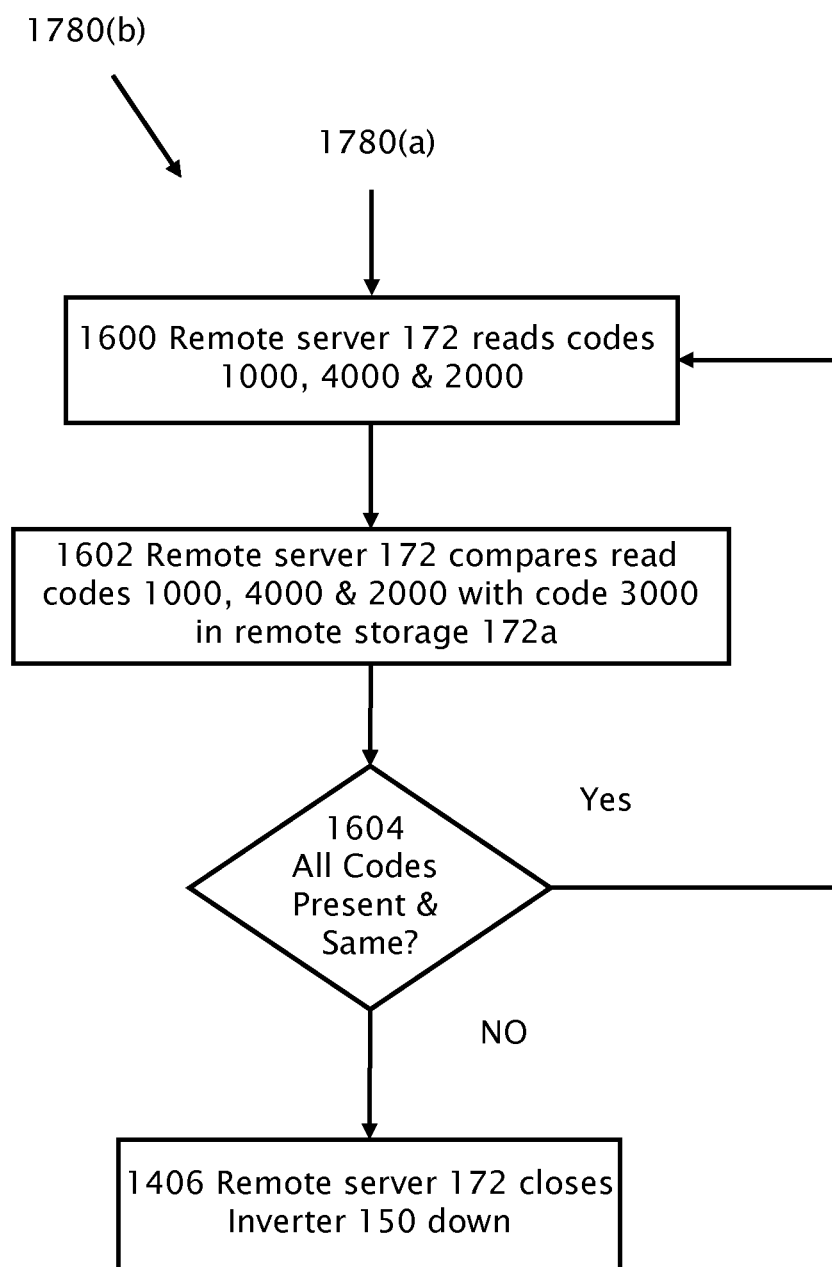

Reference is now also made to FIGS. 1i and 1j which illustrate a process flow of a method 1780 for theft prevention of electrical power generation system 138 (FIG. 1h) according to an embodiment of the present invention. In step 100, typically performed during manufacture of electrical power generation system 138, memory module 154b is permanently attached to photovoltaic panel 152. In step 102, communication module 153 is attached to inverter 150. In step 103, code 1000 is written in memory 159 during manufacture of photovoltaic panel 152 or at installation of photovoltaic panel 152. Remote server 172 reads (step 1504) code 1000 and code 4000 of GPS module 159a using bus controller 164. Remote server 172 stores a copy/hash of codes 1000 and 4000 read in step 1504 into code 2000 in memory 175 and in code 3000 of remote storage 172a (step 1505). Method steps 103, 1504 and 1505 are typically performed during installation of photovoltaic panel 152 and inverter 150. Method 1780 continues in FIG. 1j as sub-process 1780(b) performed during power conversion operation of system 138. To protect against theft, remote server 172 reads (step 1600) codes 1000, 2000 and 4000. In step 1602, remote server 172 compares codes (1000, 2000 and 4000) read in step 1600 with code 3000 in remote storage 172a. At step 1604, if codes (1000, 2000, 4000) and 3000 are the same or otherwise compare correctly, output 174 of microprocessor 160 via remote server 172, allows the power conversion of DC to AC of inverter 150 and operation continues at step 1600. Otherwise remote server 172 does not allow inverter 150 to convert DC power to AC power (step 1406).

Figure 1K:
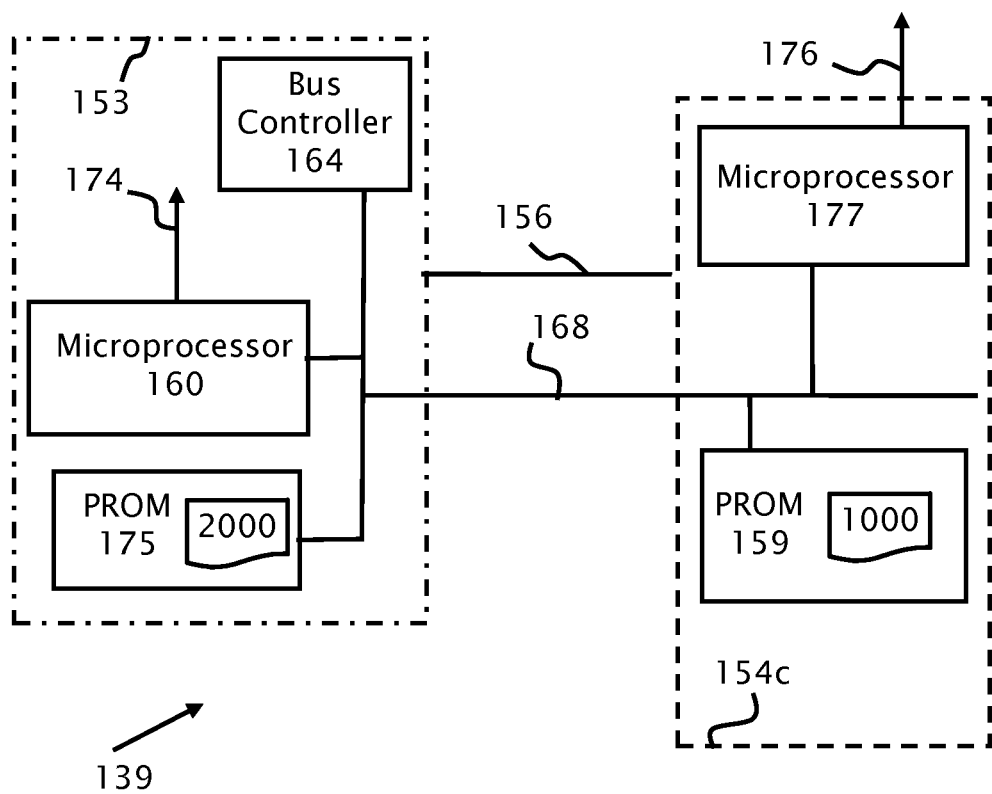
FIG. 1k illustrates an electrical power generation system with a theft prevention feature, according to still another embodiment of the present invention.
Figure 1I:
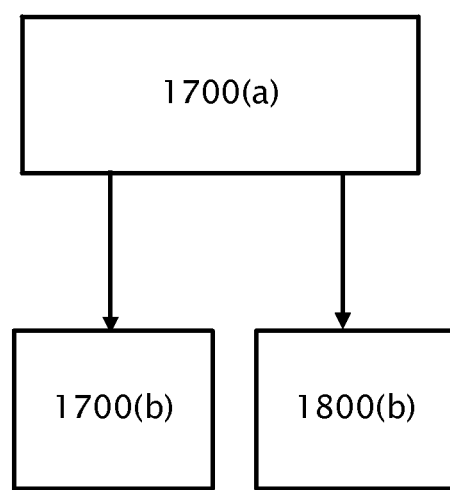

Reference is made to FIG. 1k of photovoltaic system 139, another embodiment of the present invention for theft prevention. Communication module 153 attached to inverter 150 contains a bus controller 164 connected to microprocessor 160 and memory 175, having code 2000. Microprocessor 160 has an output signal 174, which is used to allow the operation of inverter 150 to convert DC Power to AC power. Memory module 154c permanently attached to photovoltaic panel 152 contains memory 159, having a code 1000 and microprocessor 177 with output 176. Memory 159 and microprocessor 177 are connected to bus controller 164 in communication module 153 by communication cable 168.

Reference is now made to FIG. 1l which illustrates sub-processes 1700(b) and 1800(b) being performed in parallel during power conversion operation after manufacturing/installation is performed according to sub-process 1700(a). Sub-processes 1700(b) and 1800(b) work together in parallel and at the same time to achieve theft detection and prevention of electrical power generation system 139, according to an embodiment of the present invention. Sub-process 1700(b) illustrates the use of microprocessor 160 for theft detection and prevention of electrical power generation system 139. Sub-process 1800(b) illustrates the use of microprocessor 177 for theft detection and prevention of electrical power generation system 139.

Figure 1M:
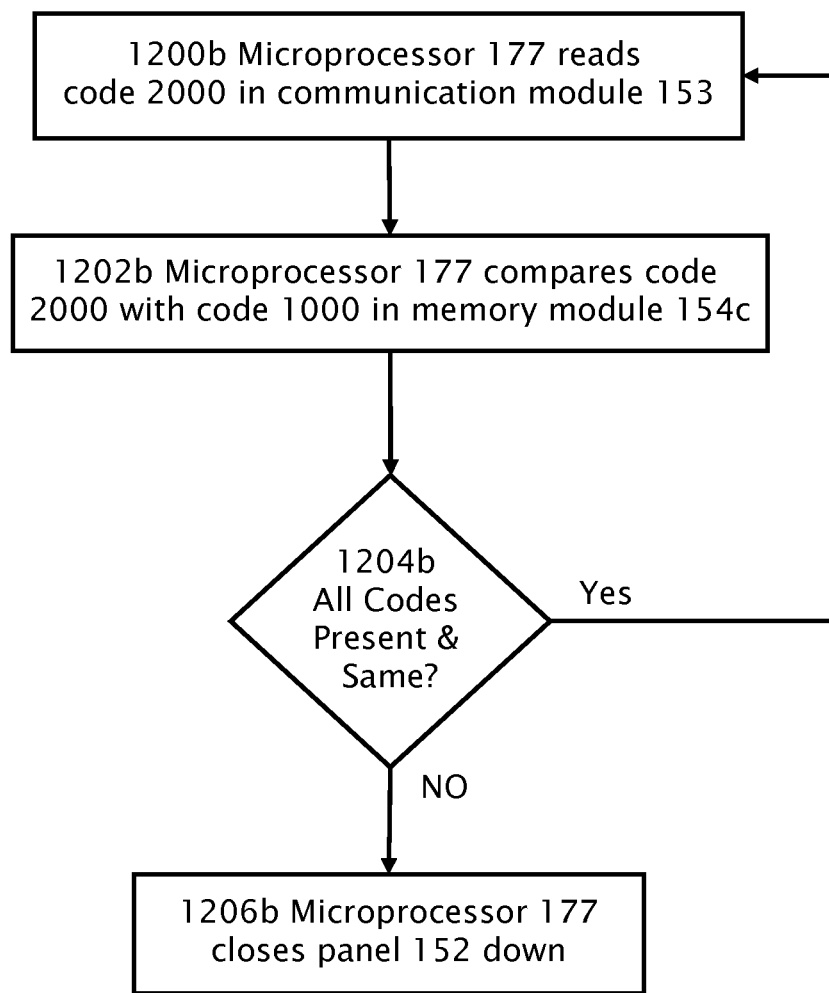

Referring to FIG. 1m, sub-process 1800(b) in step 1200b microprocessor 177 reads code 2000 in communication module 153 by signaling over communications bus 168. In step 1202b, microprocessor 177 compares code 2000 with code 1000. If in decision box 1204b, codes 1000 and 2000 are not the same, output 176 of microprocessor 177 is used to shut down photovoltaic panel 152 (step 1206b). Photovoltaic panel 152 may be shut down by several mechanisms, by simple bypass using a bypass diode in parallel with photovoltaic panel 152 or by turning off a DC/DC conversion circuit if present in module 154.

A supervisory mechanism is typically provided to remove the pairing in order to perform re-pairing using different inverters 150 and modules 154.

Impedance Measurement

Figure 2A:
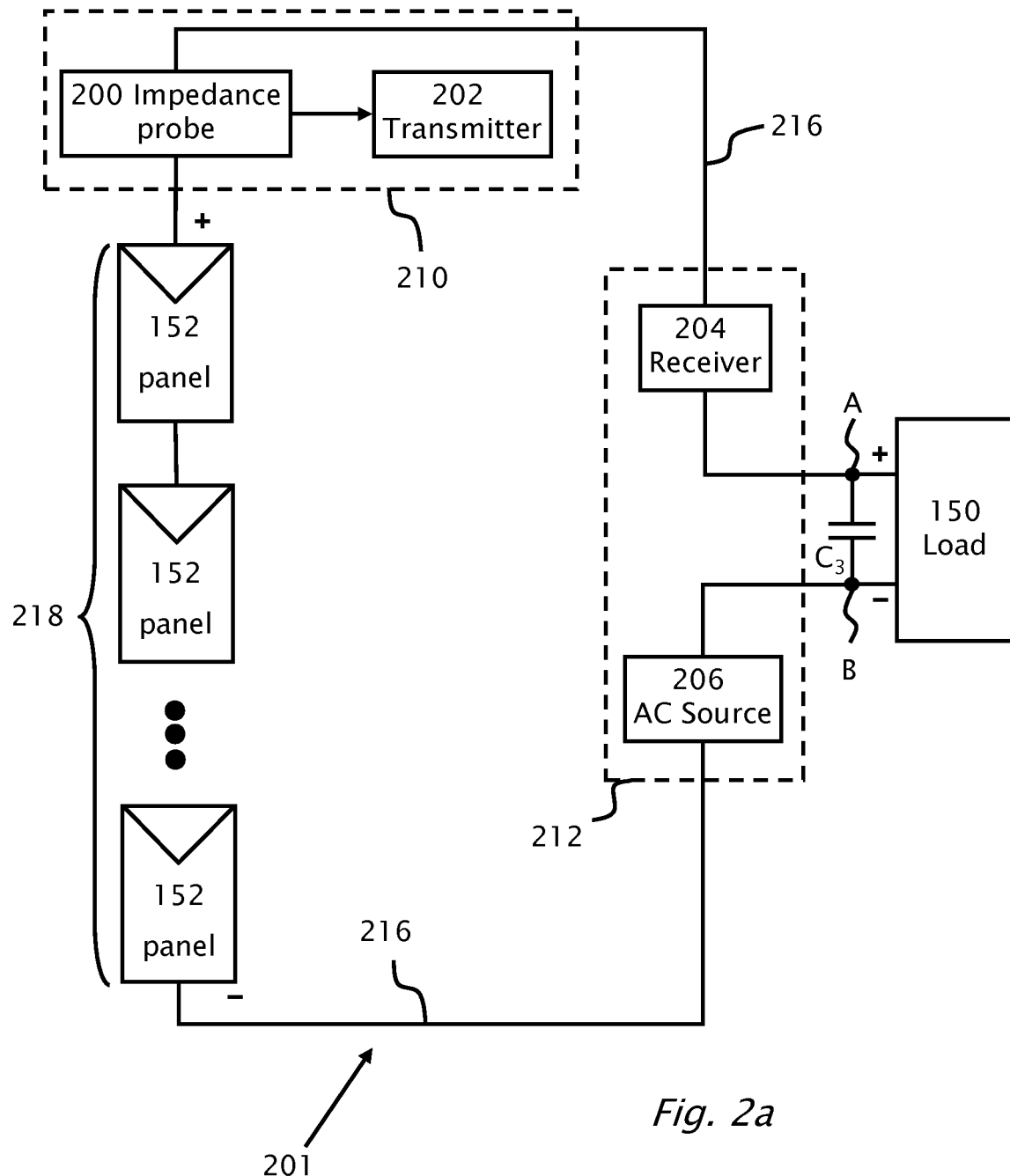
FIG. 2a shows a power generation system including a theft prevention feature according to an embodiment of the present invention.

Reference is now made to FIG. 2a which shows a power generation system 201 including a theft prevention feature according to an embodiment of the present invention. Power generation system 201 has at least one string 218 of photovoltaic panels 152, an impedance unit 210, a unit 212, capacitor $C_3$, DC power line 216 and load 150. Load 150 is preferably an inverter. Impedance unit 210 has an impedance probe 200 which is connected serially via direct current (DC) line 216 between the positive output of string 218 and unit 212. When more than one string 218 is present each string 218 typically includes its own impedance probe 200. Unit 210 maybe optionally incorporated in load 150. Impedance unit 210 senses impedance of panels 152 with an output connected to a transmitter 202. During daytime operation, impedance unit 210 may be powered by the current in string 218 or by attaching the probe to a single photovoltaic panel and receiving power from the photovoltaic panel in parallel with the string. Impedance unit 210 and/or unit 212 may have a charge storage element such as a battery or capacitor for nighttime operation with the charge storage element being charged during daytime operation. Transmitter 202 periodically transmits a signal proportional to the measured impedance by impedance probe 200. Unit 212 has receiver 204 and an alternating current (AC) source module 206. Unit 212 is connected serially between unit 210 and negative output of string 218. Unit 210 may be incorporated in a panel 152 or in an electronic module 302 (not shown) which is operatively attached/permanently attached to a photovoltaic panel 152. Load 150 has a DC input which is serially connected between receiver 204 and alternating current source module 206 at nodes A and B respectively. Current source module 206 is optional and may be not needed if unit 210 includes a charge storage. A capacitor $C_3$ connects between nodes A and B. Receiver 204 is serially connected between the positive output of string 218 and node A.

Alternating current source module 206 is serially connected between node B and the negative output of string 218. AC source module 206 is connected to string of panels 152 and superimposes an AC signal on DC power lines 216. Impedance probe 200 attached to the string of panels 152 measures impedance preferably by independently measuring AC current and AC voltage along the string of panels.

Figure 2B:
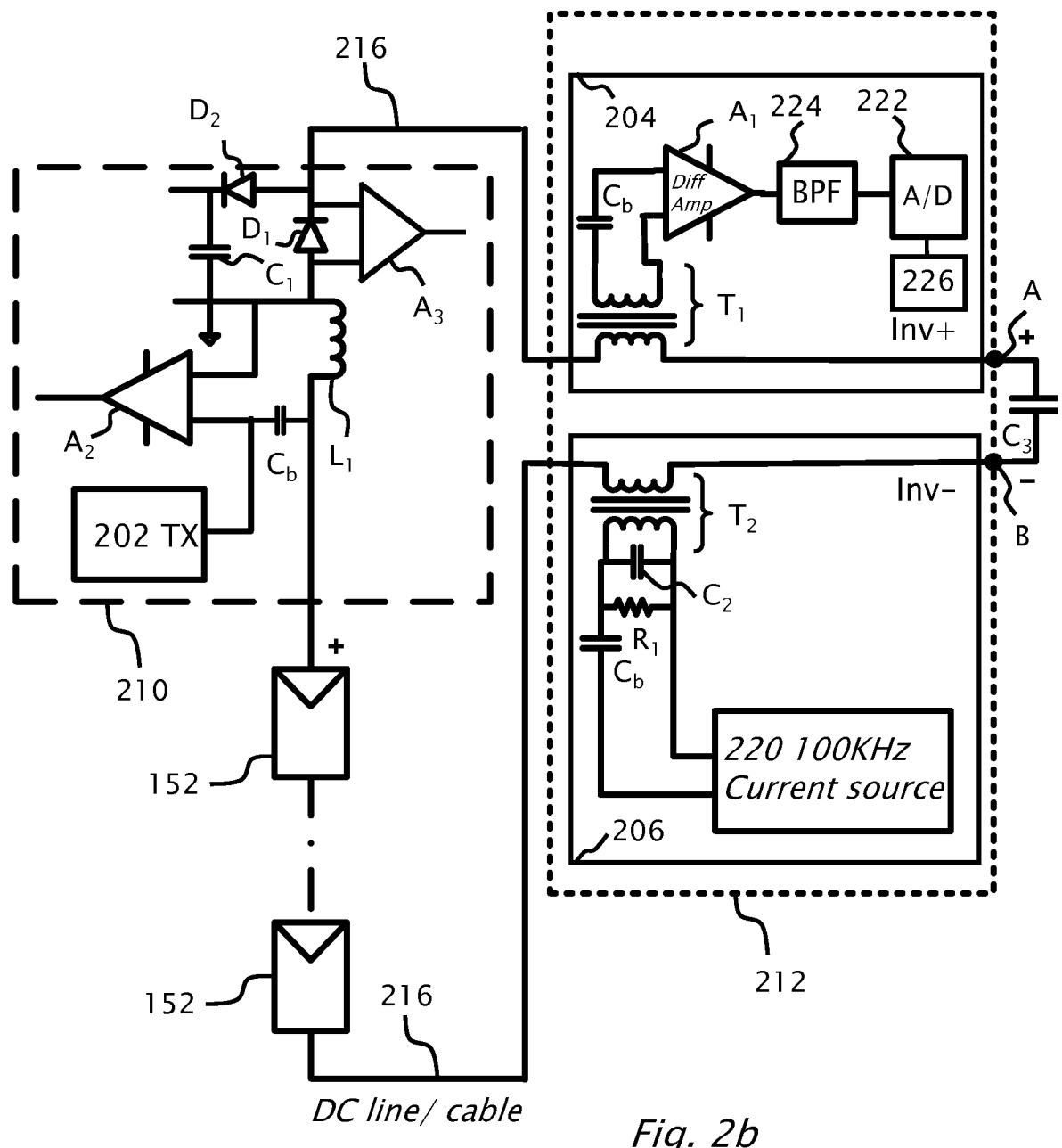
FIG. 2b shows further details of receiver/current source unit and impedance unit connected as shown in FIG. 2a according to an embodiment of the present invention.

Reference is now made to FIG. 2b which shows further details of unit 212 and impedance unit 210 connected as shown in FIG. 2a according to an embodiment of the present invention. Load 150 connected at nodes A and B is not shown. Unit 212 has a receiver 204 and AC source module 206. AC source module 206 includes an AC current source 220 which operates at a frequency typically of 100 KHz. The AC current of source 220 is superimposed on to DC line 216 via transformer $T_2$ or any other AC coupling device. One side of transformer $T_2$ coil is connected in shunt to a capacitor $C_2$ and resistor $R_1$ connected in parallel. One end of $R_1$ is connected to the output of current source 220. The other end of $R_1$ is connected to the other output of current source 220 via a DC blocking capacitor $C_b$. The other side of transformer coil $T_2$ is connected in series between node B and panels 152 via DC line 216. Receiver 204 receives an input of AC present on DC line 216 via one coil of transformer $T_1$ connected in series between node A and impedance unit 210 via DC line 216. The other coil of transformer $T_1$ is connected at one end to the input of a differential amplifier $A_1$ and the other end of the coil to the other input of amplifier $A_1$ via a blocking capacitor $C_b$. The output of amplifier $A_1$ connects into the input of a band pass filter (BPF) 224. The output of band pass filter (BPF) 224 connects into the input of an analogue to digital (A/D) converter 222. The output of analogue to digital (A/D) converter 222 operatively attached to processor 226 (with memory).

Impedance unit 210 is connected in series between panels 152 and receiver 204 via DC line 216. The positive DC output of panels 152 is connected to one end of an inductor $L_1$ and one end of a DC blocking capacitor $C_b$. The other end of DC blocking capacitor $C_b$ connects to the input of transmitter 202 as well as to the input of amplifier $A_2$. The other input of amplifier $A_2$ connects to one end of capacitor $C_1$, the anode of a diode $D_1$ and the other end of inductor $L_1$. Capacitor $C_1$ may serve as a charge storage device to provide power to impedance unit 210 during night-time operation. The cathode of $D_1$ connects the anode of diode $D_2$. The cathode of $D_2$ connects to the other end of capacitor $C_1$. The node where the cathode of $D_1$ connects the anode of diode $D_2$ provides the connection to DC line 216. Amplifier $A_3$ has an input which connects across diode $D_1$. The output of amplifier $A_2$ may be connected to the input of an analogue to digital (A/D) converter (not shown) with an output connected to a memory storage device (not shown). The output of amplifier $A_3$ may be connected to the input of an analogue to digital (A/D) converter (not shown) with an output connected to a memory storage device (not shown).

Figure 2C:
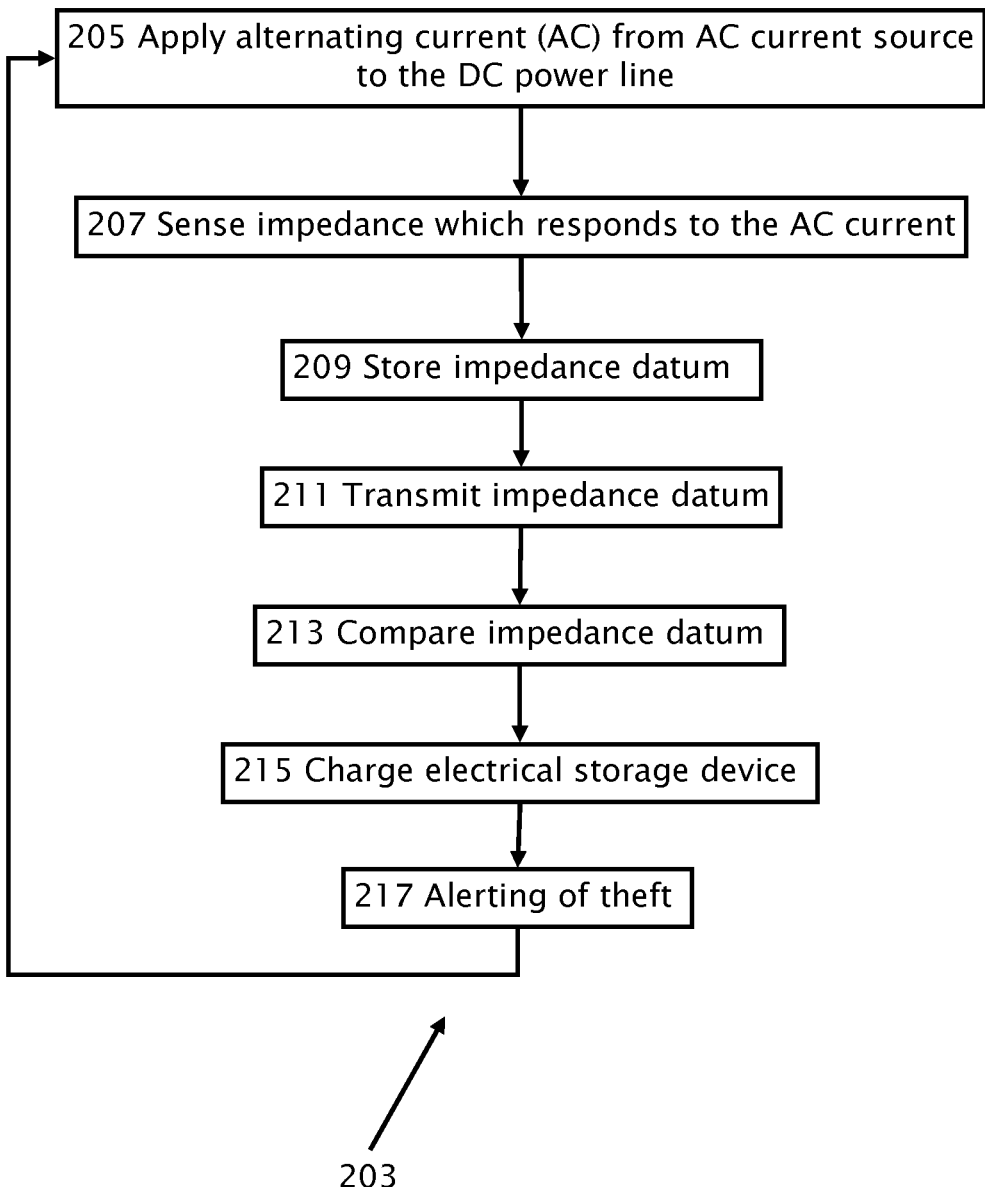
FIG. 2c shows a method for theft detection of a power generation system, according to an aspect of the present invention.

Reference is now also made to FIG. 2c which shows a method 203 for theft detection of a power generation system 201 which illustrates pairing in system 201, according to an aspect of the present invention. An alternating current of typically 100 KHz is superimposed or applied (step 205) onto DC line 216 for example via unit 212 and transformer $T_2$. Optionally, the coil of transformer $T_2$ connected in parallel with $C_2$ and $R_1$ have values selected to operate at a resonance with the series inductance of DC line 216 and inductor $L_1$ located in impedance unit 210. During daylight operation of system 201 direct current flows out from panels 152 through $L_1$ and $D_1$ in impedance unit 210, through receiver 104, inverter 150, source 260 and back to the other end of panels 152. A measure of the impedance of panels 152 is achieved by sensing (step 207) the current through inductor $L_1$ via amplifier $A_2$ and the voltage across diode $D_1$ via amplifier $A_3$. A measure of the impedance of panels 152 is achieved by dividing the magnitude of the voltage across diode $D_1$ by the magnitude of the current through inductor $L_1$ during sensing (step 207). The measure of the impedance of panels 152 by sensing (step 207) may be stored (step 209) as an impedance datum in a memory (not shown) attached to amplifier $A_2$ and $A_3$ via analogue to digital (A/D) converters (not shown). The stored impedance datum derived by sensing (step 207) may also be transmitted (step 211) by transmitter 202 onto power lines 216. Typically during night-time transmitter 202 transmits every 3 minutes. Receiver 204 receives the transmissions of the impedance datum from transmitter 202 via one side of transformer $T_1$. The other side of transformer $T_1$ is applied to the input of amplifier $A_1$. The output of amplifier $A_1$ is fed into the input of band-pass filter 224 which extracts the impedance data sent by transmitter 202. The output of band-pass filter 224 is then converted to a digital value via analogue to digital (A/D) converter 222 which is optionally stored in processor 226 (with memory) operatively attached to the output of analogue to digital (A/D) converter 222. Comparisons (step 213) of stored impedance datum (step 209) and transmitted impedance datum (step 211) are preferably made by processor 226. During daylight operation of capacitor $C_1$ serves as a charge storage device (step 215) to optionally provide power to impedance unit 210 during night-time operation. A potential theft of a component of system 201 is alerted (step 217) which is responsive to a change in the sensed impedance datum comparisons (step 213) according to previously determined thresholds. A potential theft is alerted once there is no report from impedance unit 210 since transmitter 202 may transmit once in 3 minutes and if a transmission is not received then the cable may have been cut, when power line communication is used.

Figure 2D:
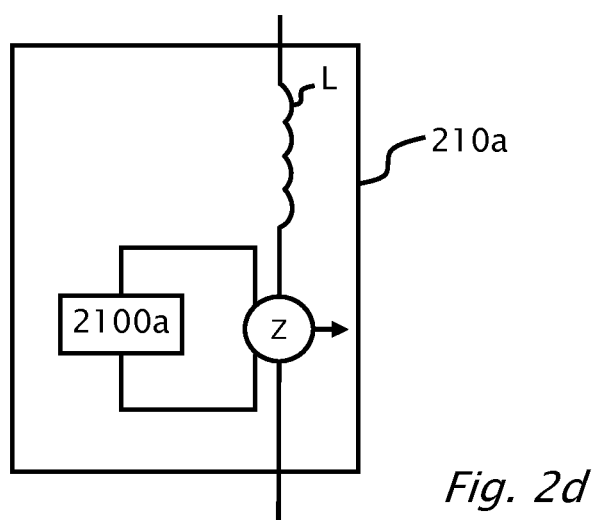
FIG. 2d shows an alternative embodiment of the impedance unit shown in FIG. 2b.

Reference is now made to FIG. 2d which shows impedance unit 210a, impedance unit 210a is an alternative embodiment of impedance unit 210 shown in FIG. 2b. Impedance unit 210a includes a high impedance inductor L, possibly using resonance to increase impedance and an impedance meter Z. Inductor L is connected in series with impedance meter Z. Impedance meter Z may have a charge storage element 2100a such as a battery or capacitor for nighttime operation which is charged during daytime operation. Alternatively, impedance meter Z may be powered by the method of AC feed. The AC signal that is imposed on the inductor L is rectified when unit 212 includes an AC source used for the purpose of feeding power to probes 200 and for impedance measurement. Impedance meter Z is typically adapted to transmit impedance/voltage/current datum via power line communications or via a wireless connection.

Figure 2E:
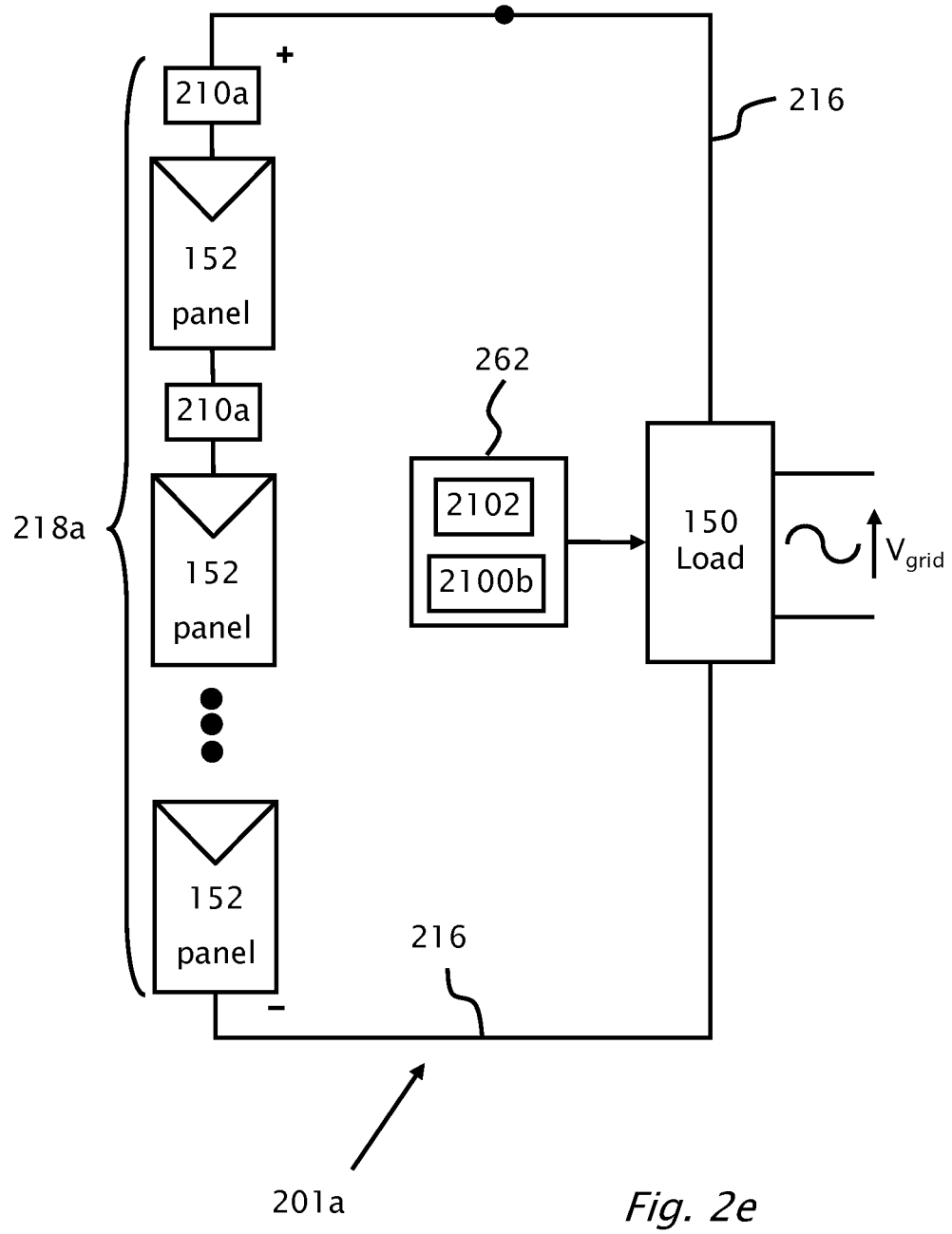
FIG. 2e shows a power generation system including a theft prevention feature according to an embodiment of the present invention.

Reference is now made to FIG. 2e which shows a power generation system 201a including a theft prevention feature which illustrates pairing in system 201a according to an embodiment of the present invention. Power generation system 201a has a string 218a of photovoltaic panels 152, impedance units 210a, a module 262 and load 150. Load 150 may be a direct current (DC) to alternating current (AC) inverter with an output which connects to a grid voltage ($V_{grid}$). Impedance units 210a are connected serially with panels 152 or may be incorporated as a part of a panel 152 to form string 218a. Module 262 typically includes a receiver 2102 to receive datum transmitted from units 210a.

During daytime operation module 262 may be powered by the voltage of string 218a, by the grid voltage ($V_{grid}$) during nighttime operation or module 262 may have a charge storage element 2100b such as a battery or capacitor for nighttime operation which is charged during daytime operation. During nighttime operation, impedance units 210a may be powered by module 262 (providing a typical 12 volts DC current to module 210a) which is powered by the grid voltage ($V_{grid}$) and/or a charge storage device 2100b. During daytime operation, impedance units 210a may be powered by the current in string 218a or by taking power from a single panel. Impedance units 210a may have a charge storage element 2100a such as a battery or capacitor for nighttime operation which is charged during daytime operation.

String 218a is connected serially to the DC input of load 150 via direct current (DC) lines 216. Module 262 may be incorporated as a part of the circuitry of load 150 or operatively attached to load 150. Impedance units 210a may sense the impedance of panels 152, the current flowing in string 218a or the voltage at a certain point within string 218a depending where impedance unit 210a is connected in string 218a. Impedance unit 210a periodically transmits a datum corresponding to the measured impedance/DC or AC current/DC or AC voltage datum over power line communications or via a wireless connection to module 262. Module 262 alerts a potential theft of a component of system 201a which is responsive to a change in the sensed impedance/current/voltage datum provided by impedance units 210a. Not receiving a report is a potential theft on its own.

Figure 2F:
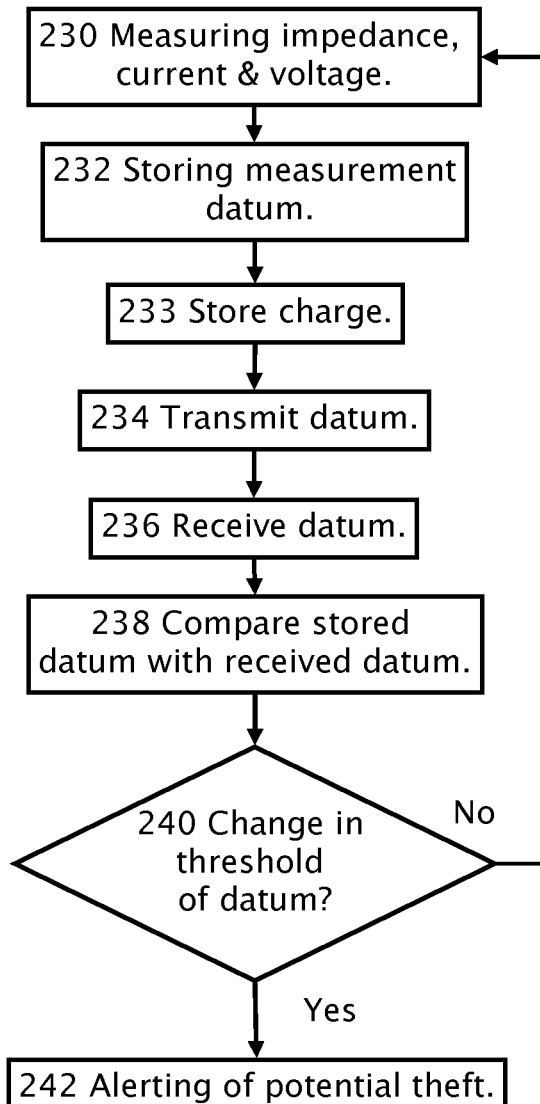
FIG. 2f shows a method for theft detection according to an embodiment of the present invention using the power generation system shown in FIG. 2e.

Reference is now made to FIG. 2f which shows a method 219 for theft detection according to an embodiment of the present invention using system 201a (shown in FIG. 2e). Impedance units 210a preferably measures impedance, DC current or DC voltage at various points in string 218a (step 230). Impedance units 210a preferably have memories to store measured impedance, DC current or DC voltage as datum (step 232). During daytime operation, impedance units 210a may be powered by the current in string 218b. Impedance units 210a and/or module 262 may have a charge storage element (2100a and 2100b respectively) such as a battery or capacitor for nighttime operation. The charge storage elements (2100a and 2100b respectively) are used to store charge during daytime operation (step 233). Impedance units 210a transmit (step 234) stored measurement datum (step 232) by power line communications or via a wireless connection to module 262. Module 262 receives the transmitted measurement datum with receiver 2102 and compares (step 238) the transmitted datum with datum that has been stored previously in a look table in module 262 as part of a pairing process between module 262 and impedance units 210a. If the comparison between stored datum (step 232) and received datum (step 236) is above a certain pre-defined threshold level, then module 262 may alert a potential theft of a component of system 201a (step 242), otherwise measurement of the impedance, DC current or DC voltage at various points in string 218a (step 230) continues. Not receiving a report in the central unit is a potential theft.

Figure 2G:
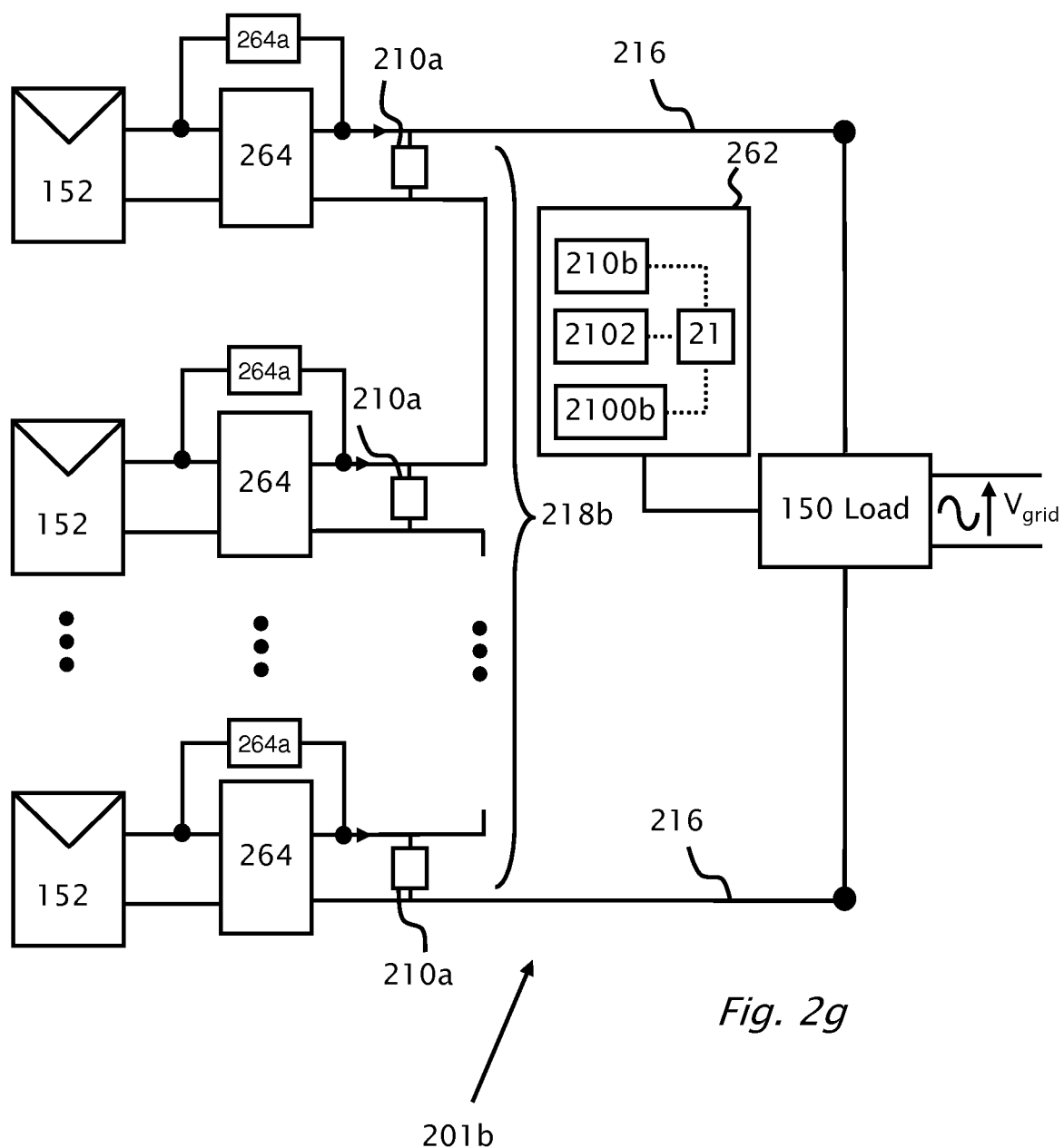
FIG. 2g shows a power generation system including a theft prevention feature according to an embodiment of the present invention.

Reference is now made to FIG. 2g which shows a power generation system 201b including a theft prevention feature according to an embodiment of the present invention. Power generation system 201b has a string 218b, photovoltaic panels 152, impedance units 210a, electronic modules 264, a module 262 and load 150. Load 150 is preferably a direct current (DC) to alternating current (AC) inverter with an output which connects to a grid voltage ($V_{grid}$). The outputs impedance units 210a are connected serially to form a string 218b. The inputs of impedance units 210a are connected to the outputs of electronic modules 264 either in parallel or in series. Impedance unit 210a may be incorporated as a part of an electronic module 264. The inputs of electronic modules 264 are connected to the outputs of panels 152. Module 262 typically includes a receiver 2102 to receive datum transmitted from units 210a. Electronic module 264 additionally may include a bypass 264a which is connected serially between the input and output of module 264. Bypass 264a is typically a single pole switch which is energized to be open circuit when module 264 is receiving power from panel 152 or is a capacitor or a series capacitor and inductor.

During daytime operation module 262 may be powered by the voltage of string 218b, by the grid voltage ($V_{grid}$) during nighttime operation or module 262 may have a charge storage element 2100b such as a battery or capacitor for nighttime operation which is charged during daytime operation. During nighttime operation impedance units 210a may be powered by module 262 (providing a typical 12 volts DC current) which is being powered by the grid voltage ($V_{grid}$) and/or a charge storage device 2100b. During daytime operation, impedance units 210a may be powered by the voltage of module 264 or impedance units 210a may have a charge storage element 2100a such as a battery or capacitor for nighttime operation which is charged during daytime operation. There is an additional option for day and/or night operation for 210a where module 262 sends an AC signal that is rectified by 210a on some impedance (e.g. inductor in resonance) to produce DC.

String 218b is connected serially to the DC input of load 150 via direct current (DC) lines 216. Module 262 maybe optionally incorporated as a part of the circuitry of load 150 or operatively attached to load 150. Impedance units 210a preferably measures the impedance of modules 264, the current flowing in string 218b or the voltage at a certain point within string 218b depending where an impedance unit 210a is connected in string 218b or the voltage output of a module 264. Impedance unit 210a periodically transmits datum corresponding to the measured impedance/DC current/DC voltage over power line communications or via a wireless connection to module 262. Module 262 includes a receiver 2102 to receive datum from module 210a. Module 262 alerts a potential theft of a component of system 201a which is responsive to a change in the sensed impedance/current/voltage datum provided by impedance units 210a. Again, theft can be detected by not getting a report from the impedance unit 210a whether or not impedance unit 210a is incorporated within modules 264.

Impedance measurement may be performed by impedance unit 210a alone or by using central impedance probe 210b located in external AC source 262, the latter method being appropriate for the case of simple panels with or without DC module 264. Impedance probe is attached to microprocessor 21 which has ports for analogue to digital/digital to analogue conversion an on board memory.

The impedance that is measured by impedance unit 210a is actually the sum of impedances reflected by all other impedance units 210a. Reference is now made to to FIG. 2d as an example of a circuit which may be included in impedance unit 210a. Impedance unit 210a may be part of DC module 264 and has the output capacitance of the DC module 264 and a series inductor (a regular inductor L or in resonance in order to increase its impedance. Another example is that impedance unit 210a behaves as a capacitor (either as part of DC module 264 or separately) and the impedance measured is the impedance of the capacitor.

According to a feature of the present invention is the ability to sense that photovoltaic panel 152 is no longer connected to DC module 264, in case that only photovoltaic panel 152 is being stolen. During the day it is straightforward to detect a DC input from panel 152. During the night, when panel 152 does not output DC, DC module 264 can measure the panel capacitance or try to impose a voltage and sense whether panel 152 draws current at some point (which is its diode voltage).

According to another feature of the present invention, where a panel 152 is attached to a module 264 and a panel 152 is stolen at night for instance by detaching from DC module 264; it is possible to configure module 264 to passively present the impedance of panel 152 by use of bypass 264a so that such a theft may be detected.

Figure 2H:
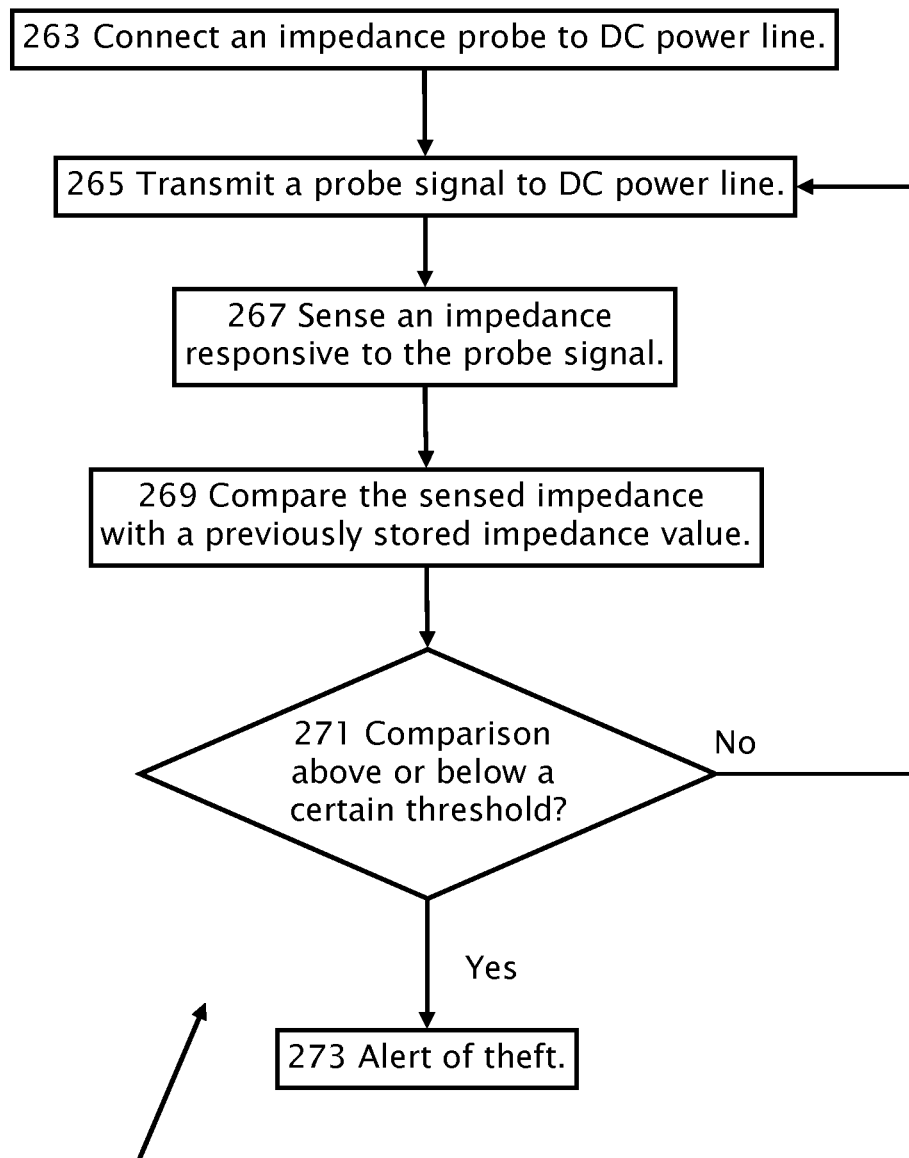
FIG. 2h which shows a method of theft protection in a distributed electrical power generation system according to an embodiment of the present invention.

Reference is now made FIG. 2h which shows a method 261c of theft protection in a distributed electrical power generation system 201b, according to an aspects of the present invention. Central impedance probe 210b is connected to DC line 216 (step 263). Probe 210b then transmits (step 265) a probe signal onto DC line 216, the probe signal may be an AC feed or a DC power line communication signal. Transmit step 265 is controlled and performed using microprocessor 21. Probe 210b then senses (step 267) the impedance of string 218b as a result of applying the probe signal. The sensed impedance in step 267 may then be compared (step 269) with a previously stored impedance value stored in the memory of microprocessor 21. The comparison may be to subtract the sensed impedance in step 267 from the previously stored impedance value stored in the memory of microprocessor 21 to produce a difference value. In decision box 271, the difference value may then may be above or below a certain threshold value, in which case an alert of theft is made (step 273), otherwise transmitting of the probe signal continues with step 265.

When bypass 264a is a single pole switch (magnetic reed relay for example); during the night, when panel 152 does not output DC, the single pole switch is normally closed and the panel 152 impedance is bypassed from the input of module 264 to the output of module 264. Typically if module 264 is a power converter circuit, the main switches in the power converter circuit are open circuit at night, so that the shunt impedance of the output and input of module 264 does not affect the measurement (step 267) of the panel 152 impedance by probe 210b (via bypass 264a). During daytime operation the single pole switch 264a is activated to be open circuit. Another preferable implementation for bypass 264a, is to make bypass 264a a fixed bypass between the input and output of the module 264, were the fixed bypass 264a reflects panel 152 impedance to the output of module 264 but will not interfere with the way module 264 works. The fixed bypass 264a may be a series capacitor between the input and output of module 264 or a series capacitor and inductor between the input and output of module 264 which may be operated at resonance.

According to an aspect of the present invention there is provided a method which relies on impedance measurement performed by a central unit (load/inverter) by sending a signal and measuring voltage/current. In one example, the signal is a dedicated measurement signal. In this case, impedance/capacitance of panels 152 without any additional circuitry may be sensed. In another example, the signal is an AC feed for power modules 264 (during the night or day). In another example, the signal is a power-line-communication that may be used for other purposes (such as command and control, monitoring etc.). The additional circuitry, e.g. power modules 264 may reflect an impedance or output capacitance to measure. Alternatively, the impedance of a series inductor (e.g. regular, resonance, switched resonance) of DC module 264 is measured by command and control from the central unit).

Reference is now made again to FIG. 2f which shows a method 219 for theft detection according to an embodiment of the present invention using system 201b shown in FIG. 2g. Impedance units 210a preferably measures impedance, DC current or DC voltage at various points in string 218b (step 230). Impedance units 210a preferably have memories to store measured impedance, DC or AC current or DC or AC voltage as datum (step 232). During daytime operation, impedance units 210a may be powered by the output voltages of modules 264 or impedance units 210a and module 262 may optionally have a charge storage element 2100b such as a battery or capacitor which is used during nighttime operation. The charge storage elements (2100a and 2100b) are used to store charge during daytime operation (step 233). Impedance units 210a transmit the measurement datum (step 234) by power line communications or via a wireless connection to module 262. Module 262 receives the transmitted measurement datum with receiver 2102 and compares (step 238) the transmitted datum with datum that has been stored previously in a look table in module 262 as part of a process between module 262 and impedance units 210a. If the comparison of datum is above a certain pre-defined level module 262 alerts a potential theft of a component of system 201a (step 242), otherwise measurement of the impedance, DC current or DC voltage at various points in string 218a (step 230) continues.

Thermal Camera

Infrared (IR) radiation or heat radiation is herein defined as electromagnetic radiation whose wavelength is longer than that of visible light (400-700 nm), but shorter than that of terahertz radiation (100 μm-1 mm) and microwaves.

Figure 3A:
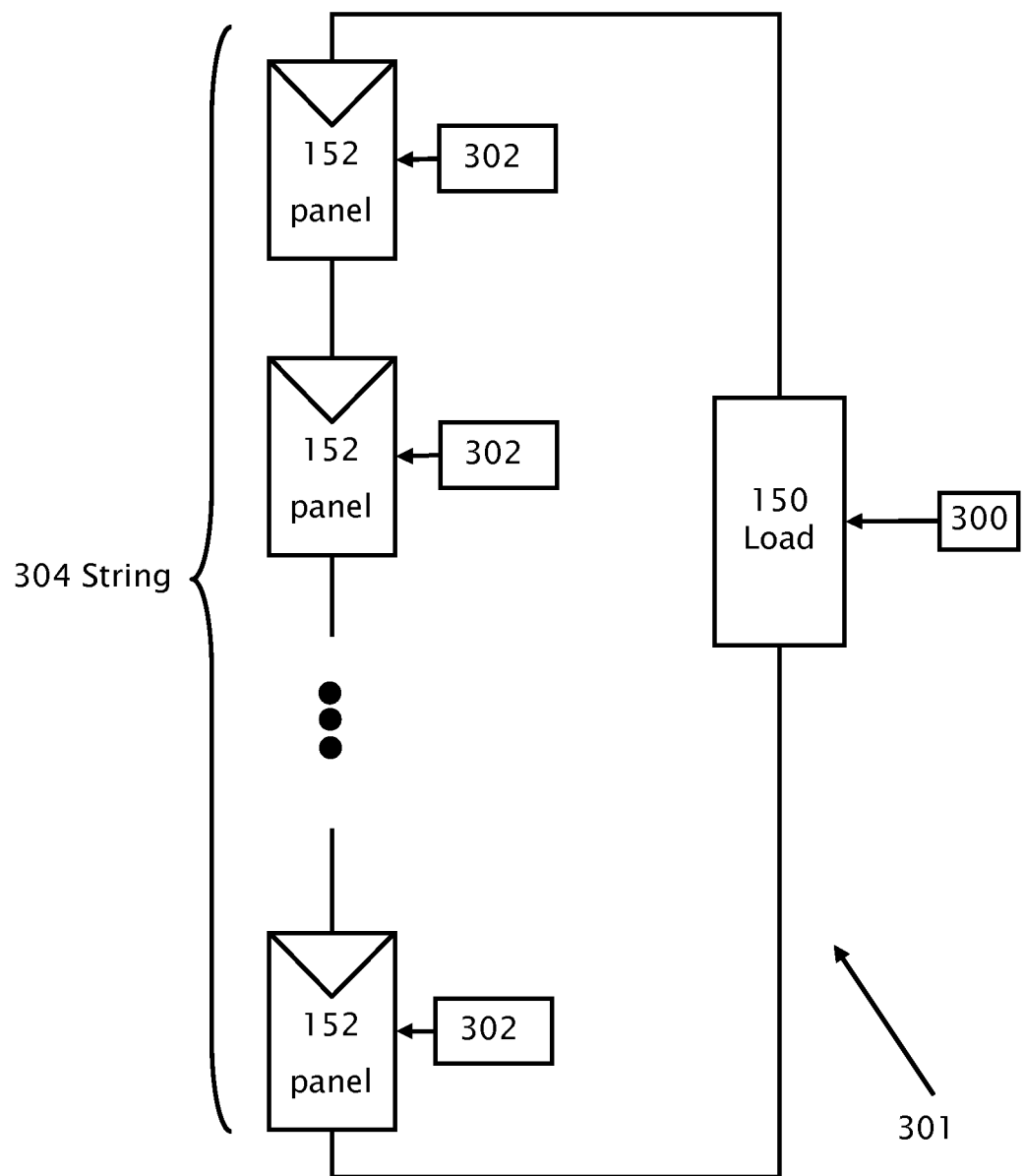
FIG. 3a shows a power generation system including a theft prevention feature according to an embodiment of the present invention.

Reference is now made to FIG. 3a which shows a power generation system 301 including a theft prevention feature according to an embodiment of the present invention. An electronic module 302 is operatively attached to a photovoltaic panel 152. Electronic module 302 may perform direct current to direct current (DC/DC) conversion or DC to alternating current (AC) inverter and according to an embodiment of the present invention is capable of reverse biasing a panel 152. Multiple panels 152 are connected in series to form a string 304. Load 150 may be a direct current (DC) to alternating current (AC) inverter. A central control unit 300 preferably located in the vicinity of load 150 is operatively connected to load 150 and electronic module 302. Central control unit 300 optionally provides a signal to electronic module 302 as well as being connected to a camera 306 (not shown). The signal from central controller 300 to electronic module 302 may be conveyed over the power lines connecting load 150 to string 304 or via a wireless connection between controller 300 and module 302.

Figure 3B:
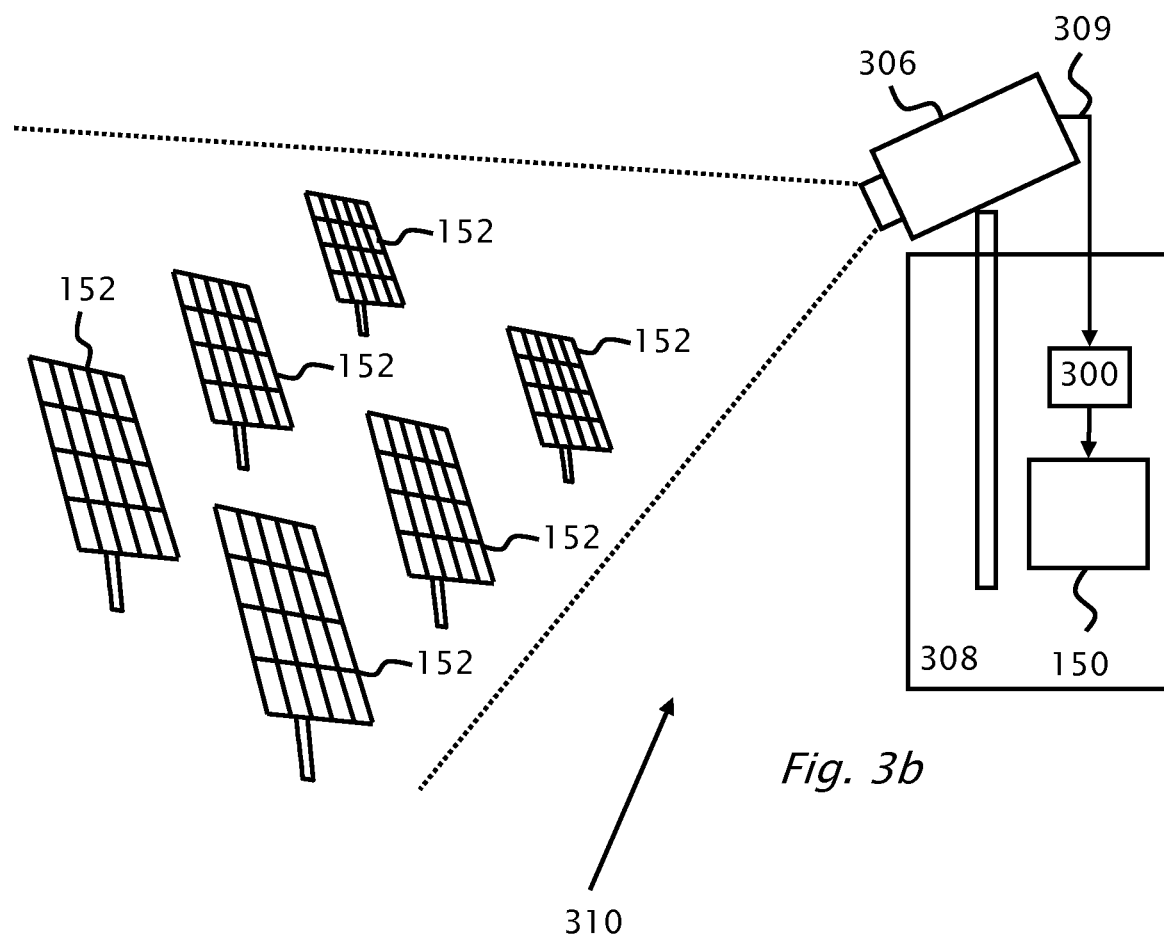
FIG. 3b shows a typical topography of the power generation system (shown in FIG. 3a) including a theft prevention feature according to an embodiment of the present invention.

Reference is now made to FIG. 3b which shows a typical topography 310 of power generation system 301 (shown in FIG. 3a) including a theft prevention feature according to an embodiment of the present invention. Topography 310 includes multiple panels 152 with modules 302 (not shown) which are connected to load 150 and controller 300. A camera 306 is located in the vicinity of controller 300 and load 150 which are located in a building 308. Camera 306 is preferably a thermal imaging camera. The field of view of camera 306 preferably captures images of panels 152. The captured images of panels 152 by camera 306 are preferably sent to controller 300 for analysis via power/signal line 309 or via wireless communications.

Figure 3C:
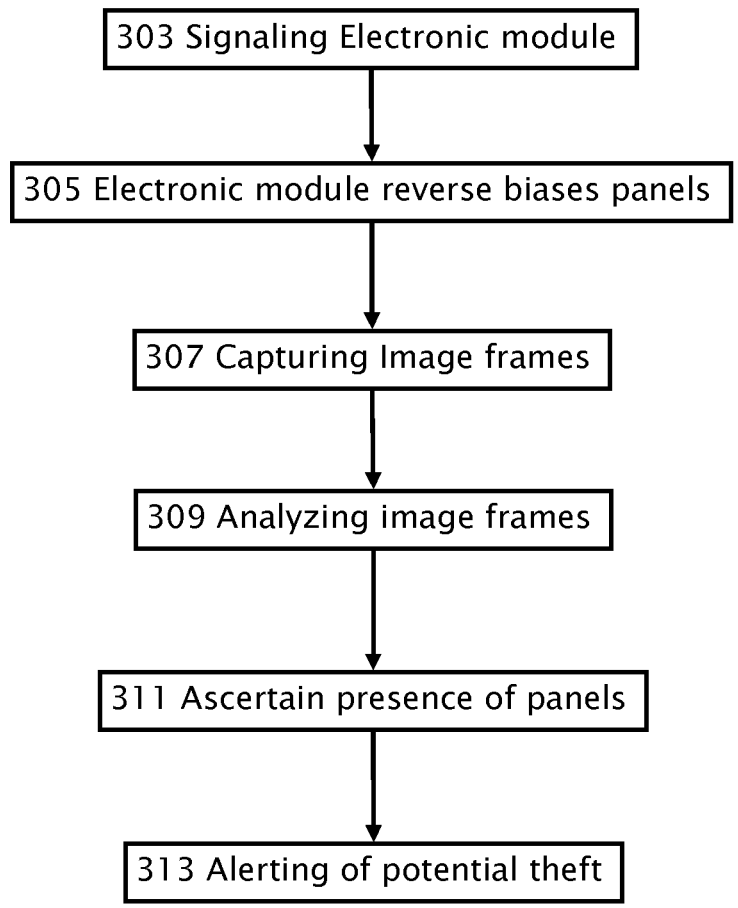
FIG. 3c shows a method for theft detection according to an embodiment of the present invention using the system of FIG. 3a with topography shown in FIG. 3b.

Reference is now also made to FIG. 3c which shows a method 311 for theft detection according to an embodiment of the present invention using system 301 with topography 310. During theft detection a signal is sent from central unit 300 to an electronic module 302 (step 303). The signal from unit 300 to electronic module 302 may be conveyed over the power lines connecting load 150 to string 304 or via a wireless connection between unit 300 and module 302. Typically the signal sent from unit 300 reverse biases panel 152 via module 302 (step 305) for a period of time which causes a noticeable rise in panel 152 temperature. After reverse biasing panels 152 (step 305) using module 302, image frames of panels 152 are captured using camera 306 (step 307). Unit 300 then analyzes (step 309) the image frames of panels 152 captured by camera 306 (step 307). Analyzing the captured image frames preferably means monitoring the effects of reverse biasing panels 152 or alternatively monitoring the thermal effects of normal current flow produced during daylight operation of panels 152 without the use of the signal sent from unit 300. Reverse biasing panels using the signal from unit 300 has the effect of heating up panels 152 thereby altering the infrared radiation/heat radiation of panels 152. The presence of panels 152 is ascertained (step 311) by virtue of the infrared radiation change analyzed by unit 300 in captured image frames, after a signal from unit 300 is applied to a panel 152 via module 302. The alerting of a potential theft (step 313) is therefore achieved by the absence of panel 152 not providing a thermal change as a result of applying a signal to a panel 152 via module 302.

Wireless Communications

Figure 4A:
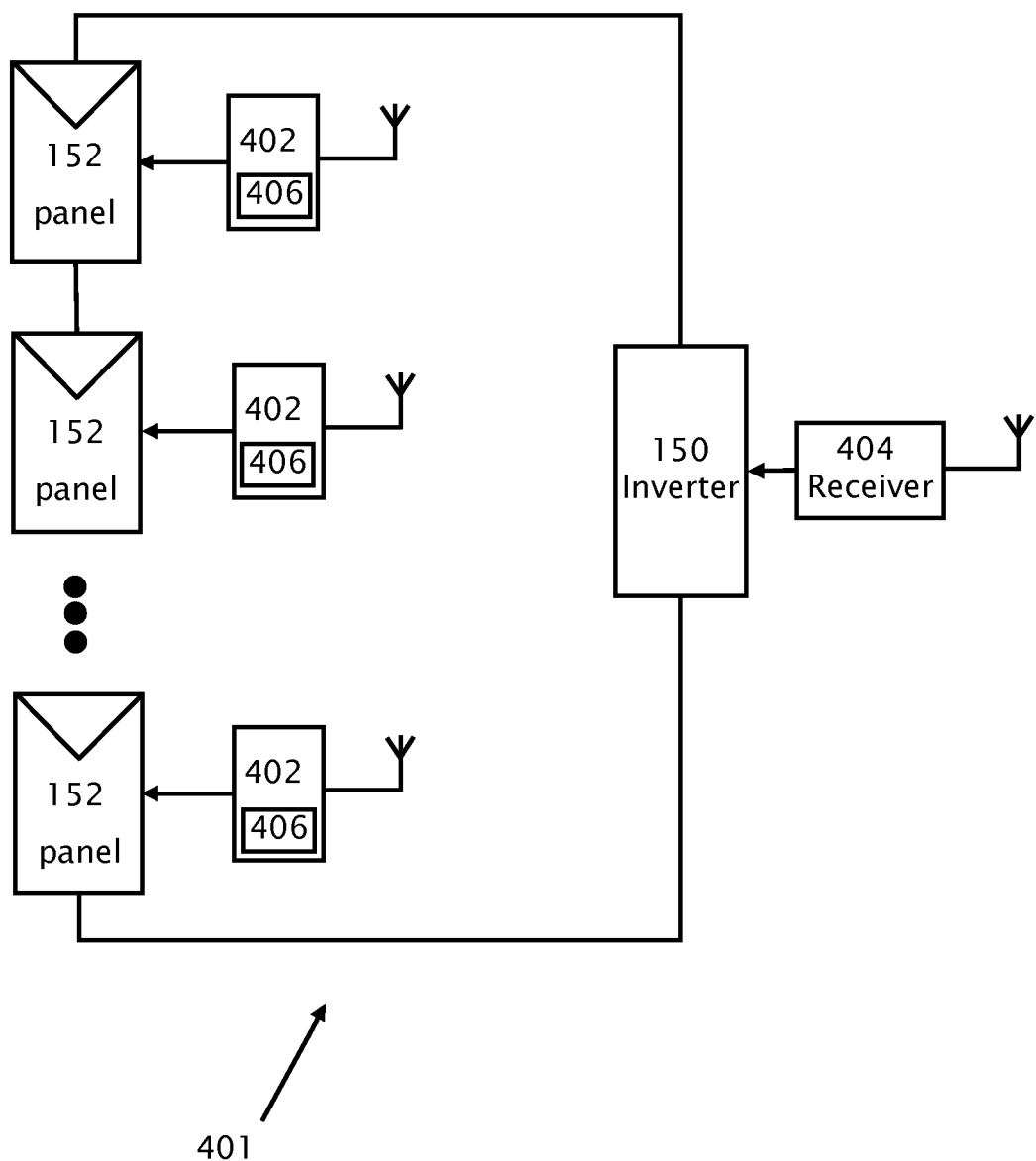
FIG. 4a shows a power generation system including a theft prevention feature according to an embodiment of the present invention.

Reference is now made to FIG. 4a which shows a power generation system 401 including a theft prevention feature according to an embodiment of the present invention. Photovoltaic panels 152 have transmitters 402 operatively attached thereto. Transmitter 402 preferably has a charge storage device 406 used to power transmitter 402 during the nighttime. The charge storage device 406 of transmitter 402 is charged during normal daylight by electricity generated by irradiation of panels 152. Multiple panels 152 are connected in series to a load 150. Load 150 is preferably a direct current (DC) to alternating current (AC) inverter. Attached to and in the vicinity of load 150 is a receiver 404. Receiver 404 receives signals from transmitters 402. Receiver 401 may be composed of an array of receivers/repeaters spread in the solar field installations which eventually send all received information to inverter 150.

Figure 4B:
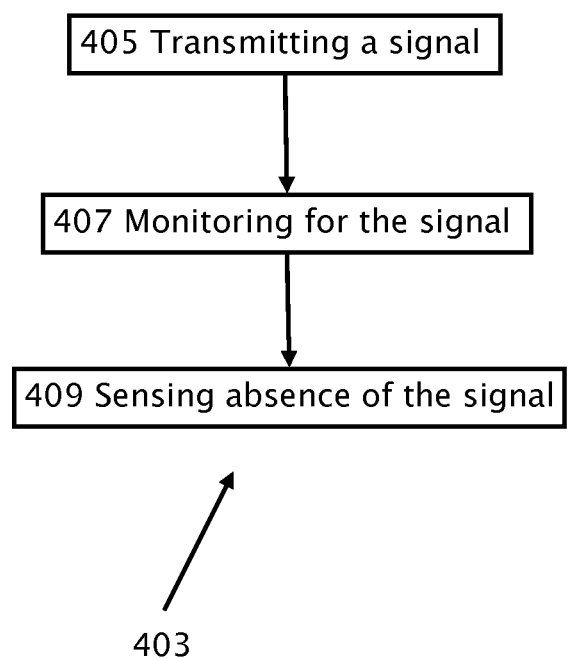
FIG. 4b shows a method for theft prevention using the system shown in FIG. 4a, according to an embodiment of the present invention.

Reference is now also made to FIG. 4b which shows a method 403 for theft prevention using system 401, the method 403 is according to an embodiment of the present invention. Transmitters 402 operatively attached to panels 152 transmit signals (step 405). The transmitted signals of transmitters 402 are preferably transmitted each on different frequencies. The different frequencies that transmitters 402 transmit allow for the unique identification of a particular panel 152. The transmitted signals of transmitters 402 are monitored (step 407) by receiver 404. The monitoring (step 407) by receiver 404 preferably allows for differentiation and identification of which transmitter 402 is transmitting. The absence of a signal from a transmitter is preferably sensed (step 409) by receiver 404. Receiver 404 preferably alerts the situation a theft by virtue of an absence of a received signal or signals from transmitters 402.

In an additional method, transmitter 402 sends a signal only upon theft (detected by either specific sensors like accelerometers or by disconnection from the cable which cuts off signaling or DC feeding from inverter 150.

In an additional implementation, transmitter 402 is passive and contains only a resonance circuit (in series/parallel) and an antenna. Inverter 150 sends an AC signal via the cable that is transmitted passively by the antenna of 402 and is amplified by the resonance circuit of 402. An advantage is that there is no need to feed anything during the night, besides sending a signal on the cable.

Another variant of this method is where photovoltaic panels include a module with a resonance circuit in a different frequency band such that load 150 sends all the relevant frequencies (e.g. a frequency sweep) and receiver 402 senses occurrence of frequency dips, a dip is a specific indication of a stolen module. It gives both identification and additional accuracy (since the received strength signal is not summed over all modules).

Figure 4C:
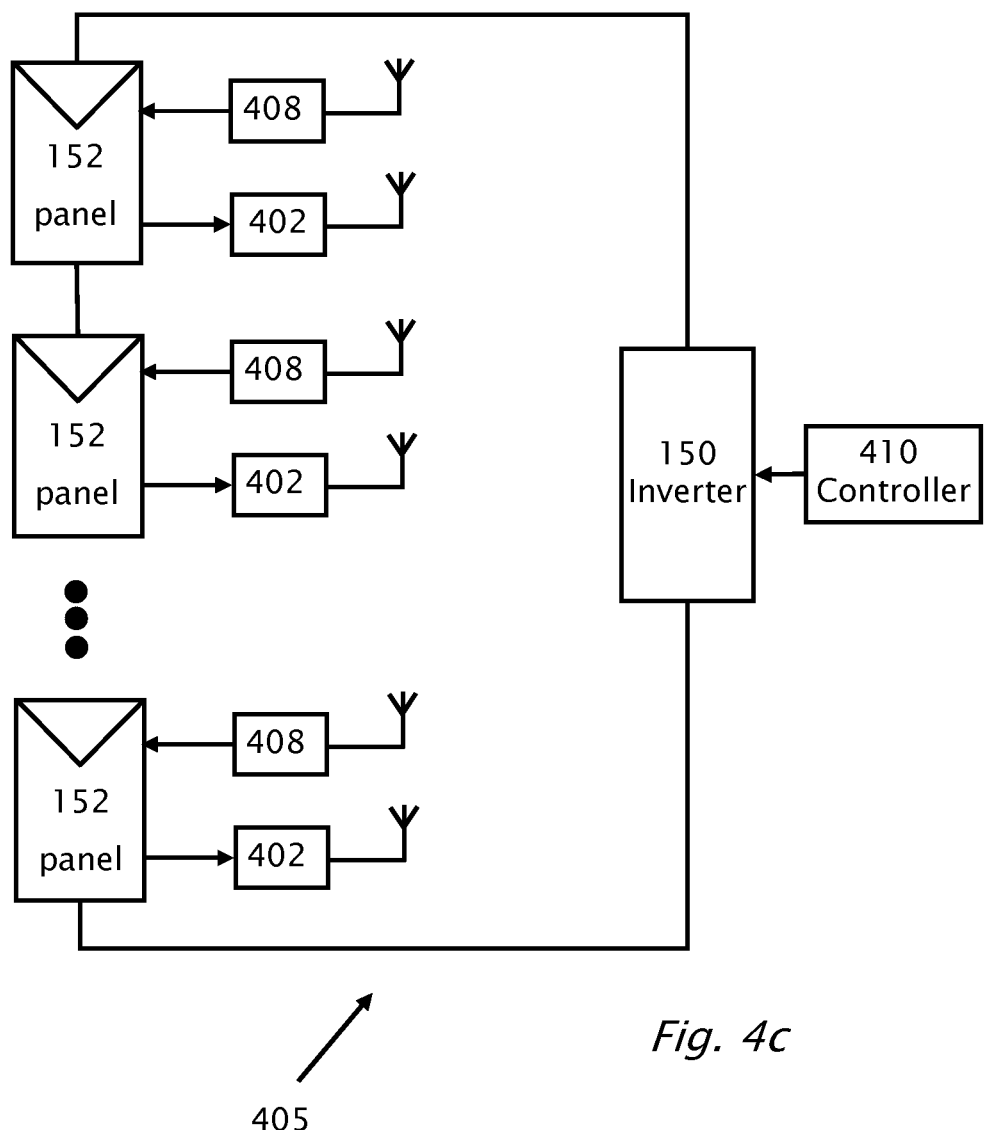
FIG. 4c shows a power generation system including a theft prevention feature according to an embodiment of the present invention.

Reference is now made to FIG. 4c which shows a power generation system 405 including a theft prevention feature according to an embodiment of the present invention. Multiple photovoltaic panels 152 are connected in series to form a string. The string of photovoltaic panels 152 are connected across a load 150. Load 150 is preferably a direct current (DC) to alternating current (AC) inverter. Attached to each panel 152 are a transmitter 402 and a receiver 408. The transmitter 402 and receiver 408 may share common components and may be unified into a transceiver. A central control unit 410 is operatively attached to a transmitter 402 and a receiver 408 via load 150. Control unit 706 may be operatively attached to transmitter 402 and a receiver 408 via power line communications or via a wireless connection. Receiver 408 optionally receives a signal from transmitter 402.

Figure 4D:
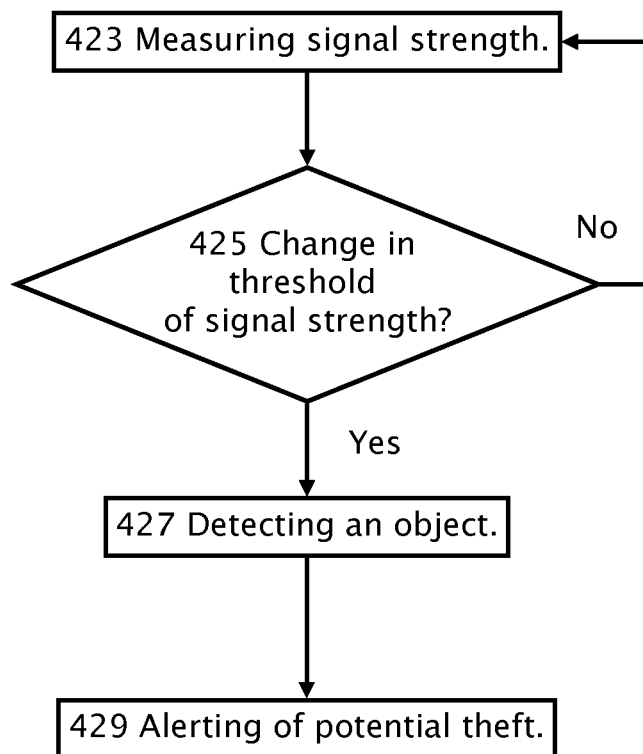
FIG. 4d shows a method of theft detection/prevention according to an embodiment of the present invention.

Reference is now made to FIG. 4d which shows a method 421 for theft detection/prevention according to an embodiment of the present invention. Receiver 408 measures the signal strength (step 423) of transmitters 402 within in the immediate vicinity of panel 152. A change in signal strength measured in the immediate vicinity of panel 152 according to a predetermined threshold (step 425) is used to detect (step 427) an object in the immediate vicinity of panel 152. The change in signal strength detected by receiver 408 is conveyed to central controller 410 which provides an alert of a potential theft of panel 152 (step 429). If there is no significant change in threshold signal strength (step 425) receiver 408 continues to measures the signal strength (step 423) of transmitters 402 within in the immediate vicinity of panel 152.

Electric Field Strength Measurement

The term "electric field" as used herein refers to the electric flux present in the space surrounding an electric charge or the electric flux present in the space of a time-varying magnetic field. The space surrounding an electric charge or the space in the presence of a time-varying magnetic field may be air and/or a dielectric material. The electric field exerts a force on other electrically charged objects with the magnitude of the force dependant on the inverse square relationship of the distance between electrically charged objects.

Figure 5A:
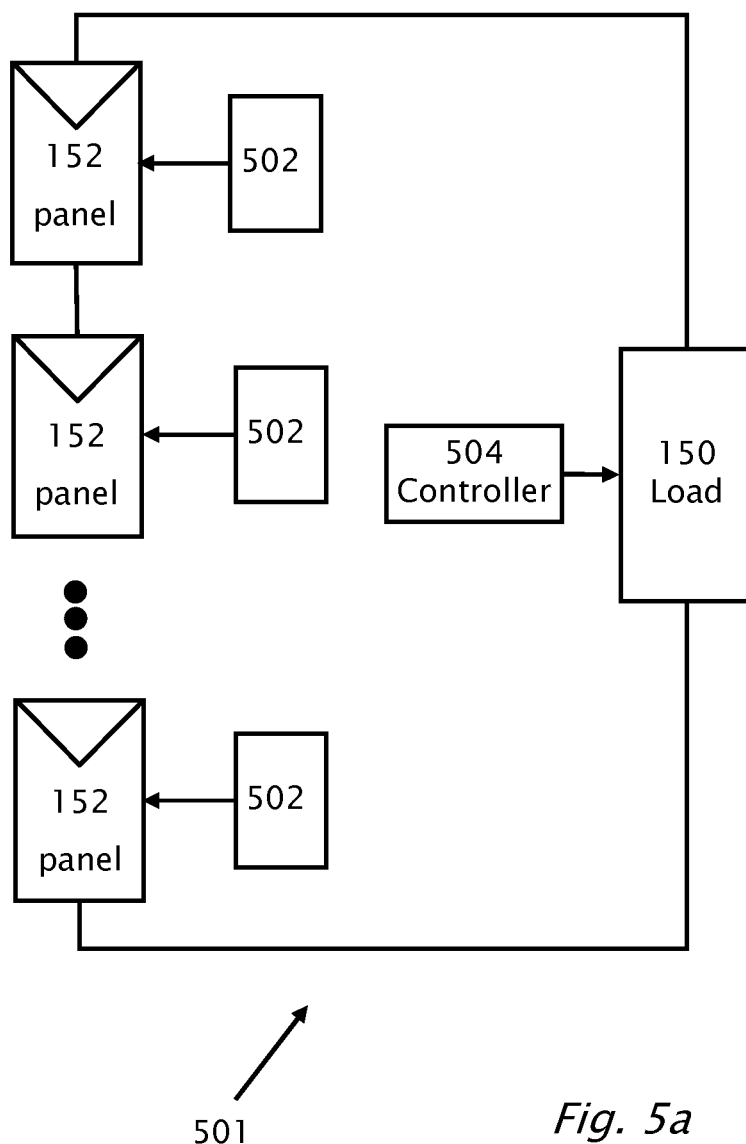
FIG. 5a shows a power generation system including a theft prevention feature according to an embodiment of the present invention.

Reference is now made to FIG. 5a which shows a power generation system 501 including a theft prevention feature according to an embodiment of the present invention. Multiple photovoltaic panels 152 are connected in series to form a string. The string of photovoltaic panels 152 are connected across a load 150. Load 150 is preferably a direct current (DC) to alternating current (AC) inverter. Operatively attached to each panel 152 is a field sensor 502. Field sensor 502 typically measures the electric field within panel 152 or in the electric field in the immediate vicinity of panel 152. Attached to sensors 502 is a controller 504 which is also attached to load 150.

Figures 5B, 5D:
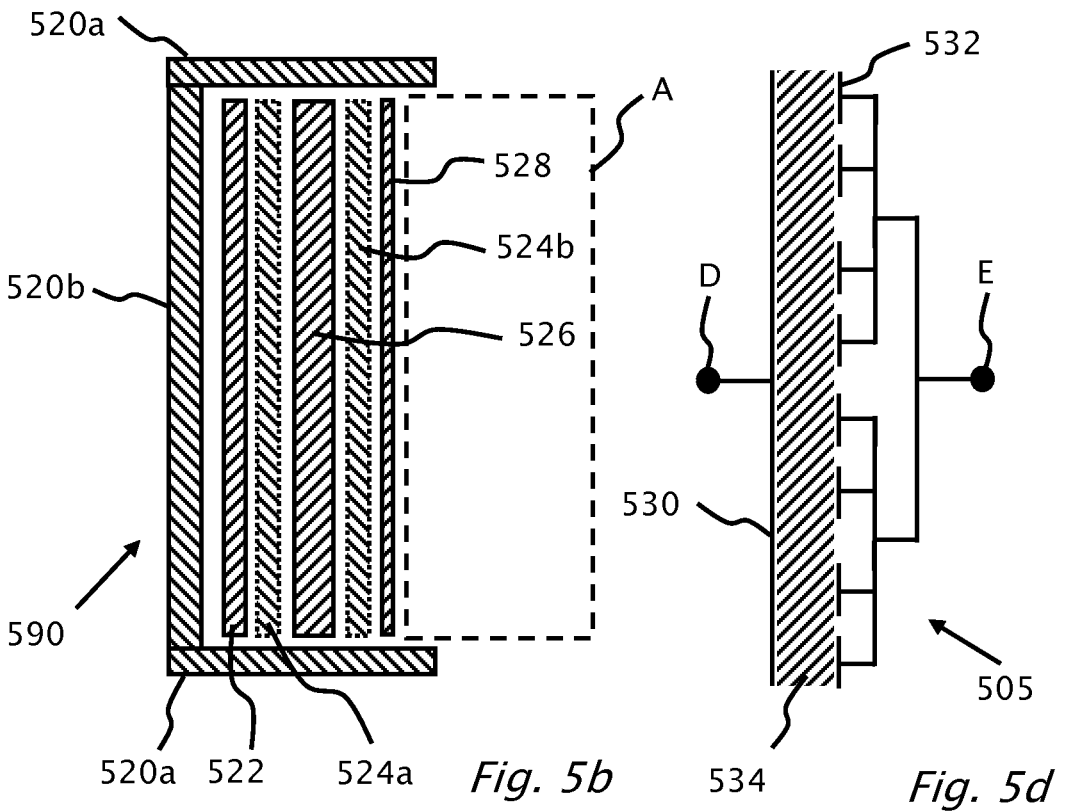
FIG. 5b shows a typical cross section of photovoltaic panel according to an embodiment of the present invention.
FIG. 5d shows an equivalent capacitor representing a photovoltaic panel according to an embodiment of the present invention.

Reference is now made to FIG. 5b which shows a typical cross section 590 of photovoltaic panel 152. Cross section 590 shows typical parts 520a, 520b, 522, 524a, 534b, 526 and 528 which may be included in a photovoltaic panel 152. Parts 522, 524a, 534b, 526 and 528 are located in a casing 520 formed by parts 520a (typically a metal alloy) and 520b (typically a metal alloy or a plastic type of material) is used to house an insulating sheet 522. Next to insulating sheet 522 is a reactive encapsulant sheet 524a which is typically made from ethylene vinyl acetate polymer. Next to reactive encapsulant sheet 524a is photovoltaic substrate 526 followed by another reactive encapsulant sheet 524b. Finally after reactive encapsulant sheet 524b is a sheet typically of low iron flat glass 528. The side of photovoltaic substrate 526 adjacent to reactive encapsulant sheet 524b is where the metal tracks 550 (not shown) are which connect electrically the photovoltaic cells 552 (not shown) of photovoltaic substrate 526. Sensor 502 may be placed between photovoltaic substrate 526 and reactive encapsulant sheet 524a or in area A.

Figure 5C:
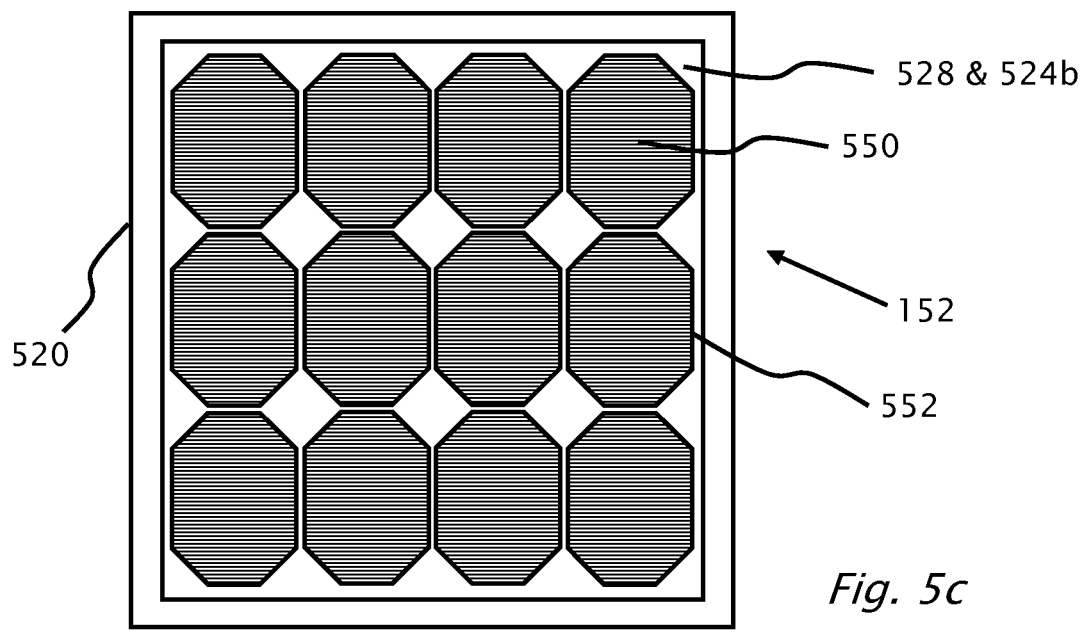
FIG. 5c shows a plan view photovoltaic panel according to an embodiment of the present invention.

Reference is now made to FIG. 5c which shows a plan view photovoltaic panel 152. The plan view shows casing 520 and photovoltaic cells 552 with tracks 550 showing through transparent glass 528 and sheet 524b.

Reference is now also made to FIG. 5d which shows an equivalent capacitor 505 representing photovoltaic panel 152. Plate 530 and node D equivalently represent the casing 520 of panel 152. Dielectric 534 represents collectively; insulating sheet 522, reactive encapsulant sheets 524b/524a, photovoltaic substrate 526, low iron flat glass 528 and the air space shown by area A in FIG. 5b. Plates 532 with node E represent the metal track deposit 550 which connects electrically the photovoltaic cells 552 shown in FIG. 5c of photovoltaic substrate 526. The capacitance (C) in farads of capacitor 505 is given by equation Eq. 1:

$$C = \frac{\varepsilon_0 \varepsilon_r X}{d} \qquad \text{Eq. 1}$$

with $\varepsilon_o$=permittivity of free space=$8.85 \times 10^{-12}$ farads per meter, $\varepsilon_r$=relative permittivity or dielectric constant of dielectric 534, X=the area of plates 530 and 532 and d=the distance between plates 530 and 532. An object in the vicinity of area A causes the dielectric constant ($\varepsilon_r$) to vary since the air space shown by area A in FIG. 5b makes up part of the dielectric constant ($\varepsilon_r$), hence the capacitance (C) varies and hence the electric field (E) varies in capacitor 505.

Figure 5E:
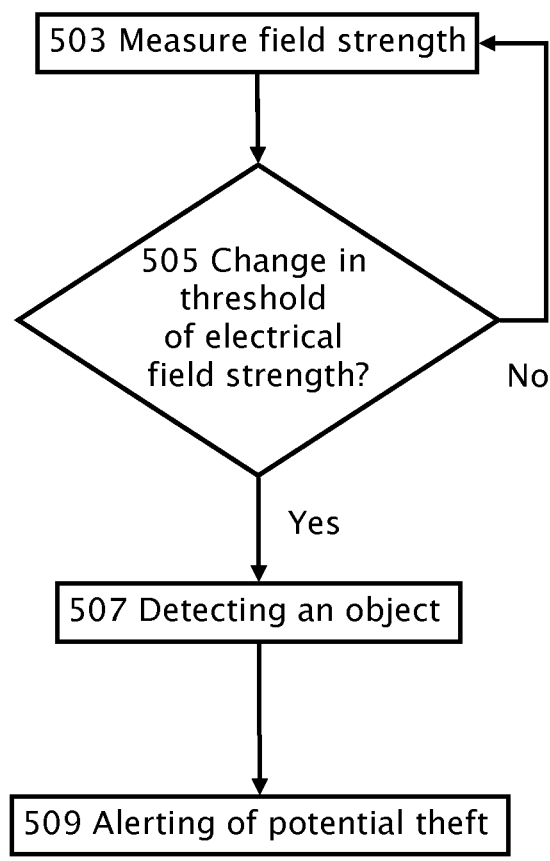
FIG. 5e shows a method for theft detection/prevention according to an embodiment of the present invention.

Reference is now also made to FIG. 5e which shows a method 511 for theft detection/prevention according to an embodiment of the present invention using equivalent capacitor 505. Sensor 502 measures the electric field strength (step 503) within panel 152 or in the electric field in the immediate vicinity of panel 152 i.e. area A. A change in the electric field strength measured field in the immediate vicinity of panel 152 or in panel 152 according to a predetermined threshold (step 505) is used to detect (step 507) an object in the immediate vicinity of panel 152. The change in electric field strength detected by sensor 502 is conveyed to central controller 504 which provides an alert of a potential theft of panel 152 (step 509). If there is no significant change in threshold of electric field strength (step 505) sensor 502 continues to measures the electric field strength (step 503).

Reflectometry from within a String

Figure 6A:
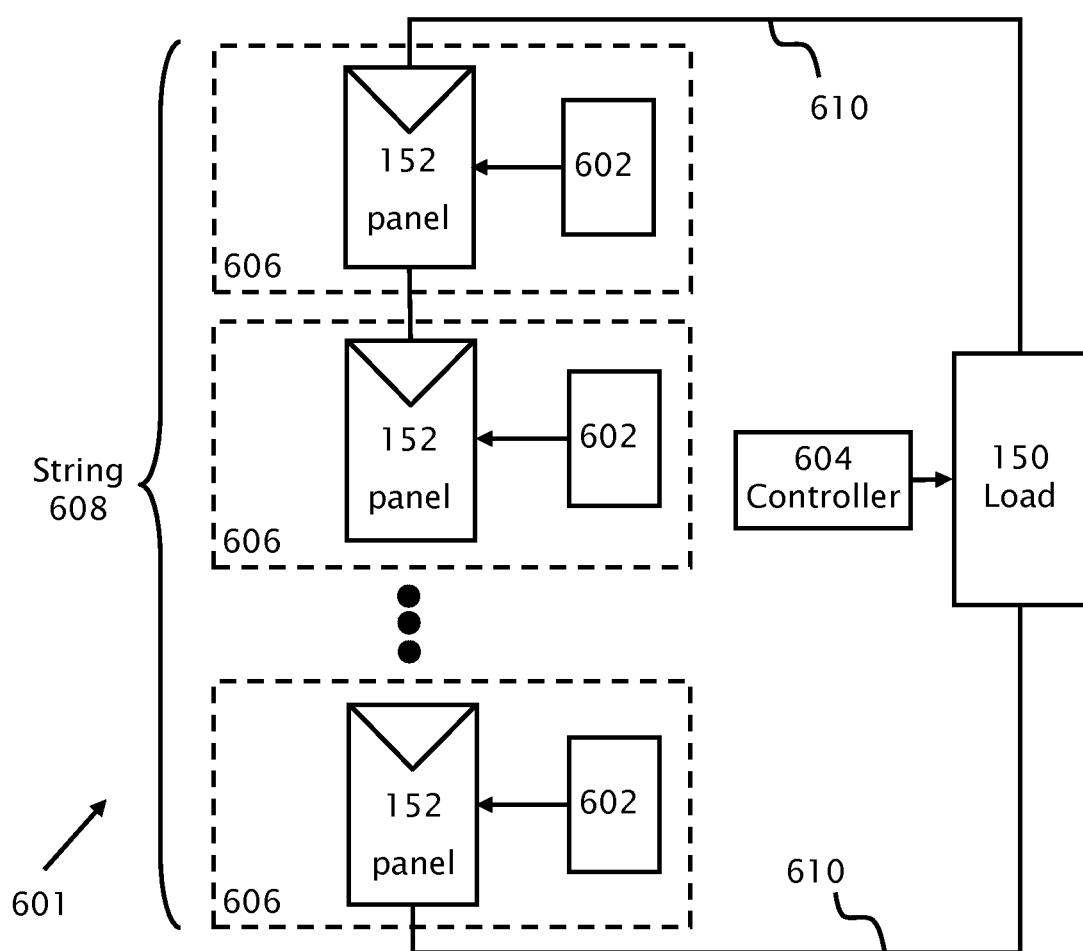
FIG. 6a shows a power generation system including a theft prevention feature according to an embodiment of the present invention.

Reference is now made to FIG. 6a which shows a power generation system 601 including a theft prevention feature according to an embodiment of the present invention. Multiple photovoltaic modules 606 are connected in series to form a photovoltaic string 608. Photovoltaic string 608 is connected across a load 150 via direct current (DC) power lines 610. Load 150 is preferably a direct current (DC) to alternating current (AC) inverter. Photovoltaic modules 606 have a photovoltaic panel 152 which is operatively attached to switch unit 602. A central control unit 604 is operatively attached to load 150 and typically provides a control signal and a test signal which are superimposed onto power lines 610 via load 150. Switch unit 602 optionally receives the control signal from unit 604 and in response to the control signal from unit 604; switch unit 602 typically reconfigures the connection of panel 152 to load 150 by adding a resonant circuit in either series or parallel with panel 152.

Figure 6B:
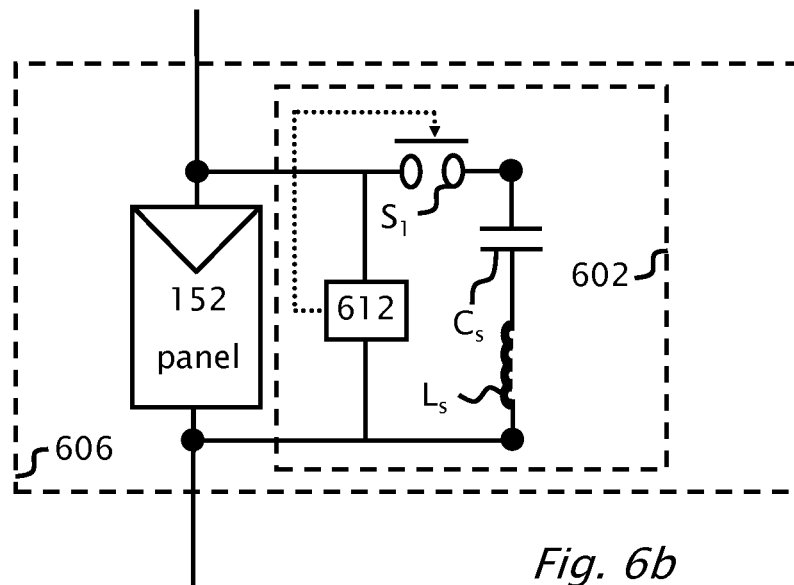
FIG. 6b shows further details of photovoltaic module according to an embodiment of the present invention.

Reference is now made to FIG. 6b which shows further details of photovoltaic module 606 according to an embodiment of the present invention. Photovoltaic module 606 typically has switch unit 602 connected across in parallel with a panel 152, in series with a string of panels or switch unit 602 may be connected across a string of panels 152. Multiple switch units may be activated independently. Switch unit 602 is operatively attached to controller 604 and when switch unit 602 connected in parallel with module 606, switch unit 602 preferably has a switch $S_1$ connected in series with a capacitor $C_s$ and inductor $L_s$. Switch $S_1$ is activated by actuator 612 with actuator 612 deriving power from connection across panel 152 as well as the control signal from central control unit 604 to close switch $S_1$. The power that actuator 612 derives from panel 152 additionally charges a storage device such as a battery located in actuator 612 to allow for nighttime operation of switch unit 602. Multiple switch units 602 may be activated/de-activated independently.

FIG. 6b shows that the resonant circuit is connected in parallel to panel 152. Alternatively, the resonant circuit may be in series to panel 152 (with the resonance circuit being a parallel LC instead of a series LC).

The need for switching the resonance circuit is not mandatory and might be not available if actuator 612 does not have power for doing so. Reflectometry may be measured even if the resonance circuit is always connected (either in series or in parallel). However, the reason for adding this resonance switching is in order to command each string to either activate or not activate the resonance. That way, we can control (via central unit, e.g load 150 in this case) which strings participate in the reflectometry measurement. Specifically, we would prefer to have only one string participating at a time which will enable us to get good accuracy for the measurement (meaning that all the other strings will have their resonance switched off).

Figure 6C:
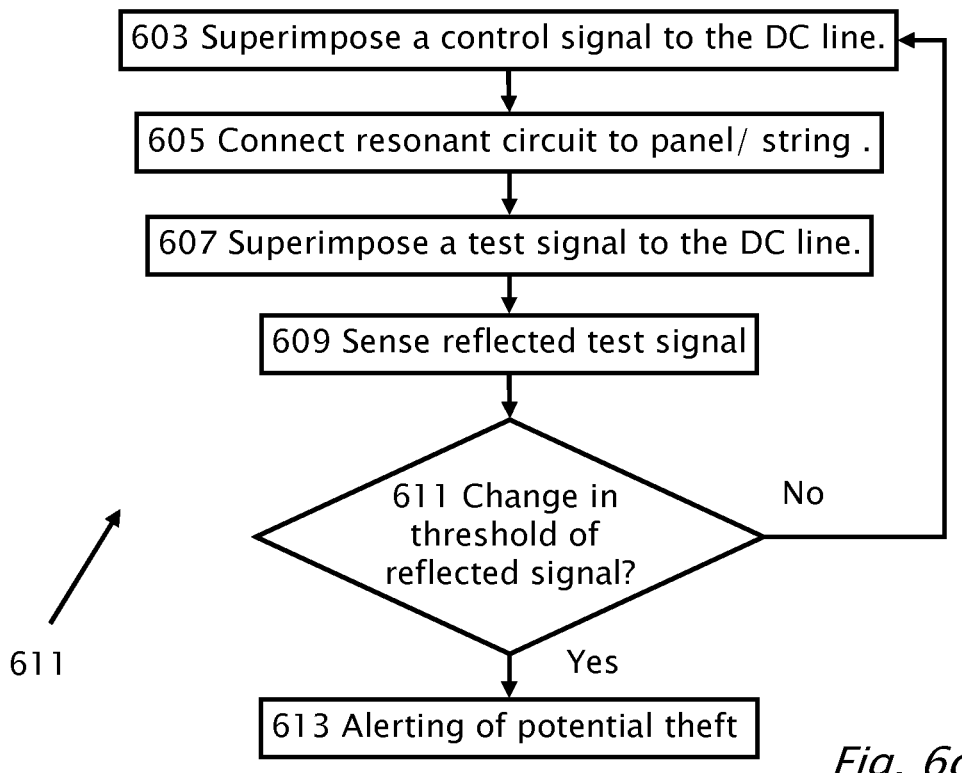
FIG. 6c shows a method for theft detection/prevention using the system shown in FIG. 6a according to an embodiment of the present invention.

Reference is now made to FIG. 6c which shows a method 611 for theft detection/prevention using system 601 according to an embodiment of the present invention. A control signal is superimposed onto power lines 610 by controller 604 (step 603). The control signal superimposed onto power lines 610 by controller 604 causes switch $S_1$ to close in switch unit 602. Switch $S_1$ in closing switch unit 602 cause series resonant circuit capacitor $C_s$ and inductor $L_s$ to be connected across panel 152 (step 605). Typically switch $S_1$ closes for a predetermined time period. With $S_1$ closed a test signal is superimposed onto power lines 610 by controller 604 (step 607). The test signal controller 604 superimposes onto power lines 610 may be a time division reflectometry (TDR) signal or a frequency division reflectometry signal (FDR). The test signal preferably resonates with series capacitor $C_s$ and inductor $L_s$. Series capacitor $C_s$ and inductor $L_s$ have values chosen to give a narrow band circuit of typically 15-25 MHz. Controller 604 then senses (step 609) the reflected TDR or FDR signal on power lines 610. If a change in sense threshold of reflected test signal is detected (step 611) an alerting of potential theft may be made (step 613) otherwise theft detection continues again with step 603.

Mesh Network

Figure 7A:
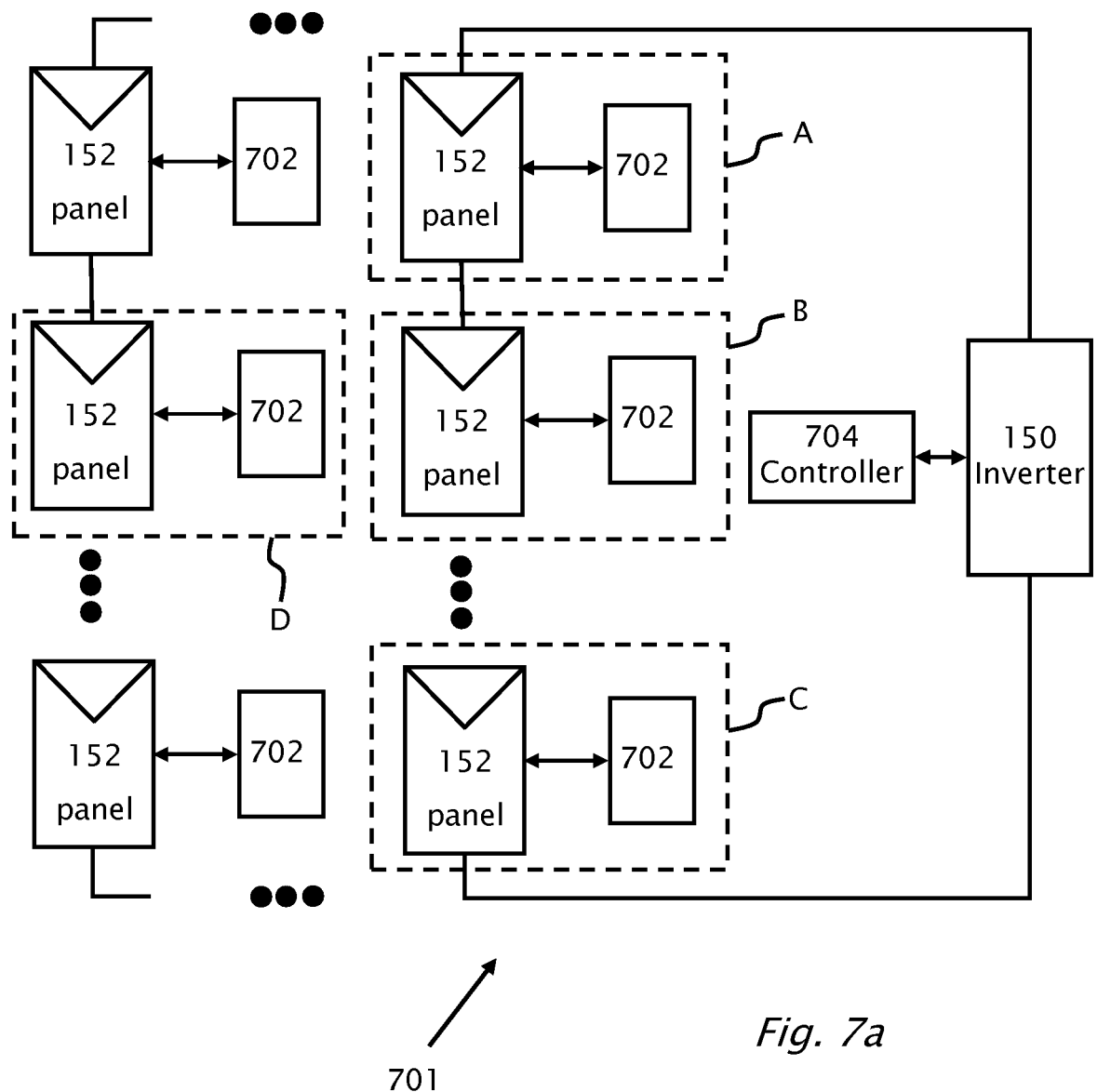
FIG. 7a which shows a power generation system including a theft prevention feature according to an embodiment of the present invention.

Reference is now made to FIG. 7a which shows a power generation system 701 including a theft prevention feature according to an embodiment of the present invention. Multiple photovoltaic panels 152 are connected in series to form a string. The string of photovoltaic panels 152 are connected across a load 150. Multiple strings are then also connected in parallel. Load 150 is preferably a direct current (DC) to alternating current (AC) inverter. Attached to each panel 152 is an electronic module 702. Module 702 typically receives a data signal from controller 704 via wireless or power line communications. For example, the data signal that panel module B receives from controller 704 typically requests panel module B to provide details of other panel modules in the immediate vicinity of panel module B. The panel modules in the immediate vicinity of panel B are panel modules A, C and D. A panel module typically collects data of other panel modules in the immediate vicinity and sends a data signal back to controller 704 via wireless communication or through the power lines connecting panels 152 to load 150.

Figure 7B:
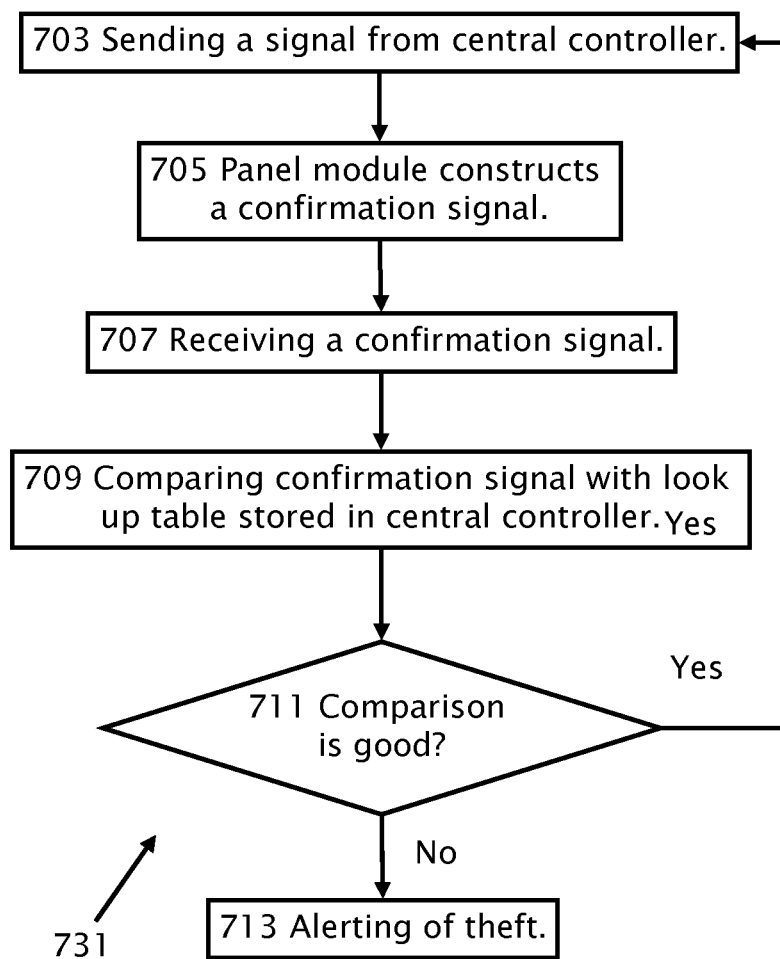
FIG. 7b which shows a method for theft detection/prevention according to an embodiment of the present invention.

Reference is now made to FIG. 7b which shows a method 731 for theft detection/prevention according to an embodiment of the present invention. Typically at the installation or upgrade of power generation system 701, details of system 701 in terms of electrical connection and/or topological layout of panels 152 in system 701 is programmed in a look up table in controller 704. Using panel module B as an exemplary embodiment of the present invention, controller 704 typically sends (step 703) a signal to panel module B via wireless communication or through the power lines connecting panels 152 to load 150. The signal sent from controller 704 to panel module B causes panel module B to construct a confirmation signal based on the signal sent from controller 704 (step 705). The constructed confirmation typically includes information about panel module B and according to a feature of the present invention, information that panel module B collects from panel modules A, C and D which are in the immediate vicinity of panel module B. Panel module B transmits the confirmation signal via wireless communication or through the power lines connecting panels 152 to load 150 where the confirmation signal is received by controller 704 (step 707). Controller 704 then compares the received confirmation signal with the look up table stored in controller 704 (step 709). If the comparison is good (step 711), theft detection continues by sending a signal from central controller 704 (step 703) otherwise a potential alert of theft of a panel and/or panels 152 is made (step 713).

Alternatively, probe signal (step 703) and confirmation signal (step 705) may not be required. Instead, each module 702 may be programmed to send a message periodically towards its neighbors, every three minutes for instance. The message when received is first of all a message that says transmitting module 702 is alive and can also measure data, e.g impedance and transmit data. The transmitted message is received by neighboring modules 702 and the transmission propagates along the mesh network until the transmission reaches controller 704 typically at the site of the load/inverter/main-receiver.

It is to be understood that although there are described herein different embodiments, the features of the various embodiments could be combined together, in any combination preferred by the skilled person. So doing can, for instance, provide a system with two or more theft prevention/detection devices and/or methods.

The definite articles "a", "an" is used herein, such as "a converter", "a switch" have the meaning of "one or more" that is "one or more converters" or "one or more switches".

Examples of various features/aspects/components/operations have been provided to facilitate understanding of the disclosed embodiments of the present invention. In addition, various preferences have been discussed to facilitate understanding of the disclosed embodiments of the present invention. It is to be understood that all examples and preferences disclosed herein are intended to be non-limiting.

Although selected embodiments of the present invention have been shown and described individually, it is to be understood that at least aspects of the described embodiments may be combined.

Also although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A method comprising:
   receiving a plurality of values, wherein a first value of the plurality of values corresponds to a measurement of an impedance of a photovoltaic direct current (DC) power source;
   retrieving a second value from a memory of a device associated with a load;
   comparing the first value with the second value to produce a comparison result; and
   alerting, by the device, a potential theft corresponding to the photovoltaic DC power source based on one of (i) the comparison result or (ii) determining that at least one value of the plurality of values does not correspond to an impedance measurement.

2. The method according to claim 1, wherein said second value comprises a hash of said first value.

3. The method according to claim 1, further comprising:
   determining that the first value corresponds to the second value; and
   enabling power conversion of an inverter of the load based on the determination that the first value corresponds to the second value.

4. The method according to claim 1, wherein the first value or the second value is generated by a global positioning system module which bases at least a portion of one of the first value or the second value on global coordinates of the photovoltaic DC power source or an inverter of the load.

5. The method according to claim 1, further comprising:
   receiving a third value from a server associated with the load; and
   comparing the third value with the second value to produce the comparison result.

6. The method according to claim 1, wherein at least a portion of the first value or the second value is based on global coordinates of at least one of the photovoltaic DC power source or the load.

7. The method according to claim 1,
further comprising determining that the first value corresponds to the second value;
transferring, based on the determining that the first value corresponds to the second value, via a DC power line, electrical power output from the photovoltaic DC power source to the load; and
enabling electrical power output of the load.

8. The method according to claim 1, further comprising disabling, based on the comparison result, electrical power conversion of an inverter of the load.

9. The method according to claim 1,
further comprising determining that the first value does not correspond to the second value; and disabling, based on the determining that the first value does not correspond to the second value, electrical power output of the load.

10. A system comprising:
a photovoltaic direct current (DC) power source configured to generate DC power and comprising:
a processor configured to calculate a plurality of values, wherein a first value of the plurality of values corresponds to a measurement of an impedance of the photovoltaic DC power source;
a first memory configured to store the first value;
a load coupled to the photovoltaic DC power source via a DC power line;
a second memory associated with the load, the second memory configured to store a second value; and
a processor configured to receive the plurality of values from the photovoltaic DC power source, compare the first value of the plurality of values with the second value to produce a comparison result, and to alert a potential theft corresponding to the photovoltaic DC power source based on one of (i) the comparison result or (ii) a determination, by the processor, that at least one value of the plurality of values does not correspond to a measurement of an impedance.

11. The system according to claim 10, further comprising a global position module located at a location of the load or a location of the photovoltaic DC power source, wherein at least a portion of one of the first value or the second value is based on global coordinates generated by the global position module.

12. The system according to claim 10, wherein said second value comprises a hash of said first value.

13. The system according to claim 10, wherein the processor is configured to determine that the first value corresponds to the second value and to enable, based on a determination that the first value corresponds to the second value, power conversion of an inverter of the load.

14. The system according to claim 10, wherein the first value or the second value is generated by a global positioning system module which bases at least a portion of the first value or the second value on global coordinates of the photovoltaic DC power source or an inverter of the load.

15. The system according to claim 10, wherein the processor is configured to enable, based on a determination that the first value corresponds to the second value, electrical power output of the load.

16. The system according to claim 10, further comprising:
a server comprising a third memory configured to store a third value,
wherein the processor is further configured to compare at least one of the first value and the second value to the third value to generate the comparison result.

17. The system according to claim 10, wherein the photovoltaic DC power source comprises a second processor configured to:
receive the second value;
compare the second value with the first value to produce a second comparison result; and
alert a potential theft corresponding to the photovoltaic DC power source based on the second comparison result.

18. The system according to claim 17, wherein the photovoltaic DC power source comprises a bypass, and wherein the second processor is configured to control the bypass to switch, based on the second comparison result, power generation by the photovoltaic DC power source from being disabled to being enabled or from being enabled to being disabled.

19. An apparatus comprising:
one or more processors; and
memory storing instructions that, when executed by the one or more processors, cause the apparatus to:
receive a plurality of values from a photovoltaic direct current (DC) power source;
calculate a first value of the plurality of values, wherein the first value corresponds to a measurement of an impedance of the photovoltaic DC power source;
retrieve a second value from the memory, wherein the memory is associated with a load;
compare the first value with the second value to produce a comparison result; and
alert a potential theft corresponding to the photovoltaic DC power source based on one of (i) the comparison result or (ii) a determination, by the apparatus, that at least one value of the plurality of values does not correspond to a measurement of an impedance.

20. The apparatus according to claim 19, wherein the instructions, when executed by the one or more processors, cause the apparatus to:
receive a third value from a server associated with the load; and
compare the third value with the second value to produce the comparison result.

21. The apparatus according to claim 19, wherein, the instructions, when executed by the one or more processors, cause the apparatus to:
determine that the first value corresponds to the second value; and
enable power conversion of an inverter of the load based on the determination that the first value corresponds to the second value.

* * * * *